United States Patent [19]
Jones et al.

[11] Patent Number: 5,875,117
[45] Date of Patent: *Feb. 23, 1999

[54] SIMULTANEOUS PLACEMENT AND ROUTING (SPAR) METHOD FOR INTEGRATED CIRCUIT PHYSICAL DESIGN AUTOMATION SYSTEM

[75] Inventors: Edwin R. Jones, Sunnyvale; James S. Koford, San Jose; Douglas B. Boyle, Palo Alto; Ranko Scepanovic, Cupertino; Michael D. Rostoker, Boulder Creek, all of Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 636,349

[22] Filed: Apr. 23, 1996

Related U.S. Application Data

[63] Continuation of Ser. No. 230,023, Apr. 19, 1994, abandoned.

[51] Int. Cl.$^6$ .................................................. G06F 17/50
[52] U.S. Cl. ................................. 364/491; 364/490
[58] Field of Search ................................. 364/489, 490, 364/491, 468.03; 395/800

[56] References Cited

U.S. PATENT DOCUMENTS

| | | | |
|---|---|---|---|
| 4,306,286 | 12/1981 | Cocke et al. | 364/200 |
| 4,484,292 | 11/1984 | Hong et al. | 364/491 |
| 4,495,559 | 1/1985 | Gelatt, Jr. et al. | 364/148 |
| 4,612,618 | 9/1986 | Pryor et al. | 364/490 |

(List continued on next page.)

OTHER PUBLICATIONS

Sherwani, Naveed, "Algorithms for VLSI Physical Design Automation", Kluwer Academic Publishers, 1993.

Sechen, Carl and Sangiovanni–Vincentelli, Alberto, "TimberWolf 3.2: A New Standard Cell Placement and Global Routing Package", IEEE 23rd Design Automaton Conference, 1986, Paper 26.1.

(List continued on next page.)

*Primary Examiner*—Kevin J. Teska
*Assistant Examiner*—Thai Phan
*Attorney, Agent, or Firm*—Mitchell, Silberberg & Knupp

[57] ABSTRACT

An initial placement of cells for an integrated circuit chip is decomposed into a hierarchial order of groups of cells. The groups are routed simultaneously using parallel processors, and the results are recomposed to provide a global routing that provides a detailed mapping of cell interconnect congestion in the placement. Areas of high congestion are identified, and a congestion reduction algorithm is applied using the parallel processors to alter the placement in these areas simultaneously. The overall fitness of the placement is then computed, and if it has not attained a predetermined value, the steps of identifying congested areas and applying the congestion reduction algorithm to these areas are repeated. The cumulative error created by altering the placement without repeating the global routing is estimated, and if it exceeds a predetermined value, the global routing is also repeated.

32 Claims, 51 Drawing Sheets

U.S. PATENT DOCUMENTS

| | | | |
|---|---|---|---|
| 4,613,941 | 9/1986 | Smith et al. | 364/490 |
| 4,615,011 | 9/1986 | Linsker | 364/491 |
| 4,621,339 | 11/1986 | Wagner et al. | 364/900 |
| 4,656,580 | 4/1987 | Hitchcock, Sr. et al. | 364/200 |
| 4,686,629 | 8/1987 | Noto et al. | 364/491 |
| 4,815,003 | 3/1989 | Putatunda et al. | 364/491 |
| 4,850,027 | 7/1989 | Kimmel | 382/49 |
| 4,858,143 | 8/1989 | Fournier | 364/491 |
| 4,872,125 | 10/1989 | Catlin | 364/578 |
| 4,908,772 | 3/1990 | Chi | 364/491 |
| 4,918,614 | 4/1990 | Modarres et al. | 364/490 |
| 5,051,895 | 9/1991 | Rogers | 364/200 |
| 5,136,686 | 8/1992 | Koza | 395/13 |
| 5,140,526 | 8/1992 | McDermith et al. | 364/488 |
| 5,140,530 | 8/1992 | Guha et al. | 395/13 |
| 5,144,563 | 9/1992 | Date et al. | 364/491 |
| 5,157,778 | 10/1992 | Bischoff et al. | 395/500 |
| 5,159,682 | 10/1992 | Toyonaga et al. | 395/500 |
| 5,187,668 | 2/1993 | Okude et al. | 364/468 |
| 5,200,908 | 4/1993 | Date et al. | 364/491 |
| 5,202,840 | 4/1993 | Wong | 364/490 |
| 5,208,759 | 5/1993 | Wong | 364/468 |
| 5,222,029 | 6/1993 | Hooper et al. | 364/489 |
| 5,222,031 | 6/1993 | Kaida | 364/491 |
| 5,224,056 | 6/1993 | Chene et al. | 364/490 |
| 5,245,550 | 9/1993 | Miki et al. | 364/490 |
| 5,251,147 | 10/1993 | Finnerty | 364/490 |
| 5,255,345 | 10/1993 | Shaefer | 395/13 |
| 5,267,176 | 11/1993 | Antreich et al. | 364/491 |

OTHER PUBLICATIONS

Shahookar, Khushro and Mazumder, Pinaki, "A Genetic Approach to Standard Cell Placement Using Meta–Genetic Parameter Optimization", IEEE Transactions on Computer–Aided Design, vol. 9, No. 5, May 1990.

Mohan, S. and Mazumder, Pinaki, "Wolverines:Standard Cell Placement on a Network of Workstations", IEEE Transactions on Computer–Aided Design of Integrated Circuits and Systems, vol. 12, No. 9, Sep. 1993.

Lenoski, Daniel, et al., "The Stanford Dash Multiprocessor", Computer, Mar. 1992.

Koza, John Genetic Programming, MIT Press, Cambridge, MA 1993, pp. 94–101 and 173.

Nowatzyk, A. and Parkin, M., "The S3.mp Interconnect System & TIC Chip", Proceedings of IEEE Computer Society HOT Interconnect Symposium, Stanford Univ., 1993.

Siarry et al., "Thermodynamic Optimization of Block Placement", IEEE, 1987, pp. 211–221.

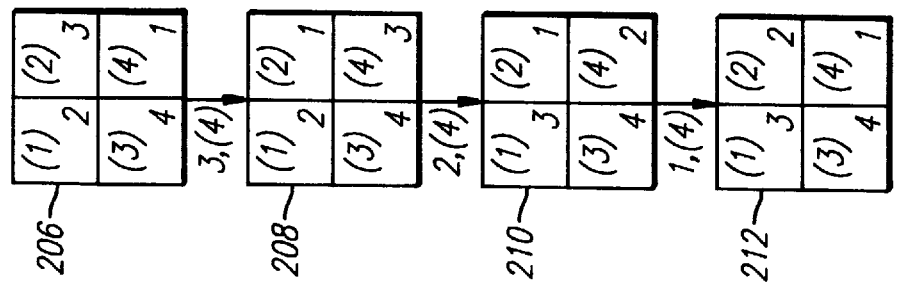
FIG. 16
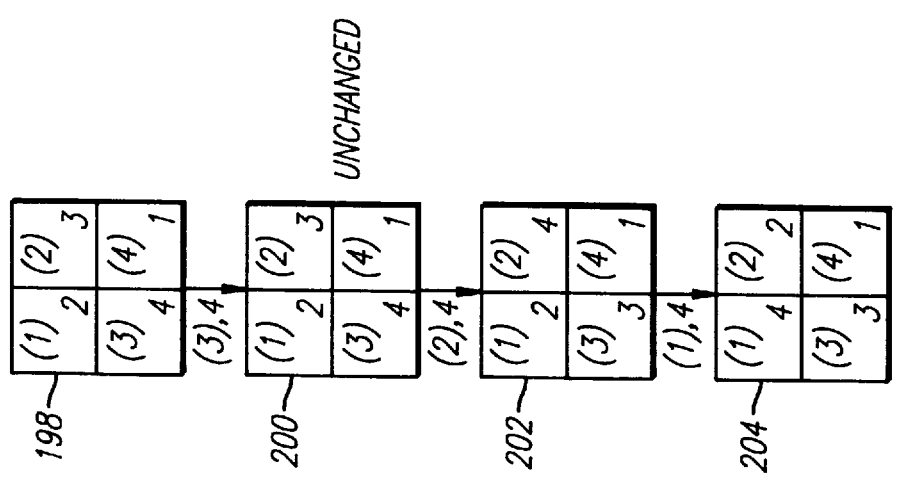
FIG. 15
FIG. 14
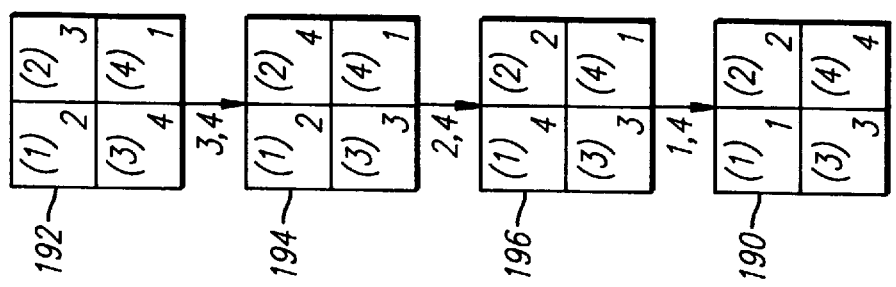

FIG. 24
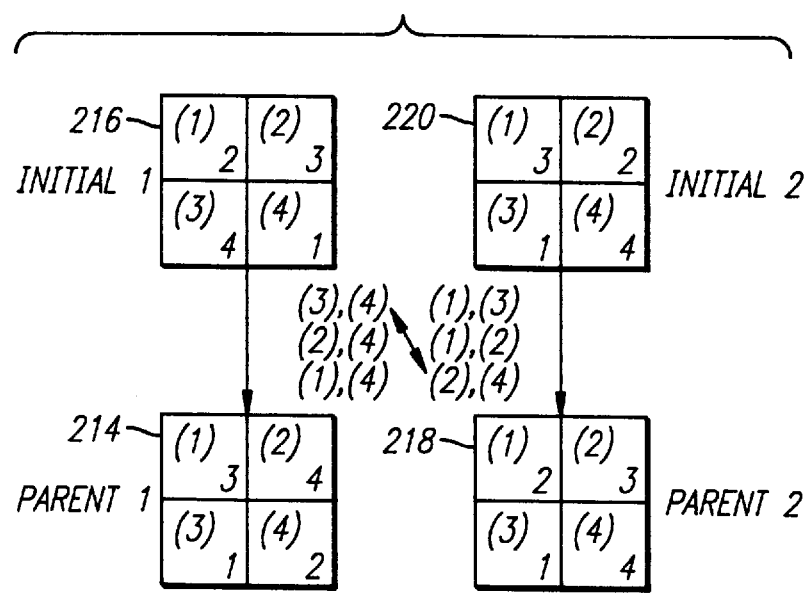
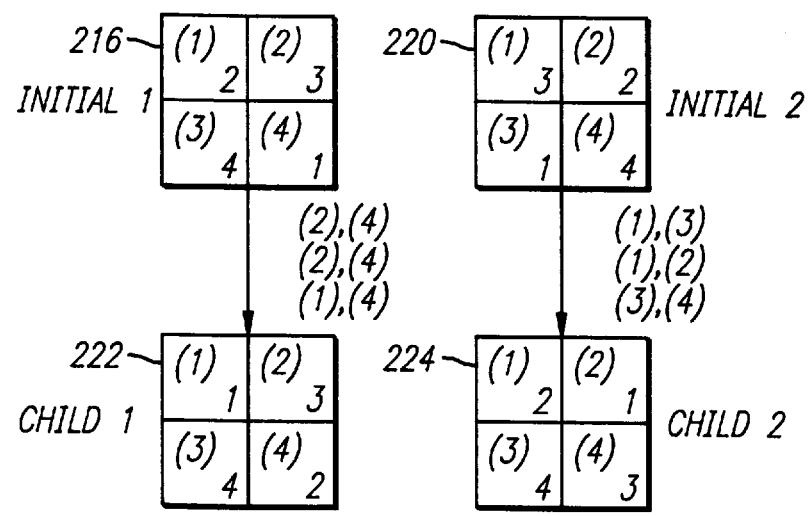

FIG. 34a-1

```
step --  0  cost --     940
step --  0  min_cost --  940  avg_cost --  990  max_cost == 1000  variance -- 94.800000
mcmcsnls
step --  1  min_cost --  940  avg_cost --  979  max_cost ==  990  variance -- 83.040000
mcmcsnls
step --  2  min_cost --  930  avg_cost --  971  max_cost ==  980  variance -- 78.440000
mcmcsnls
step --  3  min_cost --  930  avg_cost --  963  max_cost ==  980  variance -- 100.480000
mcmcsnls
step --  4  min_cost --  900  avg_cost --  954  max_cost ==  970  variance -- 124.520000
mcmcsnls
step --  5  cost --     890
step --  5  min_cost --  890  avg_cost --  943  max_cost ==  960  variance -- 131.720000
mcmcsnls
step --  6  min_cost --  880  avg_cost --  931  max_cost ==  950  variance -- 168.000000
mcmcsnls
step --  7  min_cost --  860  avg_cost --  917  max_cost ==  940  variance -- 185.680000
mcmcsnls
step --  8  min_cost --  840  avg_cost --  902  max_cost ==  920  variance -- 218.760000
mcmcsnls
step --  9  min_cost --  830  avg_cost --  884  max_cost ==  910  variance -- 233.860000
mcmcsnls
step -- 10  cost --     780
step -- 10  min_cost --  760  avg_cost --  865  max_cost ==  890  variance -- 279.400000
mcmcsnls
```

FIG. 34a-2

```
step -- 11  min_cost --  760  avg_cost --  845  max_cost ==  870  variance --  307.600000
mcmcsnls
step -- 12  min_cost --  760  avg_cost --  822  max_cost ==  850  variance --  287.520000
mcmcsnls
step -- 13  min_cost --  710  avg_cost --  799  max_cost ==  820  variance --  356.600000
mcmcsnls
step -- 14  min_cost --  700  avg_cost --  771  max_cost ==  800  variance --  376.720000
mcmcsnls
step -- 15  cost --  660
mcmcsnls
step -- 15  min_cost --  660  avg_cost --  744  max_cost ==  770  variance --  369.020000
mcmcsnls
step -- 16  min_cost --  610  avg_cost --  716  max_cost ==  740  variance --  422.540000
mcmcsnls
step -- 17  min_cost --  590  avg_cost --  684  max_cost ==  710  variance --  480.500000
mcmcsnls
step -- 18  min_cost --  570  avg_cost --  649  max_cost ==  680  variance --  460.480000
mcmcsnls
step -- 19  min_cost --  550  avg_cost --  619  max_cost ==  650  variance --  421.880000
mcmcsnls
step -- 20  cost --  500
step -- 20  min_cost --  500  avg_cost --  588  max_cost ==  620  variance --  443.640000
```

FIG. 34b-1

```
mcmcsnls
step -- 21 min_cost --  430  avg_cost -- 558  max_cost == 590  variance -- 446.800000
mcmcsnls
step -- 22 min_cost --  430  avg_cost -- 527  max_cost == 560  variance -- 483.120000
mcmcsnls
step -- 23 min_cost --  410  avg_cost -- 494  max_cost == 520  variance -- 446.420000
mcmcsnls
step -- 24 min_cost --  380  avg_cost -- 459  max_cost == 490  variance -- 433.560000
mcmcsnls
step -- 25 cost --  340
step -- 25 min_cost --  340  avg_cost -- 428  max_cost == 460  variance -- 395.740000
mcmcsnls
step -- 26 min_cost --  310  avg_cost -- 398  max_cost == 420  variance -- 361.140000
mcmcsnls
step -- 27 min_cost --  290  avg_cost -- 367  max_cost == 390  variance -- 354.640000
mcmcsnls
step -- 28 min_cost --  260  avg_cost -- 336  max_cost == 360  variance -- 376.020000
mcmcsnls
step -- 29 min_cost --  220  avg_cost -- 305  max_cost == 330  variance -- 358.800000
mcmcsnls
step -- 30 cost --  190
step -- 30 min_cost --  190  avg_cost -- 278  max_cost == 300  variance -- 301.240000
mcmcsnls
```

FIG. 34b-2 step -- 31 min_cost -- 180 avg_cost -- 251 max_cost == 270 variance -- 268.800000
mcmcsnls
step -- 32 min_cost -- 140 avg_cost -- 225 max_cost == 250 variance -- 292.600000
mcmcsnls
step -- 33 min_cost -- 130 avg_cost -- 201 max_cost == 220 variance -- 286.600000
mcmcsnls
step -- 34 min_cost -- 90 avg_cost -- 176 max_cost == 200 variance -- 271.500000
mcmcsnls
step -- 35 cost -- 90
step -- 35 min_cost -- 90 avg_cost -- 151 max_cost == 170 variance -- 230.480000
mcmcsnls
step -- 36 min_cost -- 70 avg_cost -- 130 max_cost == 150 variance -- 218.600000
mcmcsnls
step -- 37 min_cost -- 60 avg_cost -- 111 max_cost == 130 variance -- 187.640000
mcmcsnls
step -- 38 min_cost -- 30 avg_cost -- 92 max_cost == 110 variance -- 180.760000
mcmcsnls
step -- 39 min_cost -- 20 avg_cost -- 73 max_cost == 90 variance -- 179.520000
mcmcsnls
step -- 40 cost -- 0

FIG. 35

| LOCATION | CELL | LOCATION | CELL |
|---|---|---|---|
| 0 | 58 | 50 | 1 |
| 1 | 29 | 51 | 7 |
| 2 | 6 | 52 | 99 |
| 3 | 19 | 53 | 51 |
| 4 | 38 | 54 | 22 |
| 5 | 20 | 55 | 27 |
| 6 | 42 | 56 | 53 |
| 7 | 71 | 57 | 36 |
| 8 | 10 | 58 | 65 |
| 9 | 3 | 59 | 31 |
| 10 | 47 | 60 | 75 |
| 11 | 4 | 61 | 40 |
| 12 | 50 | | |
| 13 | 60 | 62 | 5 |
| 14 | 44 | 63 | 45 |
| 15 | 72 | 64 | 83 |
| 16 | 28 | 65 | 69 |
| 17 | 52 | 66 | 87 |
| 18 | 44 | 67 | 91 |
| 19 | 58 | 68 | 24 |
| 20 | 80 | 69 | 93 |
| 21 | 52 | 70 | 69 |
| 22 | 48 | 71 | 43 |
| 23 | 61 | 72 | 34 |
| 24 | 64 | 73 | 50 |
| 25 | 32 | 74 | 46 |
| 26 | 76 | 75 | 92 |
| 27 | 89 | 76 | 12 |
| 28 | 25 | 77 | 20 |
| 29 | 59 | 78 | 5 |
| 30 | 97 | 79 | 85 |
| 31 | 55 | 80 | 35 |
| 32 | 8 | 81 | 16 |
| 33 | 13 | 82 | 84 |
| 34 | 98 | 83 | 96 |
| 35 | 82 | 84 | 41 |
| 36 | 95 | 85 | 17 |
| 37 | 33 | 86 | 67 |
| 38 | 37 | 87 | 63 |
| 39 | 0 | 88 | 68 |
| 40 | 30 | 89 | 39 |
| 41 | 77 | 90 | 57 |
| 42 | 54 | 91 | 9 |
| 43 | 15 | 92 | 90 |
| 44 | 81 | 93 | 56 |
| 45 | 26 | 94 | 87 |
| 46 | 2 | 95 | 88 |
| 47 | 49 | 96 | 74 |
| 48 | 23 | 97 | 62 |
| 49 | 86 | 98 | 15 |
| | | 99 | 21 |

```
worker -- started
unique worker name -- work2
network path -- net
parse petlist
      140   statements
      220   names
      440   conns
      140   prims
      100   cells
       40   pads
        2   types
        2   max pins on pet s0.0x
    2.000000  average pins/net
    3.142857  average pins/cell
    1.000000  min.bound wirelength
load chip description
load padref
load optimal placement
working on region (0, 0) - (9, 9)

step     0  cost: min 38.05  avg 46.01  max 53.67
            std dev -- 2.85  avg_distance -- 0.00
cheat = 990.00  (min = 970.00, max = 1000.00)
ranko = 38.05  yugo = 31.68  wire = 6.30
step --    0    cost -- 38.046944
NMNMMMMNMCCCCCCR step     1  cost: min 33.59  avg 43.56  max 50.61
            std dev -- 3.29  avg_distance -- 98.98
cheat = 970.00  (min = 950.00, max = 1000.00)
ranko = 29.10  yugo = 31.52  wire = 5.14
NNNMMMNNMCCCCCCR step     2  cost: min 29.10  avg 39.48  max 48.95
            std dev -- 4.15  avg_distance -- 96.76
cheat = 980.00  (min = 950.00, max = 1000,00)
ranko = 29.10  yugo = 31.59  wire = 5.14
NNNNMMNMMCCCCCCR step     3  cost: min 26.90  avg 36.16  max 48.16
            std dev -- 4.67  avg_distance -- 97.94
cheat = 980.00  (min = 920.00, max = 1000.00)
ranko = 26.90  yugo = 31.52  wire = 4.50
NNMNMNNMNCCCCCCR step     4  cost: min 23.26  avg 32.59  max 46.99
            std dev -- 4.67  avg_distance -- 95.21
cheat = 950.00  (min = 910.00, max = 1000.00)
ranko = 23.26  yugo = 32.27  wire = 4.26
NNMMMNMNNCCCCCCR step     5  cost: min 21.54  avg 29.38  max 43.33
            std dev -- 4.09  avg_distance -- 90.03
cheat = 980.00  (min = 910.00, max = 1000.00)
ranko = 21.54  yugo = 31.76  wire = 4.26
step --    5    cost -- 21.543444
NNNMMMMNMCCCCCCR step     6  cost: min 19.19  avg 27.21  max 40.92
            std dev -- 4.04  avg_distance -- 82.35
cheat = 980.00  (min = 920.00, max = 1000.00)
ranko = 19.19  yugo = 31.75  wire = 4.01
NNNMMMNNMCCCCCCR
```

FIG. 49a-1

```
step    7  cost: min 38.42  avg 25.20  max 40.36
           std dev -- 3.83  avg_distance -- 83.71
cheat = 980.00  (min = 880.00, max = 1000.00)
ranko = 18.43  yugo = 31.71  wire = 3.92
NMNMMMMNMCCCCCCR step    8  cost: min 18.43  avg 23.02  max 35.82
           std dev -- 3.18  avg_distance -- 89.51
cheat = 980.00  (min = 860.00, max = 1000.00)
ranko = 18.43  yugo = 31.71  wire = 3.92
NNNMMMNNMCCCCCCR step    9  cost: min 17.27  avg 22.08  max 38.14
           std dev -- 3.36  avg_distance -- 89.64
cheat = 890.00  (min = 850.00, max = 990.00)
ranko = 17.27  yugo = 31.01  wire = 3.63
NNNNMMNMMCCCCCCR step   10  cost: min 16.13  avg 20.99  max 34.48
           std dev -- 3.09  avg_distance -- 89.64
cheat = 850.00  (min = 850.00, max = 990.00)
ranko = 16.13  yugo = 31.01  wire = 3.50
step --    10    cost -- 16.125446
NNMNMNNMNCCCCCCR step   11  cost: min 15.73  avg 19.84  max 34.48
           std dev -- 3.02  avg_distance -- 88.60
cheat = 830.00  (min = 820.00, max = 990.00)
ranko = 15.73  yugo = 31.05  wire = 3.34
NNMMMNMNNCCCCCCR step   12  cost: min 15.03  avg 18.81  max 29.43
           std dev -- 2.42  avg_distance -- 88.25
cheat = 880.00  (min = 780.00, max = 990.00)
ranko = 15.03  yugo = 31.05  wire = 3.34
NNNMMMMNMCCCCCCR step   13  cost: min 14.61  avg 17.77  max 36.13
           std dev -- 2.61  avg_distance -- 87.88
cheat = 880.00  (min = 770.00, max = 980.00)
ranko = 13.22  yugo = 30.91  wire = 3.20
NNNMMMNNMCCCCCCR step   14  cost: min 13.22  avg 16.77  max 24.76
           std dev -- 2.61  avg_distance -- 87.88
cheat = 820.00  (min = 790.00, max = 970.00)
ranko = 13.22  yugo = 30,91  wire = 3.02
NMMNMMNNNCCCCCCR step   15  cost: min 12.22  avg 15.91  max 22.79
           std dev -- 2.12  avg_distance -- 83.45
cheat = 800.00  (min = 780.00, max = 960.00)
ranco = 12.22  yugo = 30.91  wire = 3.02
step --    15    cost -- 12.219247
NMMMNMMNCCCCCCR step   16  cost: min 11.51  avg 15.40  max 26.64
           std dev -- 2.57  avg_distance -- 85.07
cheat = 840.00  (min = 720.00, max = 930.00)
rnako = 11.51  yugo = 30.05  wire = 2.62
MNNMMNNNNCCCCCCR step   17  cost: min 11.10  avg 14.84  max 22.19
           std dev -- 2.00  avg_distance -- 86.10
```

FIG. 49a-2

```
cheat = 680.00  (min = 680.00, max = 920.00)
ranko = 11.10  yugo = 29.55  wire = 2.58
NMNMMMMNMCCCCCR step    18  cost: min 10.39  avg 14.32  max 23.80
            std dev -- 2.39  avg_distance -- 87.77
cheat = 690.00  (min = 670.00, max = 930.00)
ranko = 10.39  yugo = 28.34  wire = 2.38
NNNMMMNNMCCCCCR
switching cost function to wire step    19  cost: min 2.33  avg 2.94  max 4.86
            std dev -- 0.39  avg_distance -- 87.00
cheat = 730.00  (min = 660.00, max = 910,00)
ranko = 9.94  yugo = 28.77  wire = 2.33
NNNNMMNMMCCCCCR step    20  cost: min 2.24  avg 2.82  max 4.86
            std dev -- 0.45  avg_distance -- 83.97
cheat = 700.00  (min = 640.00, max = 920.00)
ranko = 9.64  yugo = 28.67  wire = 2.24
step --    20    cost -- 2.236364
NNMNMNNMNCCCCCR step    21  cost: min 2.21  avg 2.68  max 4.21
            std dev -- 0.30  avg_distance -- 81.75
cheat = 670.00  (min = 630.00, max = 870.00)
ranko = 9.47  yugo = 28.34  wire = 2.21
NNMMMNMNNCCCCCR step    22  cost: min 2.15  avg 2.57  max 3.58
            std dev -- 0.23  avg_distance -- 80.25
cheat = 670.00  (min = 610.00, max = 860.00)
ranko = 8.93  yugo = 28.25  wire = 2.15
NNNMMMMNMCCCCCR step    23  cost: min 2.05  avg 2.51  max 3.98
            std dev -- 0.34  avg_distance -- 79.18
cheat = 630.00  (min = 480.00, max = 860.00)
ranko = 8.66  yugo = 27.16  wire = 2.05
NNNMMMNNMCCCCCR step    24  cost: min 1.92  avg 2.38  max 3.25
            std dev -- 0.22 avg_distance -- 73.32
cheat = 600.00  (min = 460.00, max = 820.00)
ranko = 8.02  yugo = 27.70  wire = 1.92
NNNNMMMMCCCCCR step    25  cost: min 1.93  avg 2.29  max 3.00
            std dev -- 0.19  avg_distance -- 73.47
cheat = 600.00  (min = 460.00, max = 890.00)
ranko = 8.02  yugo = 27.70  wire = 1.92
step --    25    cost -- 1.918182
NNNMMMNNNCCCCCR step    26  cost: min 1.82  avg 2.2  max 3.22
            std dev -- 0.23  avg_distance -- 69.91
cheat = 500.00  (min = 460.00, max = 750.00)
ranko = 7.71  yugo = 27.10  wire = 1.82
NNNMMMMMCCCCCCR step    27  cost: min 1.79  avg 2.12  max 2.68
            std dev -- 0.18  avg_distance -- 66.09
cheat = 400.00  (min = 400.00, max = 800.00)
```

FIG. 49b-1

```
ranko = 8.05  yugo = 26.11  wire = 1.79
NNNNNNNNMCCCCCCR step     28  cost: min 1.64  avg 2.08  max 3.01
             std dev -- 0.25  avg_distance -- 64.42
cheat = 380.00  (min = 380.00, max = 750.00)
ranko = 7.11  yugo = 25.69  wire = 1.64
NMNMMMMNMCCCCCCR step     29  cost: min 1.64  avg 2.02  max 2.88
             std dev -- 0.25  avg_distance -- 64.29
cheat = 380.00  (min = 380.00, max = 700.00)
ranko = 7.11  yugo = 25.69  wire = 1.64
NNNMMMNNMCCCCCCR step     30  cost: min 1.52  avg 1.95  max 2.73
             std dev -- 0.21  avg_distance -- 62.90
cheat = 350.00  (min = 300.00, max = 770,00)
ranko = 6.41  yugo = 25.22  wire = 1.52
step --    30    cost -- 1.518182
NNNNMMNMMCCCCCCR step     31  cost: min 1.50  avg 1.89  max 2.98
             std dev -- 0.25  avg_distance -- 58.80
cheat = 350.00  (min = 300.00, max = 890.00)
ranko = 6.62  yugo = 24.83  wire = 1.50
NNMNMNNMNCCCCCCR step     32  cost: min 1.48  avg 1.85  max 2.66
             std dev -- 0.24  avg_distance -- 58.53
cheat = 270.00  (min = 270.00, max = 690.00)
ranko = 6.41  yugo = 24.71  wire = 1.48
NNMMMNMNNCCCCCCR step     33  cost: min 1.42  avg 1.78  max 3.70
             std dev -- 0.30  avg_distance -- 56.60
cheat = 260.00  (min = 220.00, max = 820.00)
ranko = 6.10  yugo = 24.62  wire = 1.42
NNNMMMMNMCCCCCCR step     34  cost: min 1.35  avg 1.70  max 2.35
             std dev -- 0.20  avg_distance -- 53.01
cheat = 210.00  (min = 170.00, max = 680.00)
ranko = 5.82  yugo = 24.47  wire = 1.35
NNNMMMNNMCCCCCCR step     35  cost: min 1.342 avg 1.65  max 2.64
             std dev -- 0.22  avg_distance -- 50.26
cheat = 210.00  (min = 190.00, max = 560.00)
ranko = 5.57  yugo = 24.23  wire = 1.34
step --    35    cost -- 1.336364
NMMNMMNNNCCCCCCR step     36  cost: min 3.28  avg 1.57  max 3.39
             std dev -- 0.23  avg_distance -- 45.58
cheat = 160.00  (min = 160.00, max = 840.00)
ranco = 5.48  yugo = 23.79  wire = 1.38
NMMMNNMMNCCCCCCR step     37  cost: min 1.22  avg 1.52  max 2.05
             std dev -- 0.14  avg_distance -- 41.10
cheat = 110.00  (min = 110.00, max = 660.00)
rnako = 5.37  yugo = 23.22  wire = 1.22
MNNMMNNNNCCCCCCR
```

```
step    38  cost: min 1.20  avg 1.46  max 1.88
            std dev -- 0.15  avg_distance -- 39.63
cheat = 110.00  (min = 110.00, max = 440.00)
ranko = 4.99  yugo = 23.21  wire = 1.20
NNNNMNMNMMCCCCCR step    39  cost: min 1.30  avg 1.42  max 2.63
            std dev -- 0.23  avg_distance -- 38.48
cheat = 70.00  (min = 70.00, max = 700.00)
ranko = 4.49  yugo = 22.55  wire = 1.10
NNNMMMMNMNCCCCCR step    40  cost: min 1.03  avg 1.31  max 1.76
            std dev -- 0.16 avg_distance -- 29.62
cheat = 20.00  (min = 20.00, max = 520.00)
ranco = 4.13  yugo = 21.86  wire = 1.03
step --    40    cost -- 1.027273
NNNNMMNNMCCCCCCR step    41  cost: min 1.00  avg 1.23  max 1.90
            std dev -- 0.18  avg_distance -- 23.37
cheat = 0.00  (min = 0.00, max = 530.00)
ranko = 4.00  yugo = 21.61  wire = 1.00
 NNNMNNMNCCCCCCR step    43  cost: min 1.00  avg 1.11  max 1.75
            std dev -- 0.15  avg_distance -- 11.71
cheat = 0.00  (min = 0.00, max = 390.00)
ranko = 4.00  yugo = 21.61  wire = 1.00
 MNNMMNM
```

| 1,13 | 2,13 | 3,13 | 4,13 | 5,13 | 6,13 | 7,13 | 8,13 | 9,13 | 10,13 | 11,13 | 12,13 | 13,13 |
|---|---|---|---|---|---|---|---|---|---|---|---|---|
| 1,12 | 2,12 | 3,12 | 4,12 | 5,12 | 6,12 | 7,12 | 8,12 | 9,12 | 10,12 | 11,12 | 12,12 | 13,12 |
| 1,11 | 2,11 | 3,11 | 4,11 | 5,11 | 6,11 | 7,11 | 8,11 | 9,11 | 10,11 | 11,11 | 12,11 | 13,11 |
| 1,10 | 2,10 | 3,10 | 4,10 | 5,10 | 6,10 | 7,10 | 8,10 | 9,10 | 10,10 | 11,10 | 12,10 | 13,10 |
| 1,9 | 2,9 | 3,9 | 4,9 | 5,9 | 6,9 | 7,9 | 8,9 | 9,9 | 10,9 | 11,9 | 12,9 | 13,9 |
| 1,8 | 2,8 | 3,8 | 4,8 | 5,8 | 6,8 | 7,8 | 8,8 | 9,8 | 10,8 | 11,8 | 12,8 | 13,8 |
| 1,7 | 2,7 | 3,7 | 4,7 | 5,7 | 6,7 | 7,7 | 8,7 | 9,7 | 10,7 | 11,7 | 12,7 | 13,7 |
| 1,6 | 2,6 | 3,6 | 4,6 | 5,6 | 6,6 | 7,6 | 8,6 | 9,6 | 10,6 | 11,6 | 12,6 | 13,6 |
| 1,5 | 2,5 | 3,5 | 4,5 | 5,5 | 6,5 | 7,5 | 8,5 | 9,5 | 10,5 | 11,5 | 12,5 | 13,5 |
| 1,4 | 2,4 | 3,4 | 4,4 | 5,4 | 6,4 | 7,4 | 8,4 | 9,4 | 10,4 | 11,4 | 12,4 | 13,4 |
| 1,3 | 2,3 | 3,3 | 4,3 | 5,3 | 6,3 | 7,3 | 8,3 | 9,3 | 10,3 | 11,3 | 12,3 | 13,3 |
| 1,2 | 2,2 | 3,2 | 4,2 | 5,2 | 6,2 | 7,2 | 8,2 | 9,2 | 10,2 | 11,2 | 12,2 | 13,2 |
| 1,1 | 2,1 | 3,1 | 4,1 | 5,1 | 6,1 | 7,1 | 8,1 | 9,1 | 10,1 | 11,1 | 12,1 | 13,1 |

| 1,13 | 2,13 | 3,13 | 4,13 | 5,13 | 6,13 | 7,13 | 8,13 | 9,13 | 10,13 | 11,13 | 12,13 | 13,13 |
|---|---|---|---|---|---|---|---|---|---|---|---|---|
| 1,12 | 2,12 | 3,12 | 4,12 | 5,12 | 6,12 | 7,12 | 8,12 | 9,12 | 10,12 | 11,12 | 12,12 | 13,12 |
| 1,11 | 2,11 B2 | 3,11 | 4,11 | 5,11 | 6,11 | 7,11 | 8,11 D2 | 9,11 | 10,11 | 11,11 | 12,11 | 13,11 |
| 1,10 | 2,10 | 3,10 | 4,10 | 5,10 | 6,10 | 7,10 | 8,10 | 9,10 | 10,10 | 11,10 | 12,10 | 13,10 |
| 1,9 | 2,9 | 3,9 | 4,9 | 5,9 | 6,9 | 7,9 | 8,9 | 9,9 | 10,9 | 11,9 | 12,9 | 13,9 |
| 1,8 | 2,8 | 3,8 | 4,8 | 5,8 | 6,8 | 7,8 | 8,8 | 9,8 | 10,8 | 11,8 | 12,8 | 13,8 |
| 1,7 | 2,7 | 3,7 | 4,7 | 5,7 | 6,7 | 7,7 | 8,7 | 9,7 | 10,7 | 11,7 | 12,7 | 13,7 |
| 1,6 | 2,6 A2 | 3,6 | 4,6 | 5,6 | 6,6 | 7,6 | 8,6 C2 | 9,6 | 10,6 | 11,6 | 12,6 | 13,6 |
| 1,5 | 2,5 | 3,5 | 4,5 | 5,5 | 6,5 | 7,5 | 8,5 | 9,5 | 10,5 | 11,5 | 12,5 | 13,5 |
| 1,4 | 2,4 | 3,4 | 4,4 | 5,4 | 6,4 | 7,4 | 8,4 | 9,4 | 10,4 | 11,4 | 12,4 | 13,4 |
| 1,3 | 2,3 | 3,3 | 4,3 | 5,3 | 6,3 | 7,3 | 8,3 | 9,3 | 10,3 | 11,3 | 12,3 | 13,3 |
| 1,2 | 2,2 | 3,2 | 4,2 | 5,2 | 6,2 | 7,2 | 8,2 | 9,2 | 10,2 | 11,2 | 12,2 | 13,2 |
| 1,1 | 2,1 | 3,1 | 4,1 | 5,1 | 6,1 | 7,1 | 8,1 | 9,1 | 10,1 | 11,1 | 12,1 | 13,1 |

| 1,13 | 2,13 | 3,13 | 4,13 | 5,13 | 6,13 | 7,13 | 8,13 | 9,13 | 10,13 | 11,13 | 12,13 | 13,13 |
|---|---|---|---|---|---|---|---|---|---|---|---|---|
| 1,12 | 2,12 | 3,12 | 4,12 | 5,12 | 6,12 | 7,12 | 8,12 | 9,12 | 10,12 | 11,12 | 12,12 | 13,12 |
| 1,11 | 2,11 | 3,11 | 4,11 | 5,11 | 6,11 | 7,11 | 8,11 | 9,11 | 10,11 | 11,11 | 12,11 | 13,11 |
| 1,10 | 2,10 | 3,10 | 4,10 | 5,10 | 6,10 | 7,10 | 8,10 | 9,10 | 10,10 | 11,10 | 12,10 | 13,10 |
| 1,9 | 2,9 | 3,9 | 4,9 | 5,9 | 6,9 | 7,9 | 8,9 | 9,9 | 10,9 | 11,9 | 12,9 | 13,9 |
| 1,8 | 2,8 | 3,8 | 4,8 | 5,8 | 6,8 | 7,8 | 8,8 | 9,8 | 10,8 | 11,8 | 12,8 | 13,8 |
| 1,7 | 2,7 | 3,7 | 4,7 | 5,7 | 6,7 | 7,7 | 8,7 | 9,7 | 10,7 | 11,7 | 12,7 | 13,7 |
| 1,6 E2 | 2,6 | 3,6 | 4,6 | 5,6 | 6,6 | 7,6 | 8,6 | 9,6 | 10,6 | 11,6 | 12,6 | 13,6 |
| 1,5 | 2,5 | 3,5 | 4,5 | 5,5 | 6,5 | 7,5 | 8,5 | 9,5 | 10,5 | 11,5 | 12,5 | 13,5 |
| 1,4 | 2,4 | 3,4 | 4,4 | 5,4 | 6,4 | 7,4 | 8,4 | 9,4 | 10,4 | 11,4 | 12,4 | 13,4 |
| 1,3 | 2,3 | 3,3 | 4,3 | 5,3 | 6,3 | 7,3 | 8,3 | 9,3 | 10,3 | 11,3 | 12,3 | 13,3 |
| 1,2 A1 | 2,2 E1 | 3,2 | 4,2 | 5,2 E6 | 6,2 | 7,2 | 8,2 | 9,2 | 10,2 | 11,2 | 12,2 | 13,2 |
| 1,1 | 2,1 | 3,1 | 4,1 | 5,1 | 6,1 | 7,1 | 8,1 | 9,1 | 10,1 | 11,1 | 12,1 | 13,1 |

FIG. 60

FIG. 61
| 4,4 | 5,4 | 5,9 | 9,4 |
| 4,5 | 6,4 | 6,9 | 9,5 |
| 4,6 | 7,4 | 7,9 | 9,6 |
| 4,7 | 8,4 | 8,9 | 9,7 |
| 4,8 | | | 9,8 |
| 4,9 | | | 9,9 |
FIG. 62
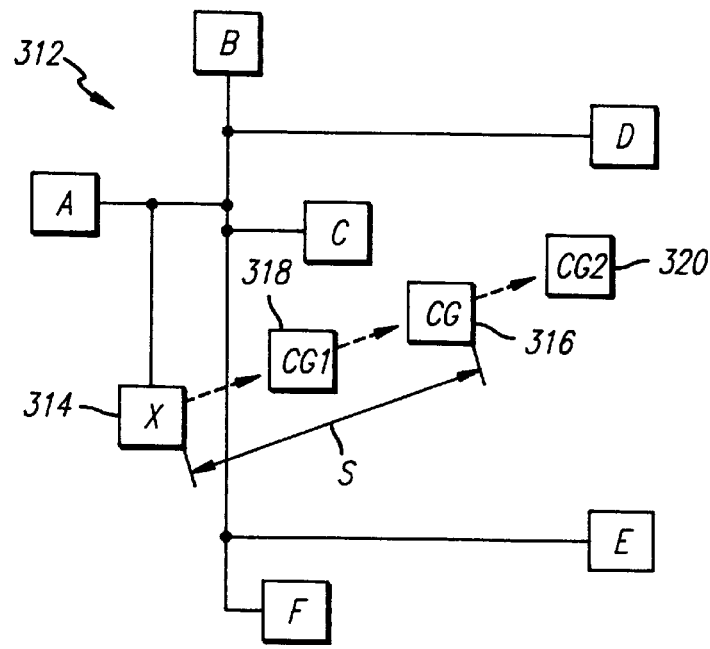
FIG. 63
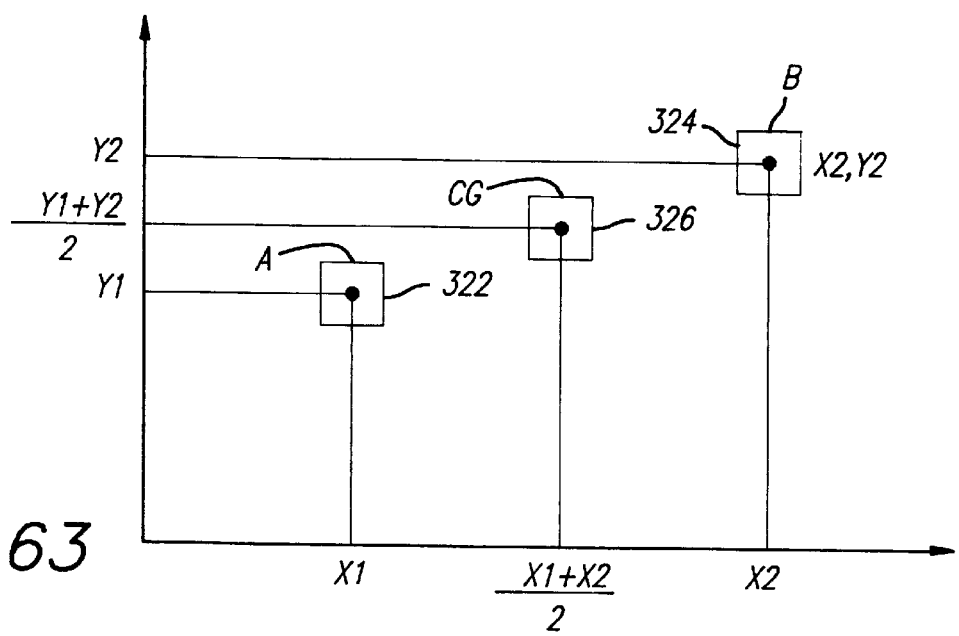

SIMULTANEOUS PLACEMENT AND ROUTING (SPAR) METHOD FOR INTEGRATED CIRCUIT PHYSICAL DESIGN AUTOMATION SYSTEM

This application is a continuation of U.S. patent application Ser. No. 08/230,023, filed Apr. 19, 1994, now abandoned.

BACKGROUND OF THE INVENTION

1. Field of the Invention

The present invention generally relates to the art of microelectronic circuit fabrication, and more specifically to a Simultaneous Placement And Routing (SPAR) method for an integrated circuit physical design automation system.

2. Description of the Related Art

CONTENTS

1. Integrated Circuit (IC) Physical Design
2. Physical Design Algorithms
   a. Overview
   b. Simulated Annealing
   c. Simulated Evolution
   d. Force Directed Placement
3. Integrated Circuit Cell Placement Representation
4. Cost Function Computation for IC Physical Design
5. Parallel Processing Applied to IC Physical Design
6. Distributed Shared Memory (DSM) Parallel Processing Architectures
   a. Overview
   b. Limitations of Basic DSM Architecture
   c. Telecommunications Network Applications 1. Integrated Circuit (IC) Physical Design The automated physical design of a microelectronic integrated circuit is a specific, preferred example of simultaneous optimization processing using a parallel processing architecture to which the present invention is directed.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

Currently available physical design automation systems are limited in that they are only capable of placing and routing approximately 20,000 devices or cells. Placement of larger numbers of cells is accomplished by partitioning the cells into blocks of 20,000 or less, and then placing and routing the blocks. This expedient is not satisfactory since the resulting placement solution is far from optimal.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

The input to the physical design problem is a circuit diagram, and the output is the layout of the circuit. This is accomplished in several stages including partitioning, floor planning, placement, routing and compaction.

Partitioning—A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is referred to as a netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement—This step is concerned with selecting good layout alternatives for each block of the entire chip, as well as between blocks and to the edges. Floor planning is a critical step as it sets up the ground work for a good layout. However it is computationally quite hard. Very often the task of floor plan layout is done by a design engineer using a CAD tool. This is necessary as the major components of an IC are often intended for specific locations on the chip.

Only for simple layouts can the current layout tools provide a solution without human-engineering direction and intervention. One aspect of the present invention will permit complex problems, including flow plan layout, to be accomplished without regular human intervention.

During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

The vertical and horizontal channels 26 and 28 are generally provided between the blocks in order to allow for electrical interconnections. The quality of the placement will not be evident until the routing phase has been completed. A particular placement may lead to an unroutable design. For example, routing may not be possible in the space provided. In that case another iteration of placement is necessary. Sometimes routing is implemented over the entire area, and not just over the channels.

To limit the number of iterations of the placement algorithm, an estimate of the required routing space is used during the placement phase. A good routing and circuit performance heavily depend on a good placement algorithm. This is due to the fact that once the position of each block is fixed, very little can be done to improve the routing and overall circuit performance.

Routing—The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Due to the nature of the routing algorithms, complete routing of all connections cannot be guaranteed in many cases. As a result, a technique called "rip up and re-route" is used that removes troublesome connections and re-routes them in a different order.

Compaction—Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

VLSI physical design is iterative in nature and many steps such as global routing and channel routing are repeated several times to obtain a better layout. In addition, the quality of results obtained in one stage depends on the quality of solution obtained in earlier stages as discussed above. For example, a poor quality placement cannot be fully cured by high quality routing. As a result, earlier steps have extensive influence on the overall quality of the solution.

In this sense, partitioning, floor planning and placement problems play a more important role in determining the area and chip performance in comparison to routing and compaction. Since placement may produce an unroutable layout, the chip might need to be replaced or re-partitioned before another routing is attempted. The whole design cycle is conventionally repeated several times to accomplish the design objectives. The complexity of each step varies depending on the design constraints as well as the design style used.

The area of the physical design problem to which an aspect of the present invention relates is the placement and routing of the cells 24 and other elements on the integrated circuit 10 illustrated in FIG. 1. After the circuit partitioning phase, the area occupied by each block including the elements designated as 14 to 22 and the cells 24 can be calculated, and the number of terminals required by each block is known. In addition, the netlists specifying the connections between the blocks are also specified.

In order to complete the layout, it is necessary to arrange the blocks on the layout surface and interconnect their terminals according to the netlist. The arrangement of blocks is done in the placement phase while interconnection is completed in the routing phase. In the placement phase, the blocks are assigned a specific shape and are positioned on a layout surface in such a fashion that no two blocks are overlapping and enough space is left on the layout surface to complete interconnections between the blocks. The blocks are positioned so as to minimize the total area of the layout. In addition, the locations of the terminals on each block are also determined.

2. Physical Design Algorithms a. Overview

Very Large Scale Integrated Circuit (VLSI) physical design automation utilizes algorithms and data structures related to the physical design process. A general treatise on this art is presented in a textbook entitled "Algorithms for VLSI Physical Design Automation" by Naveed Sherwani, Kluwer Academic Publishers 1993.

Depending on the input, placement algorithms can be classified into two major groups, constructive placement and iterative improvement methods. The input to the constructive placement algorithms consists of a set of blocks along with the netlist. The algorithm finds the locations of the blocks. On the other hand, iterative improvement algorithms start with an initial placement. These algorithms modify the initial placement in search of a better placement. The algorithms are applied in a recursive or an iterative manner until no further improvement is possible, or the solution is considered to be satisfactory based on a predetermined criteria.

Iterative algorithms can be divided into three general classifications, simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Interactive algorithms function by generating large numbers of possible placements and comparing them in accordance with some criteria which is generally referred to as fitness. The fitness of a placement can be measured in a number of different ways, for example, overall chip size. A small size is associated with a high fitness and vice versa. Another measure of fitness is the total wire length of the integrated circuit. A high total wire length indicates low fitness and vice versa.

The relative desirability of various placement configurations can alternatively be expressed in terms of cost, which can be considered as the inverse of fitness, with high cost corresponding to low fitness and vice versa.

b. Simulated Annealing

Basic simulated annealing per se is well known in the art and has been successfully used in many phases of VLSI physical design such as circuit partitioning. Simulated annealing is used in placement as an iterative improvement algorithm. Given a placement configuration, a change to that configuration is made by moving a component or interchanging locations of two components. Such interchange can be alternatively expressed as transposition or swapping.

In the case of a simple pairwise interchange algorithm, it is possible that a configuration achieved has a cost higher than that of the optimum, but no interchange can cause further cost reduction. In such a situation, the algorithm is trapped at a local optimum and cannot proceed further. This happens quite often when the algorithm is used in practical applications. Simulated annealing helps to avoid getting stuck at a local optima by occasionally accepting moves that result in a cost increase.

In simulated annealing, all moves that result in a decrease in cost are accepted. Moves that result in an increase in cost are accepted with a probability that decreases over the iterations. The analogy to the actual annealing process is heightened with the use of a parameter called temperature T. This parameter controls the probability of accepting moves that result in increased cost.

More of such moves are accepted at higher values of temperature than at lower values. The algorithm starts with a very high value of temperature that gradually decreases so that moves that increase cost have a progressively lower probability of being accepted. Finally, the temperature reduces to a very low value which requires that only moves that reduce costs are to be accepted. In this way, the algorithm converges to an optimal or near optimal configuration.

In each stage, the placement is shuffled randomly to get a new placement. This random shuffling could be achieved by transposing a cell to a random location, a transposition of two cells, or any other move that can change the wire length or other cost criteria. After the shuffle, the change in cost is evaluated. If there is a decrease in cost, the configuration is accepted. Otherwise, the new configuration is accepted with a probability that depends on the temperature.

The temperature is then lowered using some function which, for example, could be exponential in nature. The process is stopped when the temperature is dropped to a certain level. A number of variations and improvements on the basic simulated annealing algorithm have been developed. An example is described in an article entitled "Timberwolf 3.2 A New Standard Cell Placement and Global Routing Package" by Carl Sechen, et al., IEEE 23rd Designed Automation Conference paper 26.1, pages 432 to 439.

c. Simulated Evolution

Simulated evolution, which is also known as the genetic algorithm, is analogous to the natural process of mutation of species as they evolve to better adapt to their environment. The algorithm starts with an initial set of placement configurations which is called the population. The initial placement can be generated randomly. The individuals in the population represent a feasible placement to the optimization problem and are actually represented by a string of symbols.

The symbols used in the solution string are called genes. A solution string made up of genes is called a chromosome. A schema is a set of genes that make up a partial solution. The simulated evolution or genetic algorithm is iterated, and each iteration is called a generation. During each iteration, the individual placements of the population are evaluated on the basis of fitness or cost. Two individual placements among the population are selected as parents, with probabilities based on their fitness. The better fitness a placement has, the higher the probability that it will be chosen.

The genetic operators called crossover, mutation and inversion, which are analogous to their counterparts in the evolution process, are applied to the parents to combine genes from each parent to generate a new individual called the offspring or child. The offspring are evaluated, and a new generation is formed by including some of the parents and the offspring on the basis of their fitness in a manner such that the size of the population remains the same. As the tendency is to select high fitness individuals to generate offspring, and the weak individuals are deleted, the next generation tends to have individuals that have good fitness.

The fitness of the entire population improves over the generations. That means that the overall placement quality improves over iterations. At the same time, some low fitness individuals are reproduced from previous generations to maintain diversity even though the probability of doing so is quite low. In this way, it is assured that the algorithm does not get stuck at some local optimum.

The first main operator of the genetic algorithm is crossover, which generates offspring by combining schemata of two individuals at a time. This can be achieved by choosing a random cut point and generating the offspring by combining the left segment of one parent with the right segment of the other. However, after doing so, some cells may be duplicated while other cells are deleted. This problem will be described in detail below.

The amount of crossover is controlled by the crossover rate, which is defined as the ratio of the number of offspring produced by crossing in each generation to the population size. Crossover attempts to create offspring with fitness higher than either parent by combining the best genes from each.

Mutation creates incremental random changes. The most commonly used mutation is pairwise interchange or transposition. This is the process by which new genes that did not exist in the original generation, or have been lost, can be generated.

The mutation rate is defined as the ratio of the number of offspring produced by mutation in each generation to the population size. It must be carefully chosen because while it can introduce more useful genes, most mutations are harmful and reduce fitness. The primary application of mutation is to pull the algorithm out of local optima.

Inversion is an operator that changes the representation of a placement without actually changing the placement itself so that an offspring is more likely to inherit certain schema from one parent.

After the offspring are generated, individual placements for the next generation are chosen based on some criteria. Numerous selection criteria are available, such as total chip size and wire length as described above. In competitive selection, all the parents and offspring compete with each other, and the fittest placements are selected so that the population remains constant. In random selection, the placements for the next generation are randomly selected so that the population remains constant.

The latter criteria is often advantageous considering the fact that by selecting the fittest individuals, the population converges to individuals that share the same genes and the search may not converge to an optimum. However, if the individuals are chosen randomly there is no way to gain improvement from older generation to new generation. By combining both methods, stochastic selection makes selections with probabilities based on the fitness of each individual.

d. Force Directed Placement

Force directed placement exploits the similarity between the placement problem and the classical mechanics problem of a system of bodies attached to springs. In this method, the blocks connected to each other by nets are supposed to exert attractive forces on each other. The magnitude of this force is directly proportional to the distance between the blocks. Additional proportionality is achieved by connecting more "springs" between blocks that "talk" to each other more (volume, frequency, etc.) and fewer "springs" where less extensive communication occurs between each block.

According to Hooke's Law, the force exerted due to the stretching of the springs is proportional to the distance between the bodies connected to the spring. If the bodies are allowed to move freely, they would move in the direction of the force until the system achieved equilibrium. The same idea is used for placing the cells. The final configuration of the placement of cells is the one in which the system achieves a solution that is closest to or in actual equilibrium.

3. Integrated Circuit Cell Placement Representation

Using physical design algorithms as discussed above, each cell placement is conventionally represented in the form of a list or table including locations on the chip and identifiers of the cells that are assigned to the respective locations. As indicated at 30 in FIG. 2, an exemplary and greatly simplified cell placement includes nine cell locations that are designated as (1) to (9), and cells that are indicated by identifiers 1 to 9. The locations are numbered in consecutive order from left to right and top to bottom.

The cell locations are designated by numbers in parenthesis, whereas the cell identifiers are designated only as numbers. Although only nine cell locations are illustrated as constituting the placement 30, it will be understood that an actual integrated circuit chip can include hundreds of thousands, millions or more of cell locations.

The cells in the placement 30 can be represented by a table or list as indicated at 32. The list 32 is comparable to a chromosome in biological genetics, whereas each entry in the list 32 is analogous to a gene. In a more general sense, the entries in the list can be considered as abstract entities, whereas the list can be considered as a permutation of the entities.

In genetic mutation, a new placement is produced from an initial placement by transposing individual cells. Genetic inversion involves reversing the order of a group of consecutive cells. These operations can be performed using the conventional placement representation illustrated in FIG. 2 without problems. However, attempting to perform genetic crossover using the conventional representation will result in duplication and/or omission of cells, and other illegal placements.

The reason that the conventional placement representation is not applicable to straight genetic crossover is illustrated in FIG. 2. In the illustrated example, a second placement 34 is provided as represented by a list 36. The placements 30 and 34, which are referred to as "parents", are genetically crossed with each other to produce two new placements 38 and 40 that are represented by lists 42 and 44 respectively. The new placements 38 and 40 are referred to as "offspring" or "children".

The placement 30 consists of cells 1 to 9 in locations (1) to (9) respectively. The placement 34 consists of cells 4 to 9 and 1 to 3 in locations (1) to (9) respectively. It will be understood that the particular numerical arrangement of cells in the placements 30 and 34 is arbitrary, and that the principles involved could be alternatively illustrated and described using any numerical arrangement.

In FIG. 2, genetic crossover is performed by transposing or "swapping" the last four elements in the lists 32 and 36. This produces the placement 38 as represented by the list 42 which includes the first five elements in the list 32 and the last four elements in the list 36. The crossover further produces the placement 40 as represented by the list 44 which includes the first five elements in the list 36 and the last four elements in the list 32.

Both of the exemplary placements are illegal, in that they include duplications and omissions of cells. In the placement 38, the cells 1, 2 and 3 are each represented twice, whereas the cells 6, 7 and 8 are omitted. In the placement 40, the cells 6, 7 and 8 are each represented twice, whereas the cells 1, 2 and 3 are omitted. It is clear that this method is inapplicable to the physical design of integrated circuit chips because the circuits would be inoperative if cells were duplicated and/or omitted.

An expedient for bypassing this problem is described in an article entitled "A GENETIC APPROACH TO STANDARD CELL PLACEMENT USING META-GENETIC PARAMETER OPTIMIZATION", by Khushro Shahookar et al, in IEEE Transactions on Computer-Aided Design, Vol. 9, No. 5, May 1990, pp. 500–511. Shahookar accomplishes his goal by utilizing a complicated modification of genetic crossover referred to in the article as "cycle crossover". Other modified crossover operations which are discussed by Shahookar are referred to as "order crossover" and "partially mapped crossover" (PMX).

The design of an integrated circuit chip requires the placement and routing of at least thousands of cells. The additional computing time required for the implementation of Shahookar's methods increases the total computer time for a typical integrated circuit design to such an inordinate value that it would be impractical to implement in a commercial production environment.

4. Cost Function Computation for IC Physical Design

FIGS. 3 and 4 illustrate a "half-perimeter" wire length computation method which is known in a basic form in the art per se. This method is described in the above referenced article to Sechen, and is advantageous in that it can be performed quickly in a non-computationally intensive manner.

In FIG. 3, a cell placement 46 includes a plurality of cells 48 that are allocated to respective locations on a surface 50 representing an integrated circuit chip. A netlist for the placement includes a list of nets, each of which interconnects terminals on cells that are to be electrically equivalent. An exemplary net 52 is illustrated in the drawing as interconnecting terminals 54, 56 and 58 of cells 48a, 48b and 48c respectively.

The wirelength of the net 52 is estimated by defining or constructing a rectangular "bounding box" 60 that surrounds the outermost terminals of the net 52 and is spaced outwardly therefrom in the horizontal and vertical directions by a "detour factor" $\delta$ that allows for variations in the actual interconnect routing. The wirelength of the net 52 is computed or approximated as the half-perimeter, or the sum of the width and height of the bounding box 60.

In the example of FIG. 3, the net 52 includes a horizontal leg between the terminals 54 and 56 that is approximately equal to the width of the bounding box 60, and a vertical leg between the terminals 56 and 58 that is approximately equal to the height of the bounding box 60. Thus, the half-perimeter method provides a good approximation of the wirelength of the net 52.

However, this is not always the case. For example, as illustrated in FIG. 4, a placement 64 includes a plurality of cells 66 on a surface 68. A net 70 interconnects terminals 72, 74, 76, 78, 80, 82, and 84 of cells 66a, 66b, 66c, 66d, 66e and 66f. The net 70 is enclosed by a bounding box 86.

The net 70 includes a lower horizontal leg and a vertical leg that extends between the terminals 72 and 84. The lengths of these legs in combination is approximately equal to the half-perimeter of the bounding box 86. However, the net 70 further includes a plurality of vertical legs extending from the lower horizontal leg to the terminals 74, 76, 78, 80, 82 and 84.

The lengths of these vertical legs, in combination with the lengths of the legs extending between the terminals 72 and 84, substantially exceed the half-perimeter of the bounding box 86. In this case, the half-perimeter estimation would produce a computed value of wirelength for the net 70 that is unrealistically low, and indicates a lower value of congestion than would actually be present.

5. Parallel Processing Applied to IC Physical Design

A major factor that prevents conventional algorithms from being utilized for the placement and routing of larger number of cells is that the physical design problem is executed using serial or uniprocessor computers. Numerous iterations of the placement and general and detailed routing algorithms are necessary before the solution converges to an optimal design. Execution of these iterations is extremely time consuming, requiring days, or even weeks or months to produce a design for a large integrated circuit.

In addition, human intervention is required for all but the simplest designs. Since each stage of iteration inherits the results, but not the details, of the previous operational stage, no sharing of information between stages, such as placement and global routing, that could result in faster convergence, is inherent in the process. Feedback of routing information, for example, could speed up convergence of the placement operation. Since this does not occur, a large number of non-optimal solutions are generated, and a human technician is required to obtain an overview of the process and divert it away from false and/or inefficient solutions.

An implementation in which the genetic algorithm is executed in parallel on separate computers is described in an article entitled "WOLVERINES: STANDARD CELL PLACEMENT ON A NETWORK OF WORKSTATIONS", by S. Mohan et al, IEEE Transactions on Computer-Aided Design of Integrated Circuits and Systems, Vol. 12, No. 9, September 1993, pp. 1312–1326. The procedure runs a basic genetic algorithm on each of a plurality of computer-aided-design (CAD) workstation in the network and utilizes an additional genetic operator, migration, which transfers placement information from one workstation to another across the network. Migration transfers genetic material from one environment to another, thereby introducing new genetic information and modifying the new environment.

If the migrants are fitter than the existing individuals in the new environment, they get a high probability of reproduction and their genetic material is incorporated into the local population. When the population is very small it tends to converge after a few generations, in the sense that all the individuals come to resemble one another. Migration prevents this premature convergence of inbreeding by introducing new genetic material. In this manner, the genetic algorithm is modified by splitting the large population over different workstations and using the migration mechanism to prevent premature convergence.

Although Mohan discloses the general concept of parallel processing of genetic algorithms, he teaches a procedure in which the various stages of integrated circuit chip design are performed in series, with no feedback or sharing of information between stages until an entire design is completed or at least the global routing stage is completed.

6. Distributed Shared Memory (DSM) Parallel Processing Architectures a. Overview An architecture including a plurality, preferably many parallel processors that is especially suited for application to physical design automation of integrated circuits is known as cache coherent Distributed Shared Memory (DSM). Two examples of this architecture are presented in an article entitled "The Stanford Dash Multiprocessor", by Daniel Lenoski et al, et al, in Computer Magazine, March 1992, pp. 63–79, and in a technical summary of the KSR1 System prepared by Kendall Square Research, of Waltham, Mass., 1992.

A basic DSM architecture of the type described in the article to Lenoski (the DASH system) is illustrated in FIG. 5. A DSM system 90 includes processors 92, 94, and 96, 98 that are arranged in two clusters 100 and 102 respectively. Cache memories 104, 106, 108 and 110 are connected to the processors 92, 94, 96 and 98 respectively. The cluster 100 further includes a shared memory 112 and a directory 114, whereas the cluster 102 further includes a shared memory 116 and a directory 118. The clusters 100 and 102 communicate with each other via an interconnection network 120.

Although only four processors are illustrated in FIG. 38, in a practical application the number of processors will preferably be tens, hundreds or even thousands. The caches 104 and 106, shared memory 112 and directory 114 are interconnected by a snooping bus 122, whereas the caches 108 and 110, shared memory 116 and directory 118 are interconnected by a snooping bus 124.

The arrangement of FIG. 5 is advantageous in that all of the memory in the system, consisting of the caches 104, 106, 108 and 110 and shared memory 112 and 116, is available for use by all of the processors 92, 94, 96 and 98, and the memory is scalable. The memory used by each processor can be dynamically allocated depending on the requirements of a particular task.

However, the memory access times are different depending on the type of access. The processors can access the caches that are directly connected thereto at a highest speed, and access the shared memory in their respective cluster at a lower speed. A processor in one cluster can access a cache or shared memory in another cluster via the interconnection network 120, but at a yet lower speed.

The snooping buses 122 and 124 provide cache coherence within the clusters 100 and 102 respectively, whereas the directories 114 and 118 provide cache coherence for the entire system 90. In the cache coherence scheme, multiple copies of a particular data block can exist in the different memories of the system. The directories 114 and 118 keep track of which data blocks are stored in which memories.

If a data block is altered by any of the processors, the unmodified copies in other memories are either invalidated or updated. If invalidation is used, the relevant directory 114 or 118 sends messages only to the memories that contain the unmodified copies to indicate that the copies are no longer valid. Where updating is used, copies of the modified block are sent to the memories in which the original copies were stored.

b. Limitations of Basic DSM Architecture

In applying genetic algorithms and other fitness improvement operations to solving integrated circuit cell placement and other optimization problems, an important issue is that the computational requirements increase very rapidly with problem size. The size of the "DNA" or data structure representing a member of the population or placement increases with the problem size. The size of the population required to find the optimum placement also increases with the problem size, so the memory requirements increase very rapidly.

The time required to perform a fitness calculation increases with the size of the DNA, and the number of fitness calculations required per generation increases with the size of the population. The number of generations required to reach a solution increases with the size of the population.

Thus, the computation time increases rapidly with problem size. Taking the memory requirements and computation time together, the computational requirements increase very rapidly with problem size. For example, using a genetic algorithm to find an optimal placement of 9 cells takes a few seconds, 25 cells takes a few minutes, and 100 cells takes a few hours, using an industry Standard Performance Evaluation Criteria (SPEC) 50 workstation. Using this approach to find an optimal placement of a state-of-the-art chip with 100,000 or more cells is not feasible.

In a DSM system such as described above with reference to FIG. 5, a shared or main memory is provided for data that is more global, operated on by more than one processor, or is too large to be stored in a local cache memory. A scalable mechanism, typically a directory structure, is provided to maintain the main memory and all of the cache memories coherent with each other.

The directory logic enables any processor to access data in the main memory or in any cache memory, and invalidates or updates any obsolete copies of data. The directory based DSM architecture is especially advantageous in that the memory bandwidth scales with the number of processors.

In view of the numerous advantages provided by the DSM architecture, it would be desirable to integrate a DSM node on a single integrated circuit chip. However, the inherent characteristics of the conventional DSM design frustrate the accomplishment of this goal using presently available microelectronic circuit fabrication technology.

More specifically, it is highly preferable to store data in a local cache memory, which is generally implemented as Static Random Access Memory (SRAM) rather than in a main memory, which is generally implemented as Dynamic Random Access Memory (DRAM) due to the much lower latency and access time. However, if a cache memory is not large enough, some of the data that is required to be stored must be directed to the main memory. This data is said to "miss" the cache memory, and the number of memory access operations that must be performed using the main memory is referred to as the "cache miss rate".

Since the latency of the main memory is much higher than that of the cache memory, a large cache memory is required to provide an acceptably low cache miss rate. The time required to process a cache miss, which is referred to as the "cache miss resolution period" or "cache miss cost", includes the time required to access the main memory in addition to performing requisite housekeeping functions.

The processor that ordered the memory access operation which resulted in the cache miss is "stalled" during the cache resolution period, and cannot execute any other instructions until the memory access operation is completed.

Assuming a 100 Mhz clock rate, a cache memory access operation can be typically performed in 10 ns, whereas a typical cache miss resolution period or cost is on the order of 200 to 500 ns. If the cache miss rate is high and the instructions being processed are memory intensive, the processing speed can be reduced to such an extent that the system can operate at an effective clock rate of as low as 2 MHz.

For this reason, the cache memory in a conventional DSM system is made sufficiently large to reduce the cache miss rate to a level at which the processing speed is not unacceptably degraded. However, a cache memory of conventional size is too large to fit on a single integrated circuit chip together with a processor, main memory and the requisite logic and control circuitry.

The problem is exacerbated by the fact that cache memory is conventionally implemented as SRAM, whereas main memory is implemented as DRAM. SRAM has a much lower gate or cell density than DRAM. For example, assuming a CMOS process with a feature size of 0.5 $\mu$m, the SRAM density is typically 2 kilobytes per square millimeter, whereas the DRAM density is 32 kilobytes per square millimeter.

The high latency and cache miss cost for main memory access in a conventional multi-chip DSM system, even if a large cache memory is provided to reduce the cache miss rate, reduce the effective processing speed to such an extent that complicated processors are required to increase the processing speed to an acceptable value.

An example of such a processor is a "superscalar" processor that executes several instructions simultaneously using an asynchronous pipelining system. In addition to being complicated and expensive, such processors are too large to fit on a single integrated circuit chip together with the other elements of a DSM node.

c. Telecommunications Network Applications

Electronic data networks are becoming increasingly widespread for the communication of divergent types of data including computer coded text and graphics, voice and video. Such networks enable the interconnection of large numbers of computer workstations, telephone and television systems, video teleconferencing systems and other facilities over common data links or carriers.

Computer workstations are typically interconnected by local area networks (LAN) such as Ethernet, Token Ring, DECNet and RS-232, whereas metropolitan, national and international systems are interconnected by wide area networks (WAN) such as T1, V3.5 and FDDI.

Although effective, communication using these networks is relatively slow, and a complicated and expensive network interface adapter must be provided for each device that is to be connected to a network.

SUMMARY OF THE INVENTION

CONTENTS

1. Generalized Optimization Processing Using Decomposition and Simultaneous Processing
2. Optimization Processing for Integrated Circuit (IC) Physical Design Automation
3. Hierarchial Execution by Asynchronous Delegation (HEADWARE)
4. Integrated Circuit Cell Placement Representation
5. Congestion Based Cost Function Computation
6. Improved Genetic Algorithms for Physical Design Automation
7. Optimal Switching of Algorithms
8. Optimal Switching of Cost Functions
9. Simultaneous Placement and Routing (SPAR)
10. Moving Windows
11. Chaotic Placement
12. Single Chip Distributed Shared Memory Node
13. Single Chip Communications Node 1. Generalized Optimization Processing Using Decomposition and Simultaneous Processing The present invention provides a method of process decomposition and optimization utilizing massively parallel simultaneous processors that is especially suited to integrated circuit cell placement optimization.

The present method is not limited to any specific application, however, and can be advantageously applied to optimization problems in a number of diverse areas such as logic synthesis, circuit optimization (for minimum power, etc.), software optimization, logistical problems such as traffic control and routing.

In general, the present method can be utilized to obtain solutions to optimization problems having many simple or complex variables that are interrelated. For example, further applications of the invention include financial market and investment analysis, currency arbitrage, weather forecasting, seismic and nuclear analysis and maintenance of complex databases.

In each application of the present method for producing an optimized solution to a problem, a methodology for solving the problem and/or data representing the problem are decomposed into a plurality of tasks that are performed simultaneously to produce a result for each task. The results are then recomposed to produce an optimized solution to the problem.

The optimized solution is analyzed to produce an evaluation, and the steps of performing the tasks, recomposing the results and analyzing the optimized solution to produce an evaluation are repeated to further optimize the optimized solution if the evaluation does not satisfy a predetermined criterion.

2. Optimization Processing for Integrated Circuit (IC) Physical Design Automation In a physical design automation system for producing an optimized cell placement for an integrated circuit chip, a placement optimization methodology is decomposed into a plurality of cell placement optimization processes that are performed simultaneously by parallel processors on input data representing the chip.

The results of the optimization processes are recomposed to produce an optimized cell placement. The fitness of the optimized cell placement is analyzed, and the parallel processors are controlled to selectively repeat performing the optimization processes for further optimizing the optimized cell placement if the fitness does not satisfy a predetermined criterion.

The system can be applied to initial placement, routing, placement improvement and other problems.

The processors can perform the same optimization process on different placements, or on areas of a single placement. Alternatively, the processors can perform different optimization processes simultaneously on a single initial placement, with the resulting processed placement having the highest fitness being selected as the optimized placement.

The processors can further selectively reprocess areas of a placement having high cell interconnect congestion or other low fitness parameters.

3. Hierarchial Execution by Asynchronous Delegation (HEADWARE)

In accordance with a massively parallel simultaneous processing methodology of the present invention, a master or host process, which can be referred to as a team leader in the present "HEADWARE" concept, is first started. The team leader assigns tasks to worker processes and collects results. The present method uses very little computer time and can service a large number of worker processes.

When a worker process is started, the first thing it does is to send a message to the team leader requesting a task. The team leader then replies with a message assigning a task and marks the task as having been assigned. Communication between the team leader and the worker then ceases, leaving the team leader free to communicate with other workers.

It is not necessary for the team leader to record which worker was assigned a particular task, or when the task was assigned. An arbitrary number of workers can request tasks in this manner, with the team leader assigning each worker a previously unassigned task.

When a worker completes a task, it resumes communication with the team leader and identifies the task that it was assigned, and the results that were obtained from performing the task. The team leader then records the results, marks the task as having been completed and assigns the worker another task. The team leader further preferably saves a copy of the task list on a computer disk or the like at periodic intervals as a precaution against failure of the team leader process.

4. Integrated Circuit Cell Placement Representation

A large number of possible cell placements for an integrated circuit chip are evaluated to determine which has the highest fitness in accordance with a predetermined criteria such as interconnect congestion. Each cell placement, which constitutes an individual permutation of cells from a population of possible permutations, is represented as an initial cell placement in combination with a list of individual cell transpositions or swaps by which the cell placement can be derived from the initial cell placement.

A cell placement can be genetically mutated and/or inverted by adding swaps to the list for its cell placement which designates cells to be transposed. Genetic crossover can be performed by transposing swaps between the lists for two cell placements.

The present cell representation and transposition method enables any type of cell transposition to be performed without loss or duplication of cells or generation of illegal placements.

5. Congestion Based Cost Function Computation

The fitness of each integrated circuit cell placement is evaluated by dividing the placement into rectangular areas we call switch boxes that surround the cell locations respectively. A bounding box is constructed around each net of a netlist for the placement. A congestion factor is computed for each switch box, for example, as being equal to the number of bounding boxes that overlap the respective switch box.

A cost factor for the placement and associated netlist, which is an inverse measure of the fitness, is computed as the maximum value, average value, sum of squares or other function of the congestion factors.

The individual congestion factor computations can be modified to require that a terminal of a net of one of the bounding boxes overlap or be within a predetermined distance of a switch box in order for the congestion factor to be computed as the sum of the overlapping bounding boxes in order to localize and increase the accuracy of the cost factor estimation. The congestion factor for a switch box can also be weighted in accordance with the proximity of the switch box to a terminal.

6. Improved Genetic Algorithms for Physical Design Automation

Cells for transposition or "swapping" within each placement using genetic algorithms are selected using, for example, greedy algorithms based on the fitness of each cell. The cell fitnesses are evaluated in terms of interconnect congestion, total net wire length or other criteria.

Cells are selected for genetic crossover by sorting the cells in order of fitness and multiplying the cell fitnesses by weighting factors that increase non-linearly with rank. The cells are selected using linear or random or pseudo-random or patterned number generation such that cells with higher fitnesses have a higher probability of selection.

Cells having lowest fitness are selected for mutation, and transposed to random locations, to adjacent locations, with cells having second worst fitness, to the center of mass of the respective interconnect nets, or with two or more cells in a cyclical manner.

7. Optimal Switching of Algorithms

Two or more fitness improvement algorithms are available, and are optimally switched from one to the other in accordance with an optimization criterion to maximize convergence of the placements toward the optimal configuration.

8. Optimal Switching of Cost Functions

Two or more fitness (cost) calculation functions are available, and are optimally switched from one to the other in accordance with a optimization criterion.

9. Simultaneous Placement and Routing (SPAR)

A method for optimizing a cell placement for an integrated circuit chip includes decomposing an initial placement of cells into a hierarchial order of groups of cells. The groups are routed simultaneously using parallel processors, and the results are recomposed to provide a global routing that provides a detailed mapping of cell interconnect congestion in the placement.

Areas of high congestion are identified, and a congestion reduction algorithm is applied using the parallel processors to alter the placement in these areas simultaneously. The overall fitness of the placement is then computed, and if it has not attained a predetermined value, the steps of identifying congested areas and applying the congestion reduction algorithm to these areas are repeated.

The present invention advantageously utilizes detailed congestion information provided by the global routing. However, global routing is very time consuming, and impractical to perform after each local congestion reduction iteration within the limits of current microelectronic circuit technology.

The present invention avoids this problem by estimating the cumulative error created by altering the placement without repeating global routing, and repeating the global routing only if the error exceeds a predetermined value. This enables a number of improvement operations to be performed and their results evaluated before another global routing is required, thereby greatly speeding up the optimization process.

The present methodology, in combination with simultaneous parallel processing applied to routing and fitness improvement and immediate feedback of improvement results to the congestion reduction processing, reduces the time required for placement optimization to a level that can be advantageously realized in a practical implementation.

10. Moving Windows

One or more non-overlapping moving windows are positioned over a placement of cells for an integrated circuit chip to delineate respective subsets of cells. A fitness improvement operation such as simulated evolution is performed on the subsets simultaneously using parallel processors.

The windows may be either moved to specifically identified high interconnect congestion areas of the placement, or are moved across the placement in a raster type or other organized or random pattern such that each area of the placement is processed at least once. Exchange of misplaced cells between subsets can be accomplished by dimensioning the windows and designing the window movement pattern such that the subsets overlap. Alternatively, such exchange can be accomplished by using two sets of windows of different sizes.

As yet another alternative, the improvement operation can allow misplaced cells to be moved to a border area outside a window. Each misplaced cell is placed on a list, and then moved to the centroid of the group of cells to which it is connected, which can be outside the subset that originally included the misplaced cell.

Dividing the chip into "moving windows" and optimizing the placement within each window reduces the time required to find a solution. It has two major advantages. By applying a genetic algorithm or other fitness improvement operation only to cells within the window, the size of the problem is much smaller, and the computational requirements are dramatically reduced. Also, each window can be assigned to a different processor of a suitable multiprocessor computer, so the optimization of the windows can be done simultaneously in parallel, reducing the wall-clock time required to find the solution.

11. Chaotic Placement

In a "chaotic" placement method of the present invention, the fitness of a cell placement for an integrated circuit chip is optimized by relocating at least some of the cells to new locations that provide lower interconnect congestion. For each cell, the centroid of the group of cells to which the cell is connected is computed. The cell is then moved toward the centroid by a distance that is equal to the distance from the current position of the cell to the centroid multiplied by a "chaos" factor $\lambda$.

The value of λ is selected such that the cell relocation operations will cause the placement to converge toward an optimal configuration without chaotic diversion, but with a sufficiently high chaotic element to prevent the optimization operation from becoming stuck at local fitness optima.

The new cell locations can be modified to include the effects of cells in other locations, such as by incorporating a function of cell density gradient or force direction into the computation. This spreads out clumps of cells so that the density of cells is more uniform throughout the placement. The attraction between cells in the nets is balanced against repulsion caused by a high local cell density, providing an optimized tradeoff of wirelength, feasibility and congestion.

12. Single Chip Distributed Shared Memory Node

The present invention overcomes the problems discussed above regarding conventional multi-chip Distributed Shared Memory (DSM) systems, and provides a complete DSM node that is integrated on a single integrated circuit chip.

In accordance with the invention, the capacity of a cache memory is substantially reduced over that required for a multi-chip DSM implementation to enable the cache memory, a main memory, a processor and requisite logic and control circuitry to fit on a single integrated circuit chip.

The increased cache miss rate created by the reduced cache memory capacity is compensated for by the reduced cache miss resolution period or cost resulting from integrating the main memory and processor on the single chip. The reduced cache miss resolution period enables the processor clock rate to be substantially increased, so that a processor having a simple functionality such as a reduced instruction set computer (RISC) processor can be utilized and still provide the required processing speed.

The RISC processor is substantially smaller than a more complicated processor that would be required to provide the same processing speed in a multi-chip DSM implementation, thereby enabling the RISC processor to fit on the chip with the other elements.

The smaller and less expensive RISC processor increases the number of processors that can be connected to a main memory of predetermined size. This increases the number of processors that can simultaneously operate on a problem defined by the main memory space and thereby increases the computational efficiency, and also reduces the amount of main memory that is required for each processor. This further enhances the ability of the present DSM node to be implemented on a single integrated circuit chip.

13. Single Chip Communications Node

The present invention provides a single-chip communications node that can be used in telecommunications networks other than DSM, and is faster in operation, simpler in construction and less expensive to manufacture and implement than conventional network interfaces.

The present communications node includes a memory controller for providing local and remote memory coherency, and a bidirectional interconnect unit that converts memory access instructions into memory access messages and vice-versa.

The above and other objects, features and advantages of the present invention will become apparent to those skilled in the art from the following detailed description taken with the accompanying drawings, in which like reference numerals refer to like parts.

DESCRIPTION OF THE DRAWINGS

FIG. 14 is a diagram that similarly illustrates a cell/cell swap operation;

FIG. 15 is a diagram illustrating a location/cell swap operation;

FIG. 16 is a diagram illustrating a cell/location swap operation;

FIG. 21 is a diagram illustrating a move block operation;

FIG. 22 is a diagram illustrating a rotate block clockwise operation;

FIG. 23 is a diagram illustrating an inversion operation;

FIG. 24 is a diagram illustrating a genetic crossover operation;

FIGS. 34a and 34b in combination constitute a listing of a computer simulated cell placement operation utilizing uniform crossover and the present statistical selection method;

FIG. 35 is a table listing an optimal cell placement produced by the simulation of FIGS. 34a and 34b;

FIGS. 49a to 49c in combination constitute a listing of a computer simulated cell placement operation utilizing the cost function switching method illustrated in FIG. 48;

FIGS. 54 to 56 are diagrams illustrating an optimization processing method of the invention using moving windows in which misplaced cells are exchanged by overlap between windows;

FIGS. 57 to 59 are diagrams illustrating another optimization processing method using moving windows in which misplaced cells are exchanged between two sets of windows of different sizes;

FIGS. 60 and 61 are diagrams illustrating another optimization processing method using moving windows in which misplaced cells are exchanged by allowing misplaced cells to move into a border area around a window, and subsequently be relocated to positions outside the window;

FIG. 62 is a diagram illustrating a method of optimally relocating a cell in a placement using a chaotic optimization method of the invention;

FIG. 63 is a diagram illustrating computation of a center of gravity of a cell net for practicing the method of FIG. 62;

DETAILED DESCRIPTION OF THE INVENTION

CONTENTS

Figure 1:
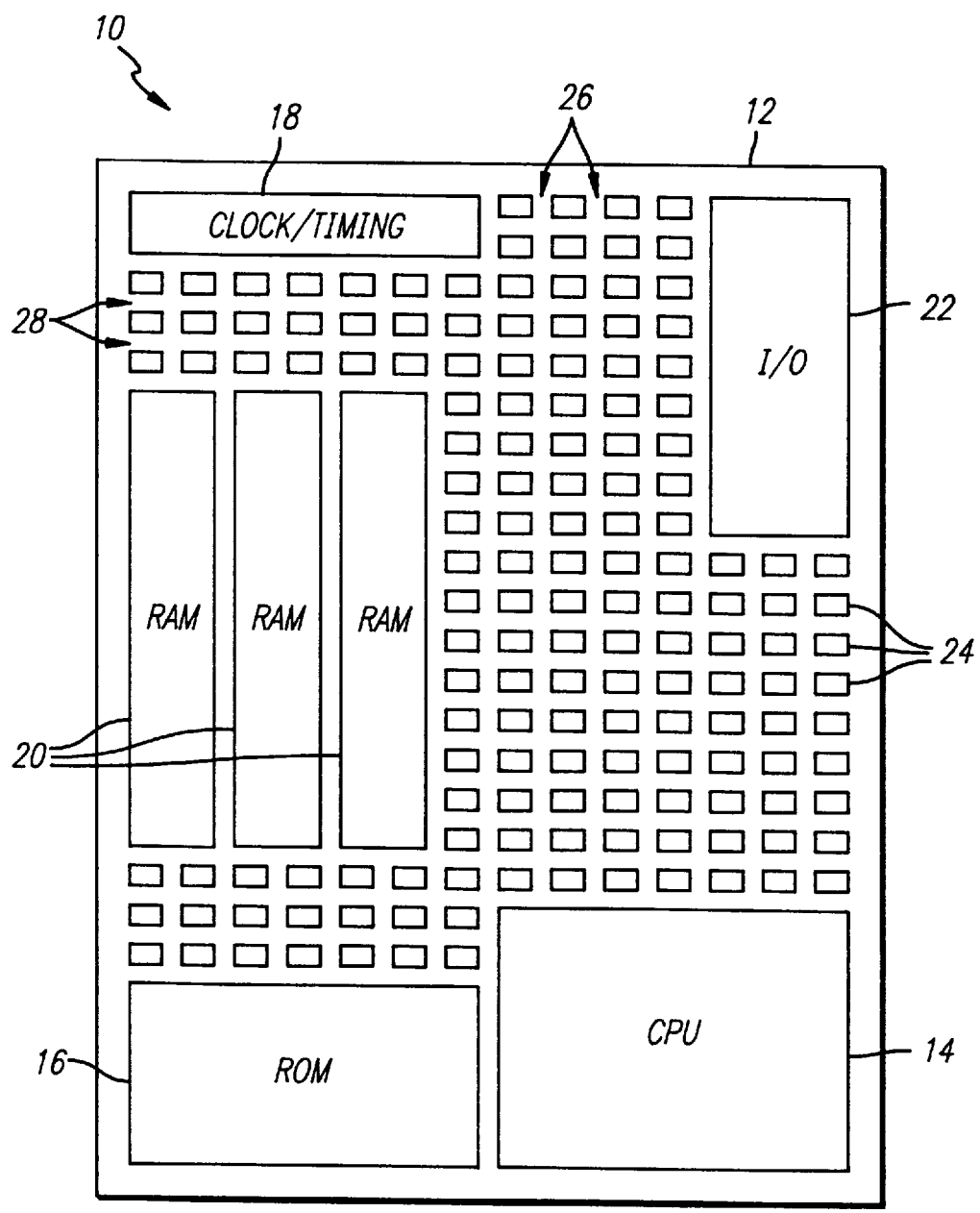
FIG. 1 is a simplified diagram illustrating an integrated circuit chip which can be optimally designed in accordance with the present invention.

1. Generalized Optimization Processing Using Decomposition and Simultaneous Processing
2. Optimization Processing for Integrated Circuit (IC) Physical Design Automation
3. Hierarchial Execution by Asynchronous Delegation (HEADWARE)
4. Integrated Circuit Cell Placement Representation
5. Congestion Based Cost Function Computation
6. Improved Genetic Algorithms for Physical Design Automation
    a. Basic Algorithms
    b. Statistical Selection
    c. Greedy Crossover
    d. Greedy Mutation
7. Optimal Switching of Algorithms
8. Optimal Switching of Cost Functions
9. Simultaneous Placement and Routing (SPAR)
10. Moving Windows
11. Chaotic Placement
12. Distributed Shared Memory Implementations
    a. Single Chip Processor Node
    b. Single Chip Communications Node 1. Generalized Optimization Processing Using Decomposition and Simultaneous Processing The present invention provides a method of process decomposition and optimization utilizing massively parallel simultaneous processors that is especially suited to integrated circuit cell placement optimization. This application will be described in detail in order to clearly present the concepts of the invention.

The present method is not limited to any specific application, however, and can be advantageously applied to optimization problems in a number of diverse areas such as logic synthesis, circuit optimization (for minimum power, etc.), software optimization, logistical problems such as traffic control and routing.

In general, the present method can be utilized to obtain solutions to optimization problems having many simple or complex variables that are interrelated. For example, further applications of the invention include financial market and investment analysis, stock and currency arbitrage, weather forecasting, seismic, nuclear and chemical analysis and maintenance of complex databases.

In each application of the present method for producing an optimized solution to a problem, a methodology for solving the problem and/or data representing the problem are decomposed into a plurality of tasks that are performed simultaneously and/or in parallel to produce a result for each task. The results are then recomposed to produce an optimized solution to the problem.

The optimized solution is analyzed to produce an evaluation, and the steps of performing the tasks, recomposing the results and analyzing the optimized solution to produce an evaluation are repeated to further optimize the optimized solution if the evaluation does not satisfy a predetermined criterion.

For the purposes of the present invention, the word "simultaneously" is defined as two or more tasks being performed concurrently (at the same time). The word "parallel" is defined as two or more tasks being performed independently. Since it is possible for some tasks to have to wait for results of other tasks that are being performed in parallel, it is within the scope of the invention to perform tasks in parallel, but not necessarily simultaneously. In addition, some processors can be working on housekeeping tasks such as supervision, statistical analysis or memory management rather than working on a direct aspect of the main problem.

Figure 6:
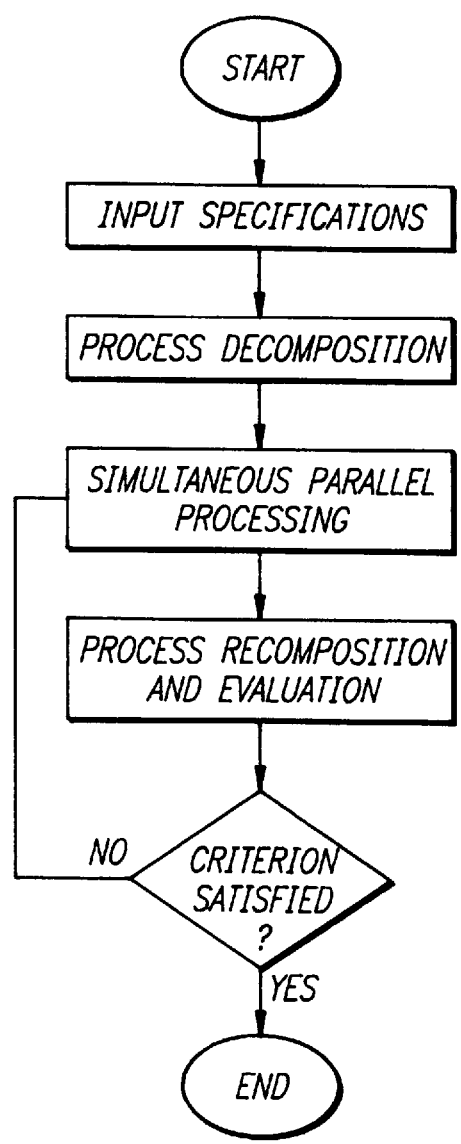
FIG. 6 is a flowchart illustrating an optimization process decomposition and parallel processing method of the present invention.
Figure 7:
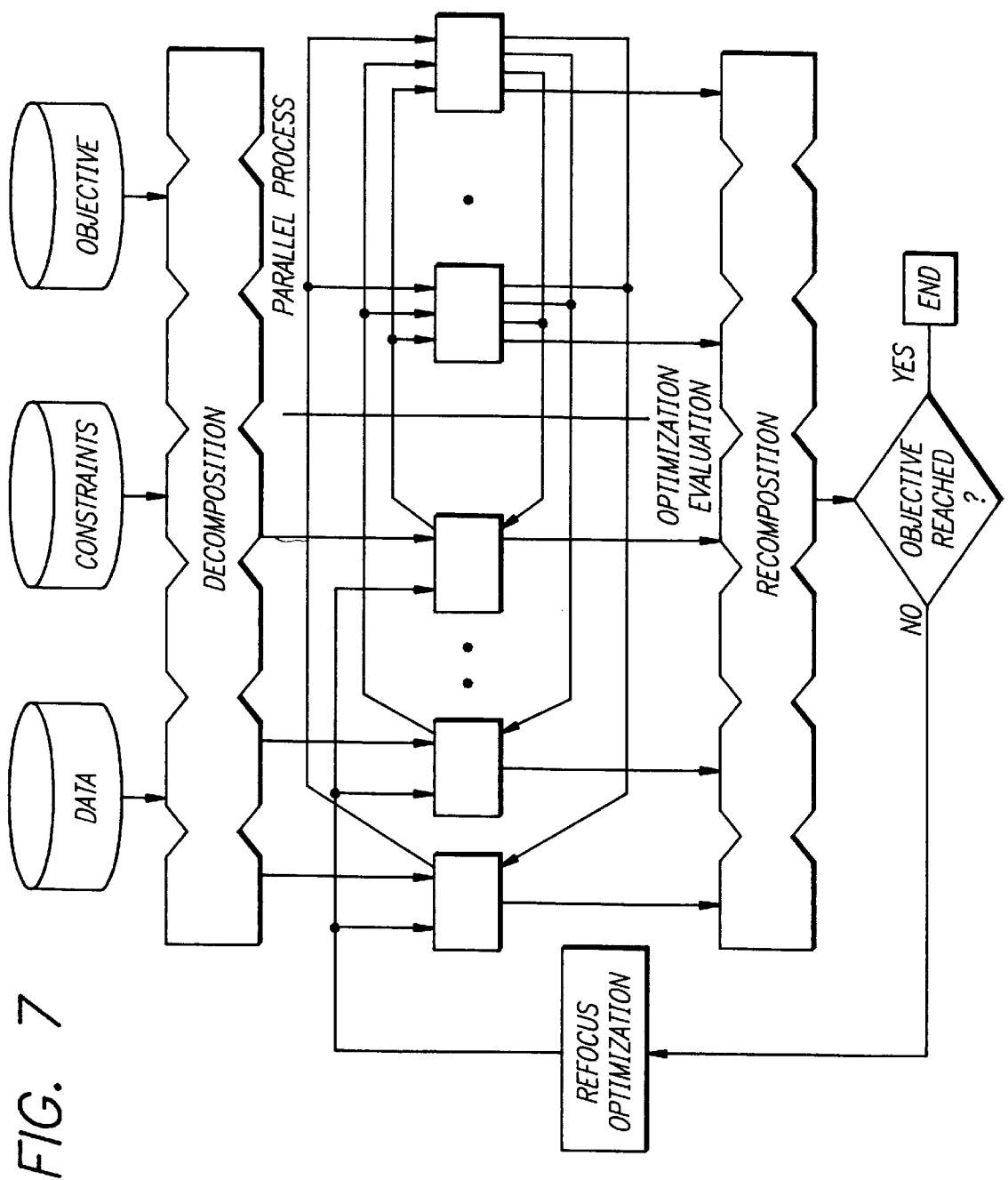
FIG. 7 is a functional diagram that further illustrates the method of FIG. 6.

The present optimization process decomposition and parallel processing method is illustrated in the form of a simplified flowchart in FIG. 6 and a functional diagram in FIG. 7, and comprises the following steps.

(a) Input the problem to be solved, including the data defining the problem, the algorithms, rules and other applicable constraints, and the objective to be achieved.

(b) Decompose the optimization processing methodology and/or data into a plurality of processes that can be performed simultaneously and/or in parallel.

(c) Perform the processes using respective parallel processors, with one or more processors coordinating the operation of other processors.

(d) Recompose the results of performing the processes to produce an optimized solution, and evaluate the solution on the basis of a predetermined criterion.

(e) Determine if the objective has been satisfied. If so, the process is completed. If not, the optimization processes are refocussed to further optimize the solution. More specifically, decomposition, optimization processing, recomposition, evaluation, and control of repeatedly performing selected optimization processes on selected areas of the problem to further optimize the solution are distributively applied using parallel processing.

Figure 8:
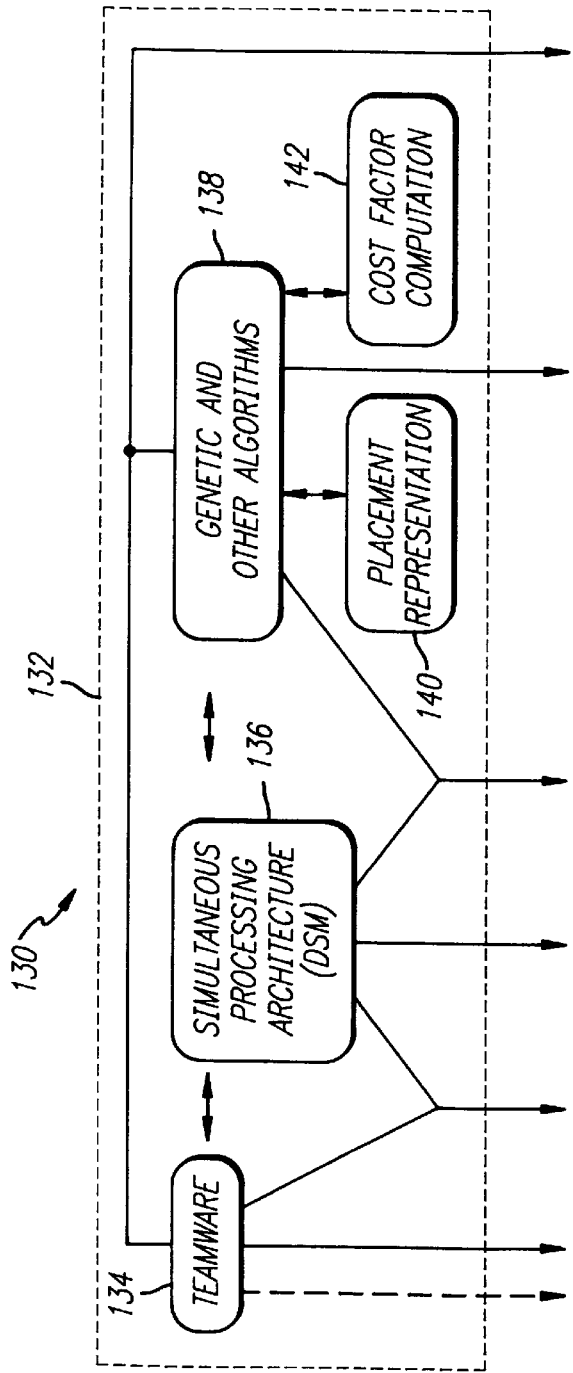
FIG. 8 is a diagram illustrating the main blocks of a multi-processing optimization system of the present invention that operates in accordance with the method of FIGS. 6 and 7.

2. Optimization Processing for Integrated Circuit (IC) Physical Design Automation FIG. 8 illustrates an integrated circuit physical design automation system 130 that constitutes a specific application of the process decomposition and parallel processing method of the present invention as described above with reference to FIGS. 6 and 7.

The system 130 receives inputs for a user specified integrated circuit design including a netlist, a library of standardized microelectronic elements or cells and functional units including combinations of cells, and a set of rules that define the objectives of the design.

The system 130 decomposes these inputs into a plurality of parallel processes that are executed simultaneously using individual processing units as will be described in detail below. In general, one or more processors coordinate the operation of other processors, which are optimized, evaluated and recombined to produce an optimal cell placement which may or may not satisfy a predetermined performance objective.

If the objective is reached, the optimal cell placement that was produced by the system 130 is used to generate masks for fabrication of the desired integrated circuit chip. If not, the initially produced optimal cell placement is fed back to the parallel processors which refocus the optimization function for improving the placement.

The integrated circuit physical design automation system 130 comprises a global operating system 132 that generally controls and coordinates the operation of headware 134 and simultaneous processing architecture 136.

The architecture 136 includes a plurality of parallel processors and a memory structure for simultaneously executing a plurality of genetic and other algorithms 138 for comparing the relative fitnesses of a large number of possible cell placements and determining the placement that has the highest fitness. Implementation of the algorithms 138 is facilitated by a unique cell placement representation 140 and cost function or factor computation 142. These elements will be described in detail below.

The architecture 136 can be of any type that enables parallel processing in accordance with the method of the invention. A DSM arrangement such as described above with reference to FIG. 5 is especially suitable for practicing the invention since the results produced by the processors can be recomposed using shared memory.

Figure 5:
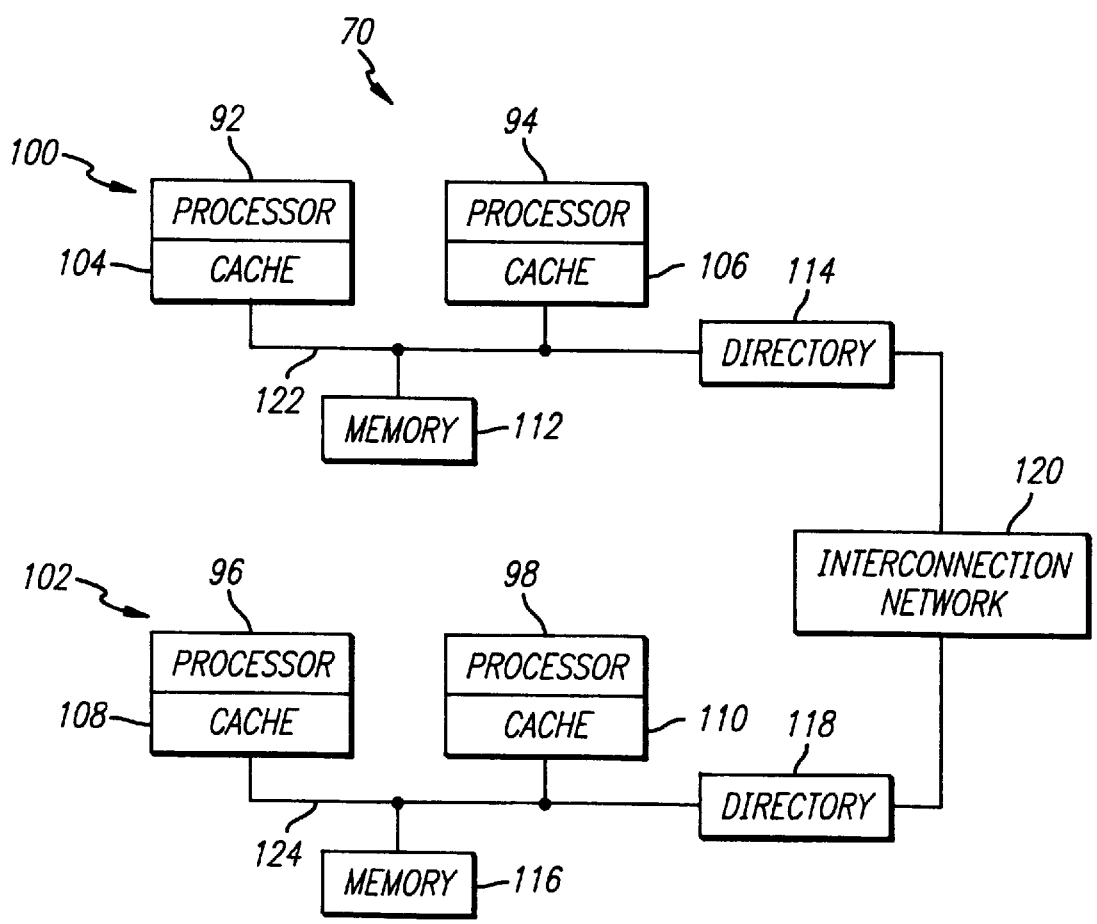
FIG. 5 is a diagram illustrating a Distributed Shared Memory (DSM) parallel processing architecture of the present invention.
Figure 9:
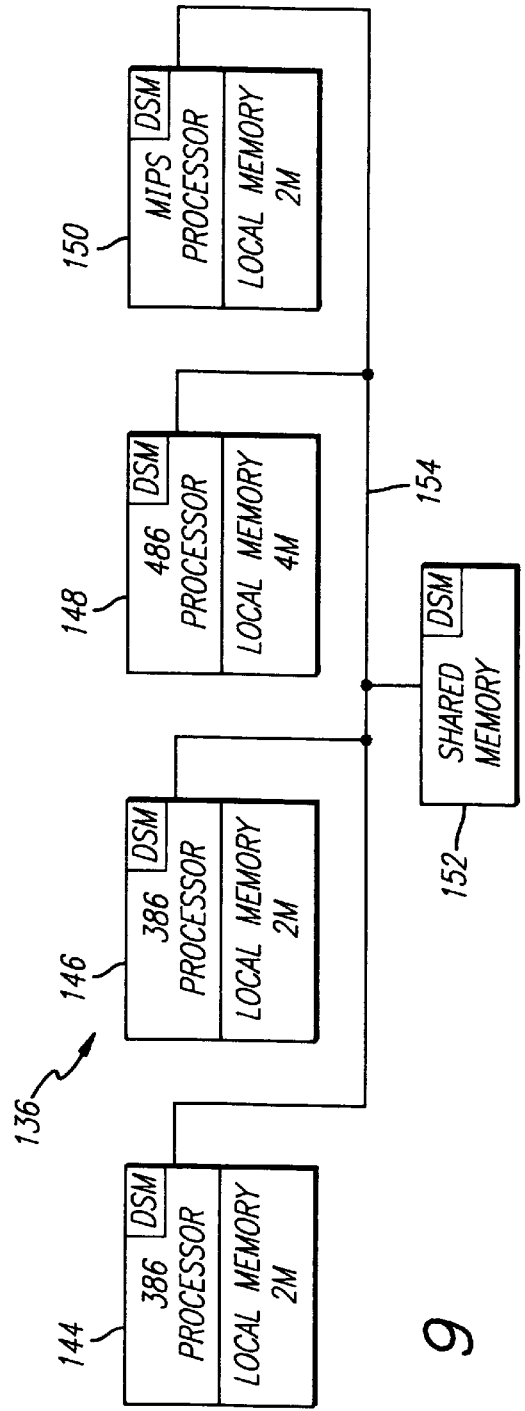
FIG. 9 is a block diagram illustrating a DSM architecture including different types of processors for practicing the invention.

The processors can be identical as illustrated in FIG. 5, or they can be different. The architecture 130 as illustrated in FIG. 9 comprises a plurality of parallel processing nodes 144, 146, 148 and 150 and a shared memory 152, each of which includes a directory based cache coherency unit as described above with reference to FIG. 5. The nodes 144, 146, 148 and 150 each comprise a processor and a local memory, and have access to the shared memory 152 and the memories of all of the nodes via their cache coherency units and a bus 154.

Each processor 144, 146, 148 and 150 is selected as having unique characteristics and excelling at different kinds of tasks. One processor, for example, can operate at very high speed but be relatively inefficient at handling a variety of input/output protocols, whereas another processor can have the opposite characteristics.

In the illustrated example, the nodes 144 and 146 each comprise a 386 microprocessor that operates at 25 MHz, and a two megabyte local memory. The node 148 comprises a 486 microprocessor that operates at 60 MHz, and a 4 megabyte local memory. The node 150 comprises a MIPS R4000 microprocessor that operates at 150 MHz, and two megabytes of local memory.

Typically, the node 148 will be utilized to control the nodes 144, 146 and 150 to perform tasks in parallel. The nodes 144 and 146 will be used for relatively simple tasks, whereas the node 150 will be used for computationally intensive tasks.

The method of FIGS. 6 and 7 can be applied in a variety of ways using the system 130. For example, a single initial placement can be generated, and different algorithms, such as genetic alteration and simulated annealing, applied to the initial placement using respective parallel processors.

The fitnesses of processed placements that result from applying the different algorithms to the initial placement are then evaluated, and the processed placement having the highest fitness is designated as the optimized placement.

The processes can also be monitored, and the processes and/or cost functions switched during processing in accordance with a predetermined criterion.

Another aspect of the present method comprises generating and processing a plurality of initial placements in parallel using a single algorithm such as simulated annealing or genetic mutation. Again, the resulting processed placements are evaluated, and the best placement is selected for further processing.

A single initial placement can also be generated and divided into areas or groups of cells, and the parallel processors used to simultaneously apply optimization algorithms to the areas or groups. The initial placement can be divided into contiguous non-overlapping areas, or into groups of cells in accordance with the netlist or other hierarchical organization. For example, parallel processors can be assigned to operate on the nets of the netlist respectively.

A moving windows feature of the invention as will be described below is a specific implementation of the present decomposition and parallel processing method. Each window delineates a subset of cells, and the subsets are assigned to respective parallel processors.

A Simultaneous Placement And Routing (SPAR) method as will be described below is another example of the present decomposition and parallel processing method. The general method can be applied to initial placement, global or detailed routing and/or to simultaneous placement and routing.

In the SPAR methodology, the areas of high cell interconnect congestion are identified, and the parallel processors are used to repeat optimization processing of the congested areas. The moving windows feature can be combined with the SPAR system to delineate the areas for reprocessing.

A chaotic fitness improvement method is another form of the present method, in which cells are relocated in parallel, and the altered placement evaluated in terms of fitness. If the fitness has not been sufficiently improved, the parallel cell relocation operations are repeated based on new congestion data.

3. Hierarchial Execution by Asynchronous Delegation (HEADWARE)

Figures 10, 11:
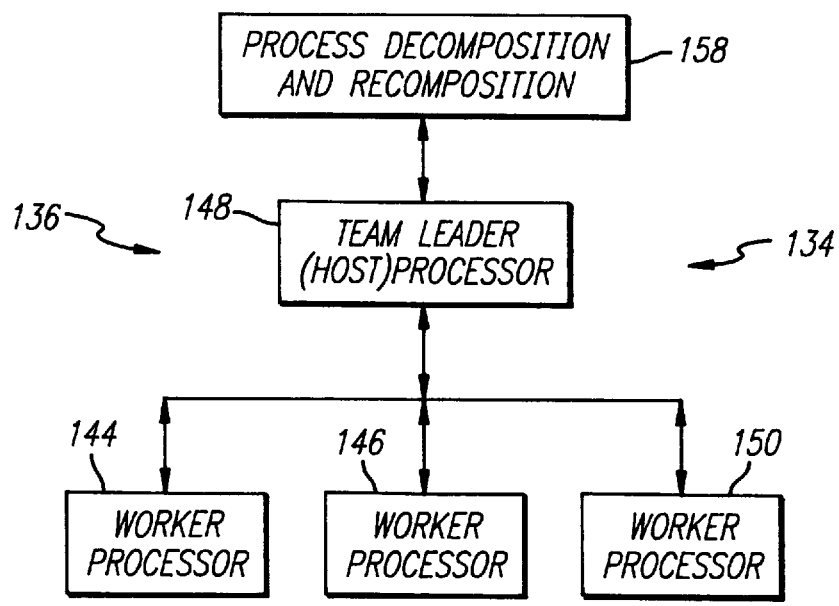
FIG. 10 is a block diagram illustrating a fail-safe distributed processing or HEADWARE method for practicing the present invention.
FIG. 11 is a diagram illustrating a list of tasks in the process of being performed using the method of FIG. 10.
Figure 12:
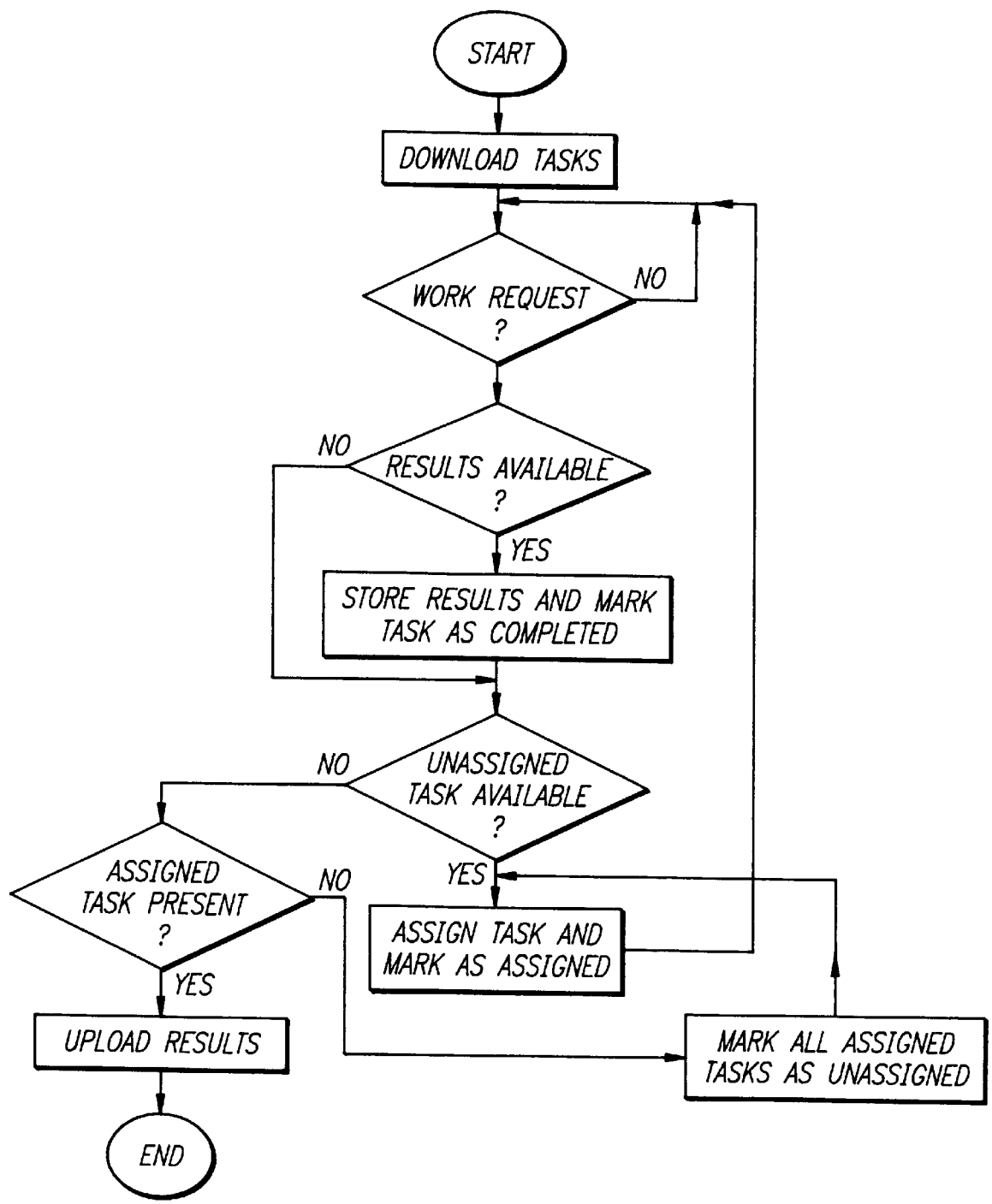
FIG. 12 is a flowchart illustrating the distributed processing method of FIGS. 10 and 11.

FIGS. 10 to 12 illustrate a "HEADWARE" method of distributed processing, including a fail-safe mechanism that makes the system immune to the failure of individual processors.

Prior art distributed processing schemes suffer from drawbacks including difficulty in varying the number of processors, failure or crashes of individual processors, and optimal processor utilization in various diversified applications.

The present method is applicable to a large class of problems, in addition to utilization in the present physical design automation system 130, in which the computation can be divided into a large number of weakly coupled tasks each taking a minute or more to calculate and whose results can be reported in a relatively short message. Examples include design analysis, global routing, detailed routing, test sequence generation, etc.

In general, a master or host process, which can be referred to as a team leader in the headware concept, is first started. The team leader assigns tasks to worker processes and collects results. The present method uses very little computer time and can service a large number of worker processes.

When a worker process is started, it sends a message to the team leader requesting a task. The team leader then replies with a message assigning a task and marks the task as having been assigned. Communication between the team leader and the worker then ceases, leaving the team leader free to communicate with other workers.

In accordance with the present invention, it is not necessary for the team leader to record which worker was assigned a particular task, or when the task was assigned. An arbitrary number of workers can request tasks in this manner, with the team leader assigning each worker a previously unassigned task.

When a worker completes a task, it resumes communication with the team leader and identifies the task that it was assigned, and the results that were obtained from performing the task. The team leader then records the results, marks the task as having been completed and assigns the worker another task. The team leader further preferably saves a copy of the task list on a computer disk or the like at periodic intervals as a precaution against failure of the team leader process.

Eventually, a worker requests a task, and all tasks are either marked as assigned or completed. If all tasks are completed, the optimization process is finished and, in the case of the present physical design automation system 130, the results are recomposed to produce the optimal cell placement. If there are tasks that are marked as being assigned but not completed, the possibility exists that one or more of the workers to whom the tasks were assigned had a processor failure, crashed or was shut down to free the processor for other uses.

When such an event occurs, all assigned but uncompleted tasks are redesignated as unassigned, and are reassigned to other workers as they become available. This reassignment ensures that all tasks are eventually completed regardless of processor failures. The present method of distributed processing allows efficient use of a variable number of processors that can be added or removed as they become available.

As illustrated in FIG. 10, the simultaneous processing architecture 136 includes a plurality of processors such as described above with reference to FIG. 9. In the exemplary implementation illustrated in the drawing, the processor 148 acts as a team leader or host processor, whereas the processors 144, 146 and 150 act as worker processors.

A process decomposition and recomposition unit 158 decomposes an optimization process that is to be performed to produce an optimal cell placement from a population of initial cell placements into tasks that can be performed independently. The optimization processes that can be decomposed and performed using the present distributed processing method of the invention are not limited to any particular categorization, and can include simulated evolution, annealing or mutation, constructive placement, force directed placement, or any other type of process that can be decomposed into parallel tasks. The present method can also be applied to performing two or more complete optimization processes in parallel using respective processors.

As illustrated in the flowchart of FIG. 12, the unit 158 decomposes the optimization process to be performed into tasks, which are downloaded by the team leader processor 148. The control process that is performed by the processor 148 is then initiated, as well as worker processes that are performed by the worker processors 144, 146 and 150.

Upon initialization, the team leader processor 148 goes into a loop in which it looks for a work request from the worker processors 144, 146 and 150. Upon initialization, the worker processors 144, 146 and 150 send work requests to the team leader processor 148. Although not illustrated in detail, the architecture 136 includes an arbitration mechanism that ensures that the team leader processor 148 will communicate with only one worker processor 144, 146 and 150 at any one time, and that collisions between incoming work requests are prevented.

The team leader processor 148 stores a task list 160 as illustrated in FIG. 11 in an appropriate location in memory. The task list 160 includes an entry for each task that was downloaded from the unit 158, including an identifier of the task (TASK 1, TASK 2 . . . TASK N), and a code that indicates the status of the task. For example, code 0 indicates that the respective task is unassigned, code 1 indicates that the task has been assigned but not completed, and code 2 indicates that the task has been completed.

Upon receipt of a work request, the team leader processor 148 assigns the next unassigned task in the list 160 to the worker processor 144, 146 or 150 that generated the respective work request. The assigned worker processor 144, 146 or 150 then terminates communication with the team leader processor 148 and begins to perform the assigned task. The team leader processor 148 does not make any further attempt to communicate with the assigned worker processor 144, 146 or 150 until it receives a subsequent work request therefrom.

After completing an assigned task, each worker processor 144, 146 and 150 sends a work request to the team leader processor 148 requesting a new task, together with the results of the task just completed. If the work request is accompanied by a result, the team leader processor 148 stores the result, and assigns the next unassigned task to the requesting worker processor 144, 146 or 150.

The team leader processor 148 also marks or redesignates the task that was just completed in the list 160 as completed, and redesignates the task that was just assigned as being assigned. If the work request is not accompanied by a result, as occurs upon process initialization, the team leader processor 148 assigns the next unassigned task to the requesting worker processor 144, 146 or 150, and redesignates the task as being assigned.

The team leader processor 148 also tests to determine if any tasks remain unassigned. If so, the unassigned tasks are assigned to the worker processors 144, 146 and 150 in response to work requests therefrom. If not, the team leader processor 148 tests to determine if any tasks remain unassigned.

If no unassigned tasks are present, then all tasks must have been completed. When this occurs, the results are uploaded to the unit 158 for recomposition and generation of the optimal cell placement, and the distributed processing operation is terminated.

If no unassigned tasks are present and one or more assigned tasks remain present, there is an indication that the worker processors 144, 146 and 150 that were assigned the remaining assigned tasks have failed, crashed or were appropriated for another use. However, this does not adversely affect the operation of the architecture 136. When such a condition is detected, the team leader processor 148 merely marks or redesignates the assigned tasks as being unassigned. The newly unassigned tasks are then assigned to requesting worker processors 144, 146 and 150 in the manner described above. The process terminates when the team leader processor 148 determines that the list 160 does not include any unassigned or assigned tasks, but only completed tasks.

The criterion for redesignating assigned tasks as being unassigned in the process as illustrated in FIG. 12 is that the list 160 does not include any unassigned tasks, but includes at least one assigned task. However, the invention is not so limited, and other criterion can be utilized for causing the team leader processor 148 to redesignate assigned tasks as unassigned tasks and therefore compensate for a failure of one or more of the worker processors 144, 146 and 150. For example, this operation can be performed if a predetermined length of time has elapsed after initialization of the process, or if a predetermined length of time has elapsed after assigned tasks have been previously redesignated as unassigned tasks.

The global operating system 132 and the headware 134 are programs that run on the processors 144, 146, 148 and 150. The headware 134 is designed to decompose the cell placement problem into individual tasks that can be run simultaneously in parallel on the processors 144, 146, 148 and 150. For example, the genetic algorithm can be run on a plurality of placements using respective processors, and the results subsequently compared. The migration operation can be utilized in this arrangement as disclosed in the above referenced article to Mohan.

The processors 144, 146, 148 and 150 are selectively utilized to perform the required operations and suboperations for physical design automation. For example, a particular processor can be used at different times under software control to function as a bounder for computing bounding boxes for cost factor computation, a selector for selecting cells for mutation, a transposition processor for performing cell swaps, or might perform all of these operations for one of the placements being evaluated.

4. Integrated Circuit Cell Placement Representation

Figure 2:
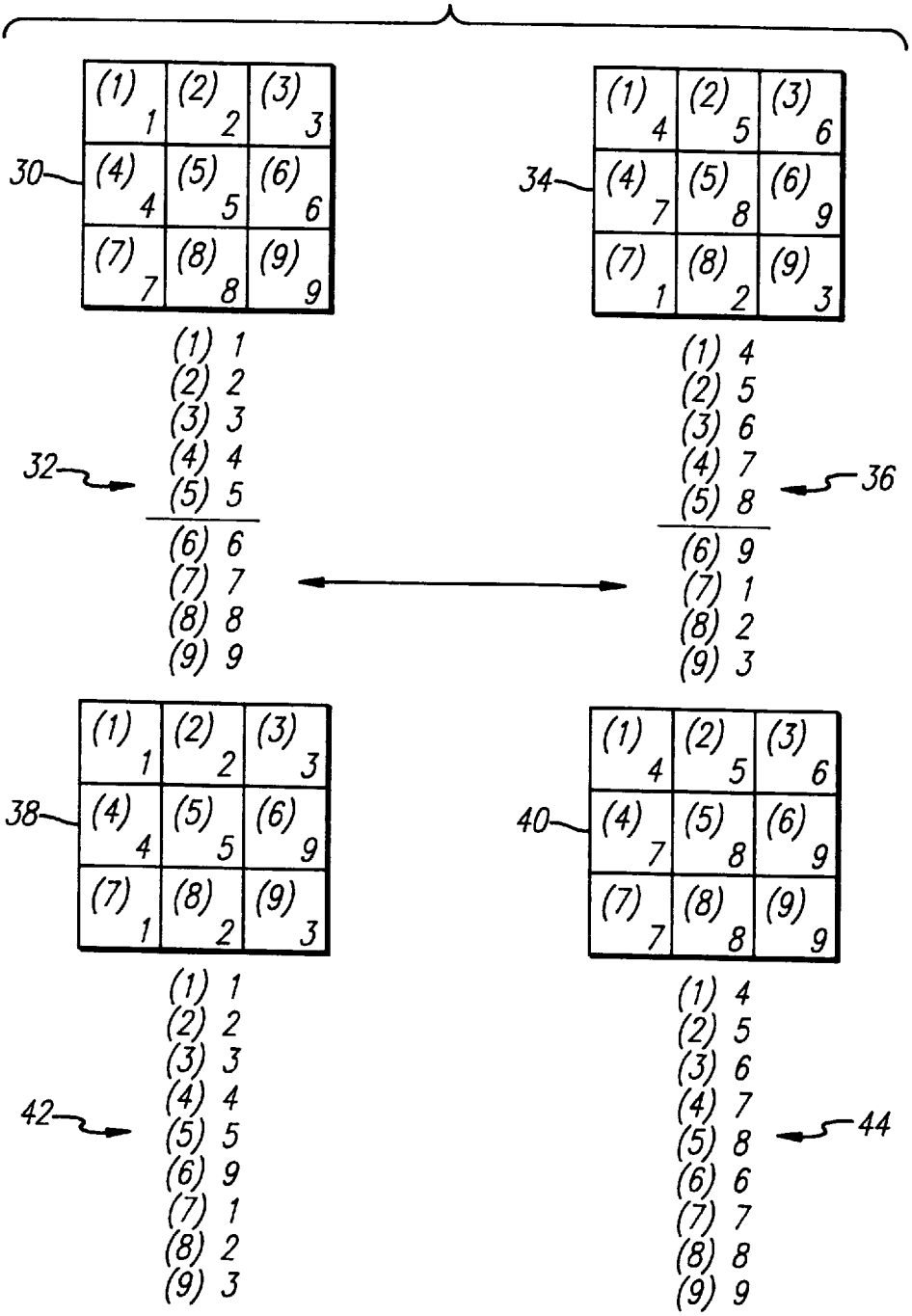
FIG. 2 is a diagram illustrating a basic genetic crossover operation and the drawbacks thereof.

The problems described above with reference to FIG. 2 are solved in accordance with the present invention, enabling genetic crossover as well as all other genetic transposition or swapping operations to be performed without modification. This goal is accomplished by, for example, utilizing the unique integrated circuit cell placement representation 140 as illustrated in FIG. 8.

Although the present placement representation and transposition method is especially suited to the integrated circuit cell placement optimization problem, it is not so limited, and can generally be applied to any application for representing permutations of any types of entities.

In accordance with the present invention, a cell placement or other permutation of entities is not necessarily represented by a list of locations and corresponding cells as in the prior art, but is preferably represented by an initial placement or permutation and a list of transpositions or "swaps" by which the representation can be derived from the initial representation.

Figure 13:
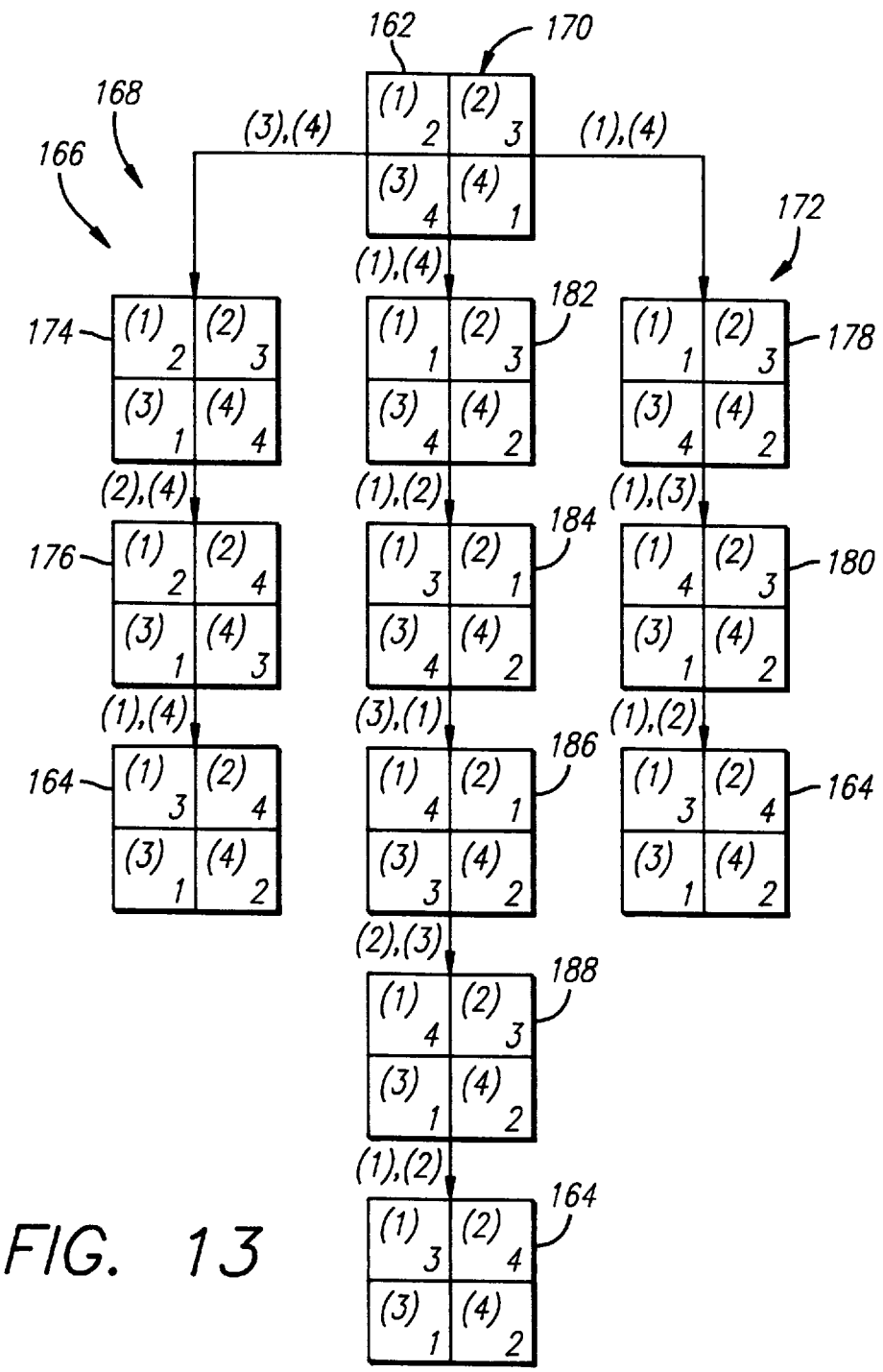
FIG. 13 is a diagram illustrating a location/location swap operation utilizing a cell placement and transposition system of the present invention.

As illustrated in FIG. 13, an initial placement or permutation 162 includes four cell identifiers 2, 3, 4 and 1 assigned to locations (1) to (4) respectively. The initial placement 162 can be represented by the list (1)2,(2)3,(3)4,(4)1, in which the numbers in parenthesis represent locations and the bare numbers represent cell identifiers.

In an actual integrated circuit chip application, there will typically be more cell locations than cells. In this case, a number of dummy or "idle" cells are added to increase the number of cells to be equal to the number of locations. For the purpose of explaining the principles of the invention, it will be assumed that the numbers of locations and cells are equal.

The reference numeral 164 designates a placement which is derived from the placement 162 by a plurality of cell transpositions or swaps. The swaps by which the placement 164 can be derived from the placement 162 are not limited to one factorization or set. In the illustrated example, the placement 164 is derived from the placement 162 using three sets of swaps.

The arrangement of FIG. 13 can be considered as a tree 166, with each placement representing a node and each swap representing an edge that connects two adjacent node. The tree 166 has three branches 168, 170 and 172, representing three sets or lists of swaps by which the placement 164 can be derived from the placement 162.

The left branch 168 and the right branch 172 each consist of the required minimum number (N−1) of swaps, in this 4−1=3, to represent the placement 164. The center branch 170 consists of five swaps, which is more than the minimum required number.

More specifically, the placement 164 as represented by the branch 168 consists of the initial placement (1),2;(2),3;(3),4;(4),1 and a list of transpositions or swaps consisting of the elements (3),(4);(2),(4);(1),(4). These swaps are location/location swaps. For example, the swap (3),(4) means that the cells in locations (3) and (4) are transposed or swapped. This swap produces an intermediate placement 174 as illustrated in FIG. 13, in which the cells 4 and 1 that are in locations (3) and (4) in the placement 162 are swapped such that they are in locations (4) and (3) respectively in the placement 174.

The swap (2),(4) applied to the placement 174 results in swapping of the cells 3 and 4 to produce an intermediate placement 176, whereas the swap (1),(4) applied to the placement 176 results in swapping of the cells 2 and 3 to produce the final placement 164.

Each swap results in the transposition of two cells. No cells are ever lost or duplicated, but merely moved around. This one-to-one relationship between swaps and cells accomplishes a goal of the present invention, in that it enables all genetic operations, including crossover, to be performed in their basic form with no possibility of generating illegal placements.

The placement 164 as represented by the branch 172 consists of the initial placement (1),2;(2),3;(3),4;(4)1 and a list of swaps consisting of (1),(4);(1),(3);(1)(2) which result in intermediate placements 178 and 180 and the placement 164 respectively. The placement 164 as represented by the branch 170 consists of the initial placement (1),2;(2),3;(3),4;(4)1 and a list of swaps consisting of (1),(4);(1),(2);(3);(1);(2),(3);(1),(2) which result in intermediate placements 182, 184, 186 and 188 and the placement 164 respectively.

In general, for each set of N locations, there exists a total of N! (N factorial) placements or permutations of the cells. In the exemplary case of four locations, a total of 4!=24 placements are possible. However, it can be proven mathematically that for each set of N locations, each possible cell placement can be represented by the initial placement and a maximum of N−1 swaps.

It is within the scope of the invention to represent each placement by the initial placement and a fixed number of swaps between N−1 and CN (where C is a selected integer), or by the initial placement and a variable number of swaps. In the former case, it is possible and probable for many of the swaps in the list to be zero or null. The maximum number of swaps which are actually required to derive a particular placement can be zero (the initial placement) or any number from 1 to N−1. In addition, there will be an odd or even number of swaps or parity for each placement which can be used for error checking purposes.

In the example of FIG. 13, the swaps were specified in location/location format. It is further within the scope of the invention to specify swaps in the form of cell/cell, location/cell and cell/location. All of these formats are supported by maintaining a table or list of cell locations and the cell identifiers corresponding to the respective cell locations in an electronic memory. Thus, if a cell is specified for a swap, the location in which the cell is assigned can be readily determined. The format of this table is simply a list of locations and cells. For example, a table for the placement 164 would consist of the entries (1),3;(2),4;(3),1;(4),2.

FIG. 14 illustrates a series of cell/cell swaps which derive a placement 190 from an initial placement 192. The first illustrated swap is 3,4. Since cell 3 is initially in location (2) and cell (4) is initially in location (3), the cell/cell swap 3,4 is equivalent to a (2),(3) location/location swap, and produces an intermediate placement 194. The next swap is 2,4, which is equivalent to a (1),(2) location/location swap, and produces an intermediate placement 196. The last swap is 1,4, and produces the placement 190.

It will be noted that the initial placement 192 in FIG. 14 is the same as the initial placement 162 in FIG. 13, and that the numerical values of the swaps in FIG. 14 are the same as the numerical values of the swaps in the left branch 168 in FIG. 13. However, the placements 164 and 190 that are produced by these swaps are different.

An example of a location/cell swap is illustrated in FIG. 15, and utilizes an initial placement 198 that is the same as in the examples of FIGS. 13 and 14, and the same numerical values for the swaps. The first swap is (3),4, which indicates that whatever cell is in location (3) should be swapped with cell 4. However, in this example, cell 4 is already in location (3). Thus, the first swap produces an intermediate placement 200 that is the same as the initial placement 198.

The next swap is (2),4, which indicates that whatever cell is in location (2) should be swapped with cell 4. In this case, cell 3 is in location 4, and is swapped with cell 4 that is in location (2). The (2),4 location/cell swap is equivalent to a (2),(3) location/location swap, and produces an intermediate placement 202. The last swap is (1),4, and produces a placement 204 that is different from the placements 164 and 190 of FIGS. 13 and 14 respectively.

FIG. 16 illustrates an example of a cell/location swap sequence, using the same initial placement, here designated as 206, and numerical swap values as in the previous examples. The first swap is 3,(4), which indicates that cell 3 should be swapped for whatever cell is in location (4). Since cell 3 is in location 2, the 3,(4) cell/location swap is equivalent to a (2),(4) location/location swap, and produces an intermediate placement 208. A 2,(4) swap produces an intermediate placement 210 in the same manner, whereas a 1,(4) swap produces a placement 212. It will be noted that the placement 212 is different from the results of the previous examples. An application of cell/location swap is presented in FIGS. 34a and 34b.

Since the four types of swaps produce different results, it is possible that switching from one type of swap to another could increase the convergence rate in a particular cell placement application. It is therefore desirable to provide a convenient mechanism by which the desired type of swap can be designated and executed. An example of such a system is presented in the following table.

TABLE

| OPERATOR | OPERATION | OPERAND 1 | OPERAND 2 |
|---|---|---|---|
| 1 | Location/Location Swap | Loc 1 | Loc 2 |
| 2 | Cell/Cell Swap | Cell 1 | Cell 2 |
| 3 | Location/Cell Swap | Loc 1 | Cell 1 |
| 4 | Cell/Location Swap | Cell 1 | Loc 2 |
| 5 | Row Swap | Row 1 | Row 2 |
| 6 | Column Swap | Col 1 | Col 2 |
| 7 | Roll Up | Start Row | End Row |
| 8 | Roll Down | Start Row | End Row |
| 9 | Roll Right | Start Col | End Col |
| 10 | Roll Left | Start Col | End Col |
| 11 | Move Block | Start Loc | End Loc |
| 12 | Rotate Block CW | Start Loc | |
| 13 | Rotate Block CCW | Start Loc | |
| 14 | Invert | Start Loc | End Loc |

Each swap operation can be designated by an operator and one or two operands. The operator for a location/location swap is 1. To specify the location/location swap (3),(4), a command to the processor would be 1,3,4, in which the operands are 3 and 4. Although the operands are not enclosed in parenthesis, the system knows that they are to be considered as locations rather than cells because the operator designates a location/location swap.

In an essentially similar manner, a 3,4 cell/cell swap would be designated as 2,3,4, a (3),4 location/cell swap would be designated as 3,3,4 and a 3, (4) cell/location swap would be designated as 4,3,4.

The single cell swaps may be used in genetic mutation operations such as simulated annealing. However, the present representation and transposition method is not so limited, and can be advantageously utilized to perform swaps of entities consisting of two or more cells.

Figures 17, 18:
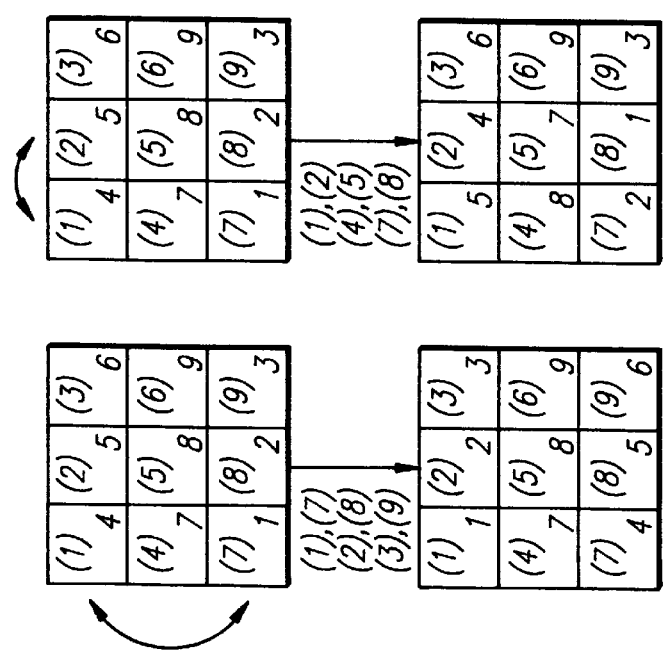
FIG. 17 is a diagram illustrating a row swap operation.
FIG. 18 is a diagram illustrating a column swap operation.

FIG. 17 illustrates how rows 1 and 3 can be transposed or swapped in response to the command 5,1,3, where 5 is the operand for a row swap, and 1 and 3 are the operands indicating the rows to be swapped. The row swap is executed as a series of (1),(7);(2),(8);(3),(9) location/location swaps. However, it will be understood that the operation could alternatively be performed using cell/cell swaps, location/cell swaps, cell/location swaps or a combination thereof.

FIG. 18 illustrates how columns 1 and 2 can be swapped in response to a command 6,1,2, where 6 is the operator for a column swap, and 1 and 2 are the operators indicating the columns to be swapped. The operation is performed using the location/location swaps (1),(2);(4),(5);(7),(8).

Figure 19:
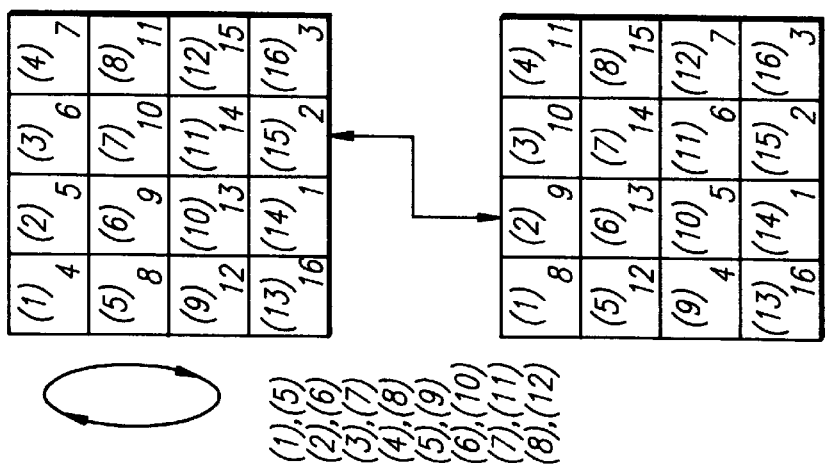
FIG. 19 is a diagram illustrating a roll up operation.

Another exemplary transposition operation is illustrated in FIG. 19, and consists of rolling rows 1 to 3 upwardly such that the original row 1 is wrapped down around to row 3. The command is 7,1,3, where 7 is the operator for roll up, 1 is the upper or start row and 3 is the lower or end row. The individual swaps are listed in the drawing. A roll down operation, which is not illustrated, is executed in an essentially similar manner in response to the operator 8.

Figure 20:
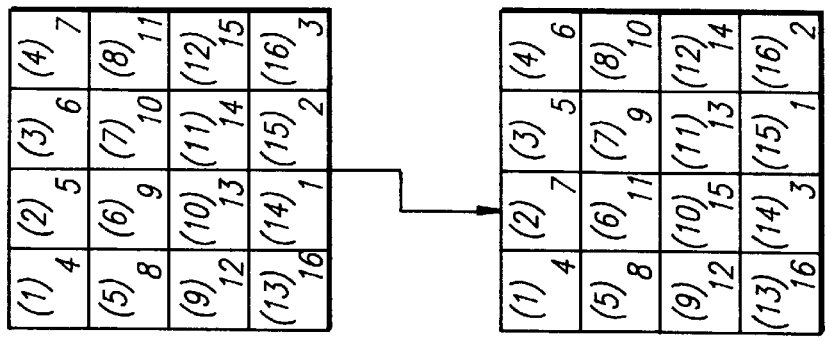
FIG. 20 is a diagram illustrating a roll right operation.

FIG. 20 illustrates a roll right operation which is similar to the roll up operation, except that it is performed on columns rather than rows. The illustrated operation is performed in response to a command 9,2,4, where 9 is the operator for roll right, 2 is the start column and 4 is the end column. The individual swaps are listed in the drawing. A roll left operation which is executed in response to the operator 10 is essentially similar.

In addition to storing cell locations and the corresponding cell identifiers, block identifiers or tags can be stored in memory. Each cell of a contiguous block of cells which is to be considered as a unit is given a block identifier. Each time a cell is designated as an operand in a transposition command, the block identifiers are checked to determine if the command designates all cells in the block to be transposed together. If not, the command is rejected or modified.

This enables cell blocks that constitute integral logic elements to be transposed around the placement, but prevents the block from being broken up. It is further within the scope of the invention to designate whether or not the orientation of a particular block is critical. If not, the blocks can be rotated, inverted or subjected to other operations that can vary their orientation. If the orientation is critical, the blocks can be transposed but prevented from having their orientation changed.

The present cell representation system is not limited to a two dimensional representation of chip placements. For example, in a multilevel integrated chip, the present system can be extended to represent three dimensional representations. The present invention is, in fact, unlimited in the number of dimensions that can be represented.

Figures 21, 22, 23:
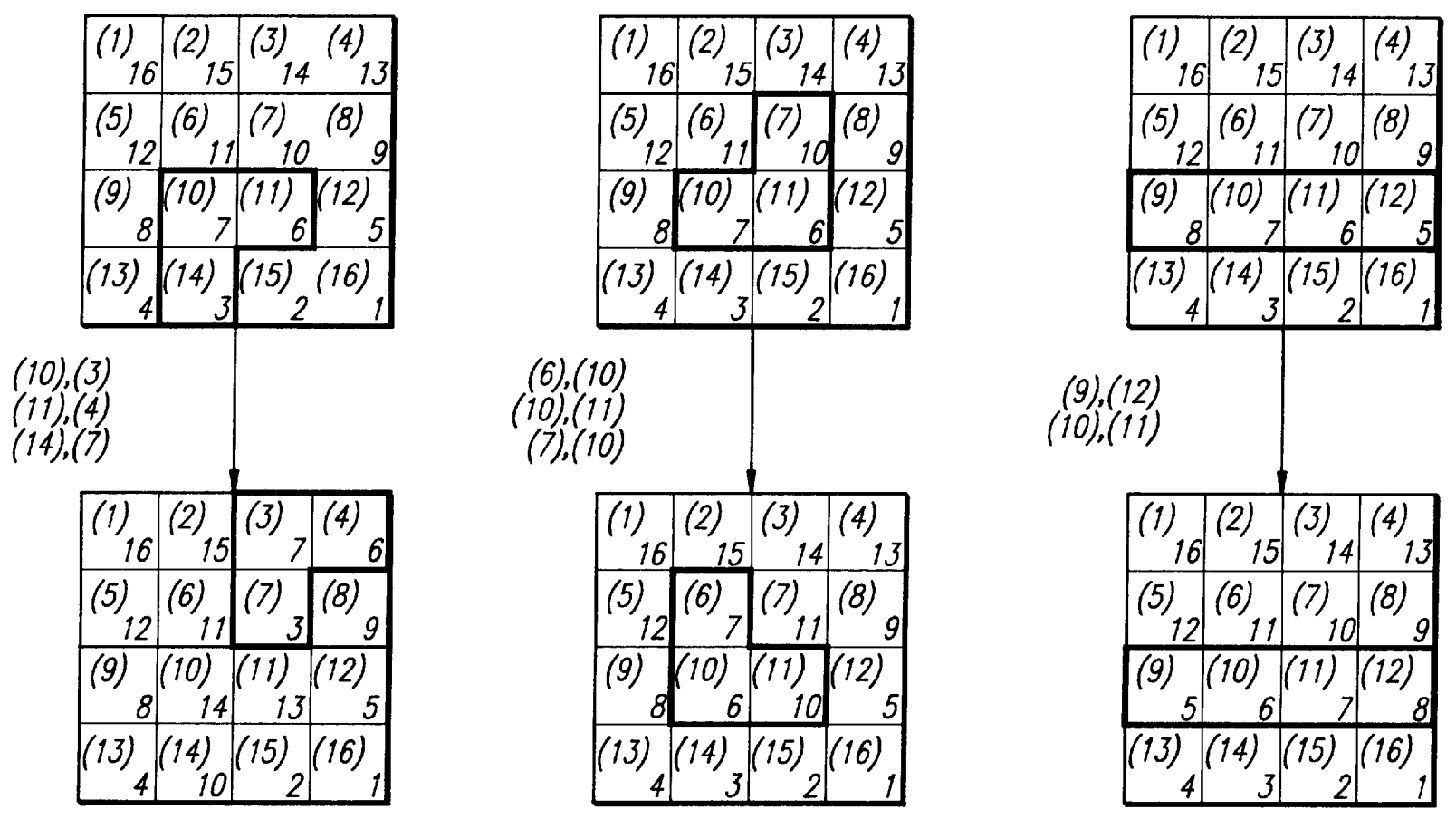

FIG. 21 illustrates a move block operation, in which an irregular or L-shaped block consisting of cells 7,6,3 is moved without change in orientation. The command is 11,10,3, in which 11 is the operator for move block, 10 is the start location of the cell in the first location of the block and 3 is the end location for the cell in the first location of the block. It will be noted that the cells 14,13,10 which were originally in the new location of the block 7,6,3 are transposed to the original locations of the block.

FIG. 22 illustrates how a block can be rotated clockwise in response to a command 12,6, in which 12 is the operator for rotate block clockwise and 6 is the location of the cell in the first location of the block. A rotate block counterclockwise, similar to the rotate block clockwise shown in FIG. 22, is performed in response to the operator 13.

FIG. 23 illustrates an invert operation which is executed in response to the command 14,9,12, in which 14 is the operator for invert, 9 is the location of the first cell in the series to be inverted, and 12 is the last cell in the series. It will be noted that if the number of cells to be inverted is odd, the cell in the middle will be unchanged. Other types and forms of operands, especially with more than two dimensions, can be used and are considered and conceived as part of the present invention.

Since certain operations produce faster convergence depending on a particular application, it is desirable to know not only the results of a particular operation, but the manner in which the operation was performed. For example, cell/location swaps may produce faster convergence than location/location swaps, in certain types of problems, even though the same placements can be generated by each type of swap. This enables an evaluation of the relative effectiveness of each operation in a particular environment, and utilization of the type of operations, or combination of operations, which produces the best results.

It is therefore desirable to provide a history list of the operations, as well as the results of the operations. The list can be generated automatically as the operations are performed by simply storing the commands. For example, a history list for the operations of FIGS. 14 to 19 would consist of the entries 5,1,3;6,1,2;7,1,3;9,2,4;11,10,3;12,6 as described above.

FIG. 24 illustrates a genetic crossover operation that can be performed without modification using the cell placement and transposition method of the present invention, thereby accomplishing the goals described above. The exemplary operation illustrated in the drawing begins with providing a first parent placement 214 that is represented by an initial placement 216 that consists of (1)2;(2)3;(3)4;(4)1 and a swap list (3),(4);(2),(4);(1),(4). A second parent placement 218 is represented by an initial placement 220 that consists of (1)3;(2)2;(3)1;(4)4 and a swap list (1),(3);(1),(2);(2),(4).

It is desired to perform a crossover operation by which the first swap (3),(4) in the swap list of the first parent placement 214 is transposed or swapped with the third swap in the swap list of the second parent placement 218.

This produces a first child placement 222 that is represented by the initial placement 216 and a swap list (2),(4);(2),(4);(1),(4). It will be noted that the first and second swaps in the swap list are identical, with the second swap reversing the first swap. However, it is important to understand that although the swaps were duplicated, no cells were duplicated or omitted.

The crossover operation further produces a second child placement 224 that is represented by the initial placement 220 and a swap list (1),(3);(1),(2);(3),(4).

In summary, the present cell placement representation as designated at 140 in FIG. 8 enables any type of genetic alteration or operation, including genetic crossover, to be performed on one or more cell placements, with no cells being duplicated or omitted, and all resulting placements being legal.

5. Congestion Based Cost Function Computation

The fitness of a particular placement is evaluated in accordance with the present invention using the unique cost factor computation as designated at 142 in FIG. 8 based on the interconnect congestion of the placement, which provides a much more accurate evaluation than the conventional methods of total interconnect wire length and maximum interconnect path length. Although congestion can be measured accurately by performing at least a global routing after placement, this is extremely time consuming, and impractical where a very large number of placements must be evaluated. It will be recalled that cost can be considered as the inverse of fitness.

The present method is based on the novel realization that the interconnect congestion in a placement is directly related to the amount of overlap of bounding boxes that can be defined for the individual nets of the placement.

Figure 25:
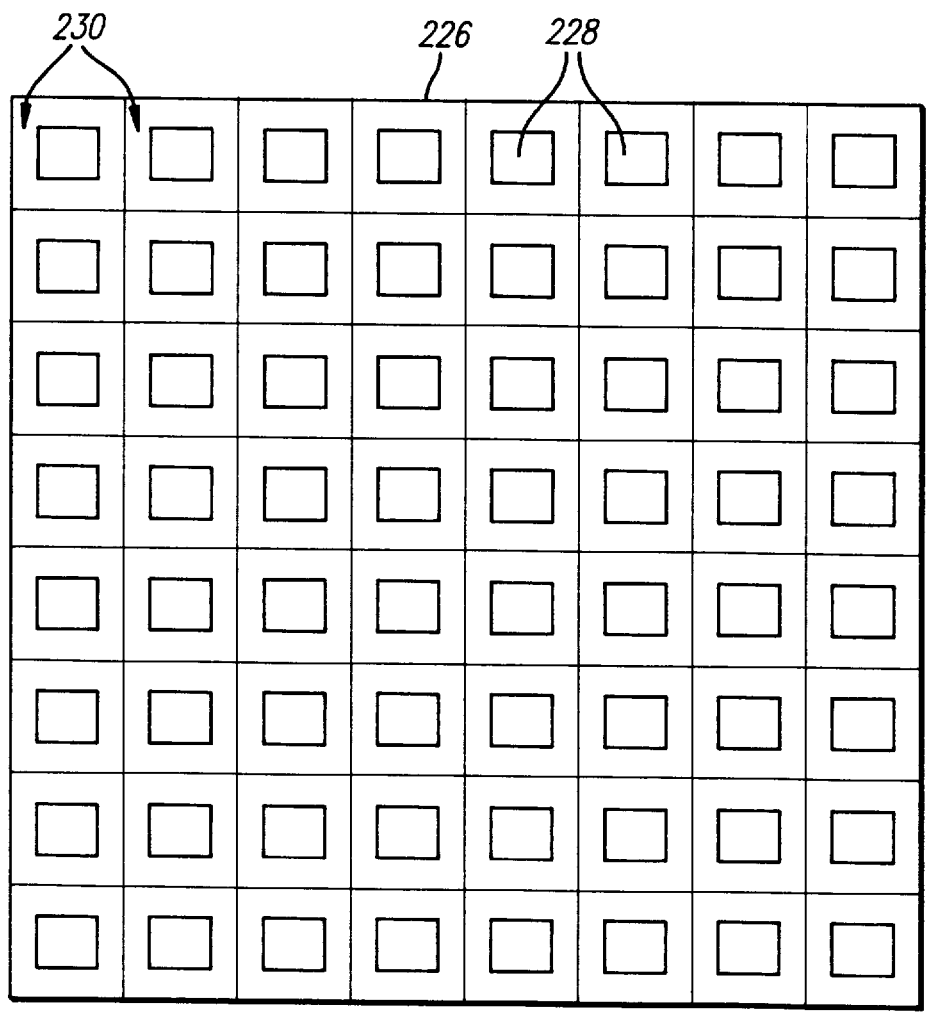
FIGS. 25 to 28 are diagrams illustrating a congestion based cost factor estimation method of the present invention.

As illustrated in FIG. 25, a placement 226 of cells 228 is divided into "tiles" or "switch boxes" 230 that surround the cells 228 respectively. Bounding boxes are then defined around the respective nets specified by the netlist for the placement 226 with a detour factor δ provided around the perimeter in the manner described above with reference to FIGS. 3 and 4.

Figure 26:
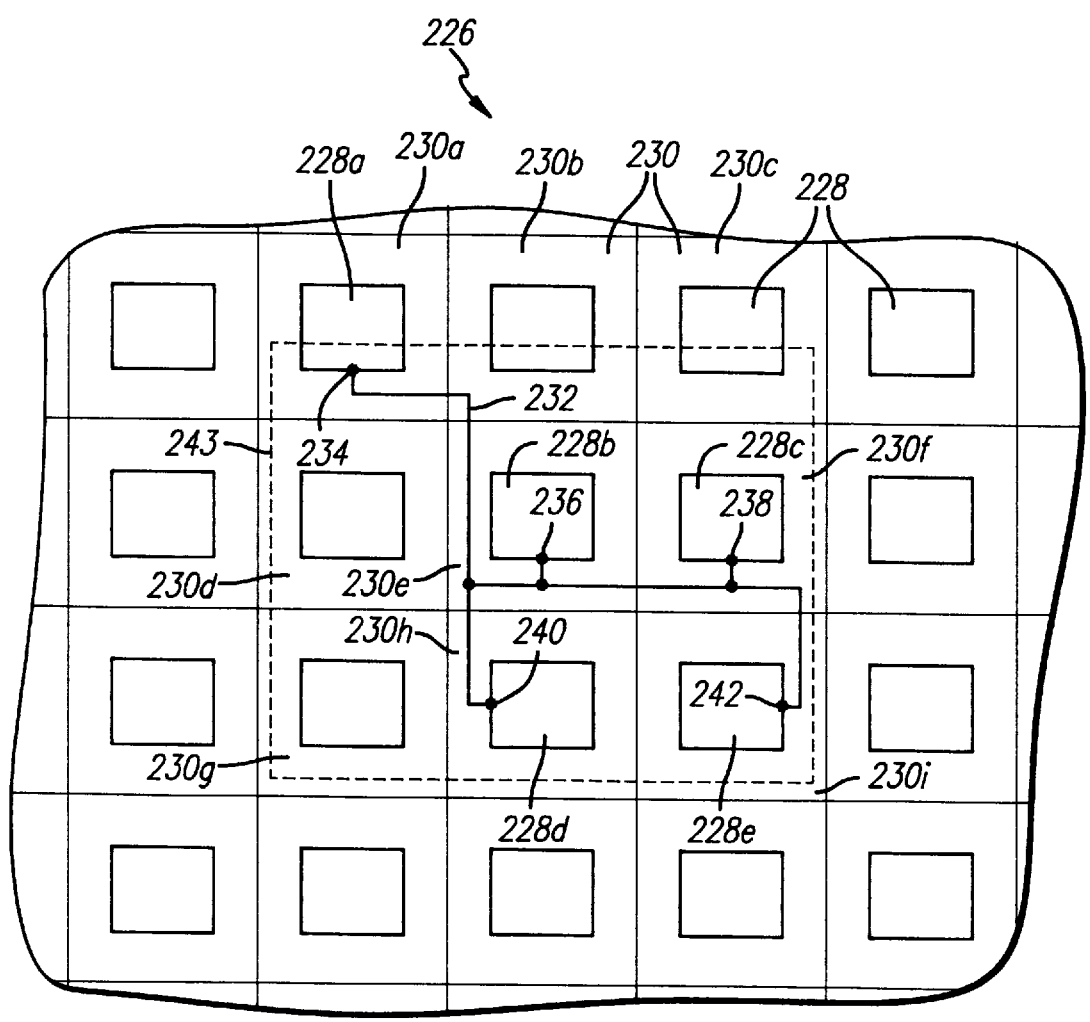

In the example of FIG. 26, a net 232 interconnects terminals 234, 236, 238, 240 and 242 of cells 228a, 228b, 228c, 228d and 228e respectively. A bounding box 243 is defined around these terminals. It will be noted that the bounding box 243 at least partially overlaps switch boxes 230 that are designated as 230a to 230i.

In accordance with the basic principle of the present cost factor computation, an individual congestion factor is computed for each switch box 230 as being equal to the number of bounding boxes that overlap, or at least partially overlap the respective switch box. Since each switch box 230a to 232i is overlapped by one bounding box 243 in FIG. 26, the congestion factor for each of these switch boxes is one, and the congestion factor for each of the other illustrated switch boxes is zero.

Figure 27:
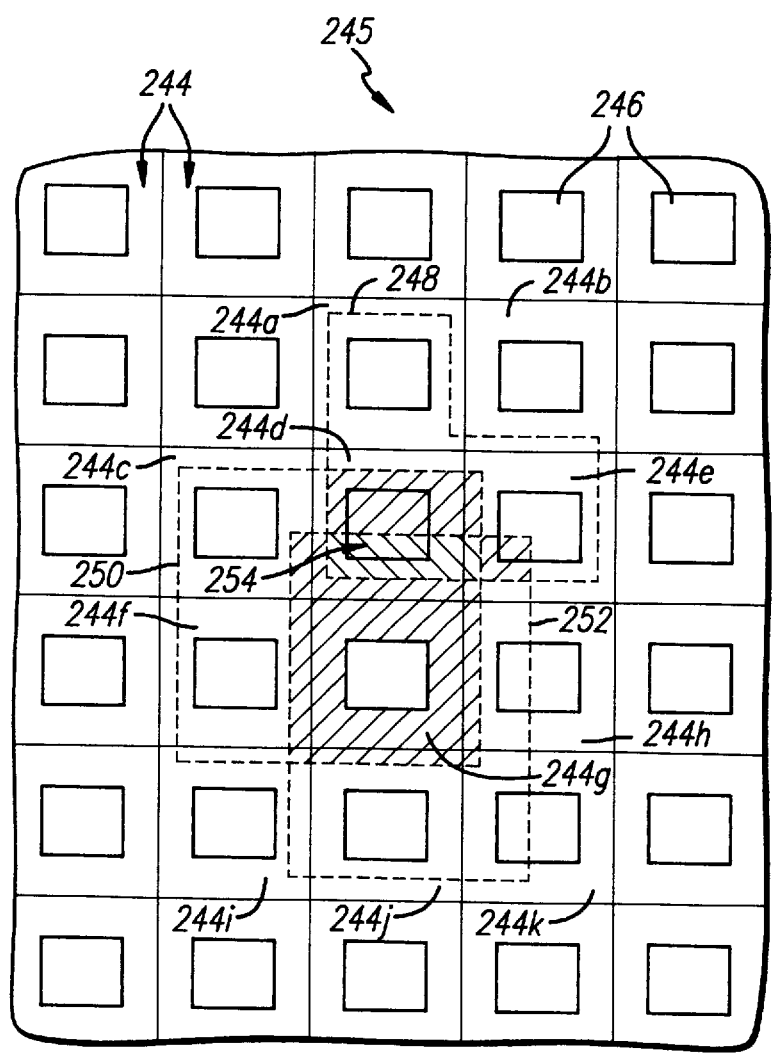

The principle of the invention is further illustrated in FIG. 27, in which a placement 245 is divided into switch boxes 244 that enclose cell locations 246. Several bounding boxes are illustrated as enclosing individual nets of a netlist for the placement 245, but the nets themselves are not shown in order to avoid cluttering of the drawing.

A bounding box 248 is illustrated as at least partially overlapping switch boxes 244a, 224b, 244d and 244e. A bounding box 250 similarly overlaps switch boxes 244c, 244d, 244e, 244f, 244g, 244h, 244i, 244j and 244k. Another bounding box 252 overlaps switch boxes 244c, 244d, 244e, 244f, 244g, 244h, 244i, 244j and 244k. The areas in which two bounding boxes overlap switch boxes are designated by rightwardly slanting hatching, whereas an area indicated by an arrow 254 in which three bounding boxes overlap a switch box is designated by leftwardly slanting hatching.

The switch boxes 244a and 224b are overlapped by only the bounding box 248, and the congestion factor thereof is one. The switch boxes 244c, 244f, 244g, 244h, 244i, 244j and 244k are overlapped by the bounding boxes 250 and 252, and the congestion factor thereof is two. The switch boxes 244d and 244e are overlapped by the bounding boxes 248, 250 and 252 in the area indicated by the arrow 254, and the congestion factor thereof is three.

The cost factor for a placement is computed by performing a mathematical operation on the individual congestion factors of the switch boxes. For example, the cost factor can be defined as the maximum or average value of the congestion factors. However, a more accurate estimation of the actual congestion of a placement can be obtained using more sophisticated operations. For example, the cost factor can be preferably defined as the sum of the squares of the individual congestion factors. Another operation that can be advantageously employed is to define the cost factor as the "soft maximum" of the individual congestion factors, which is defined as $$f_c(P) = \log_a \left( \left( \sum_{i=1}^{M} a^{c_i} \right) / M \right)$$

where $f_c(P)$ is the cost function for placement P, M is the number of switch boxes, i is a counter from 1 to M, $c_i$ is the congestion factor for a switch box i, and a is a variable or constant which is selected in accordance with a particular application.

Figure 3:
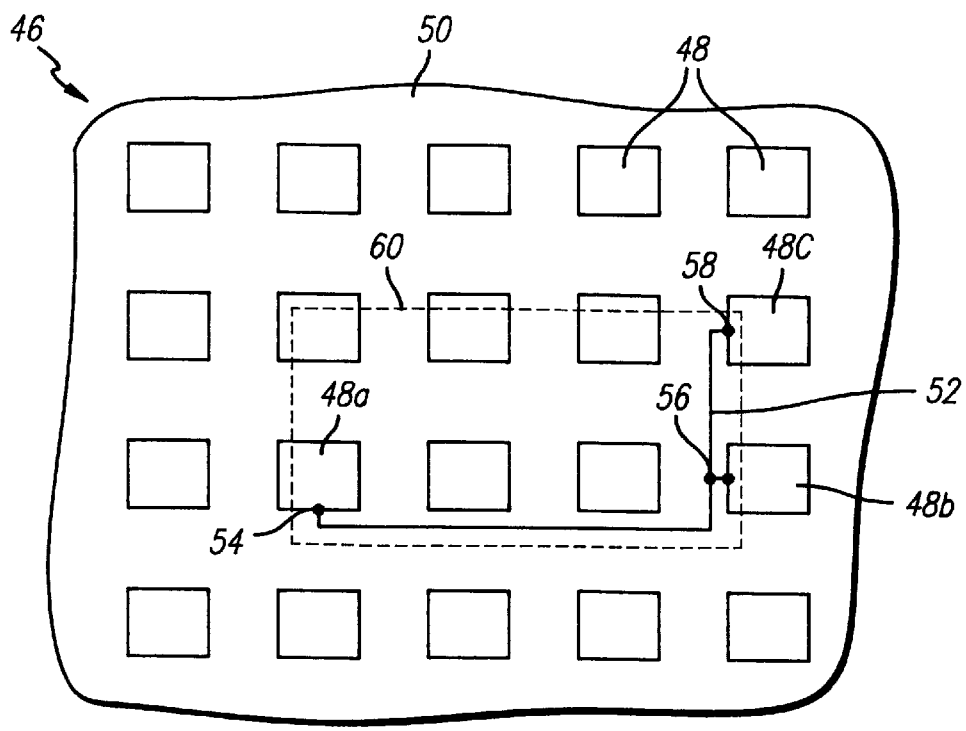
FIGS. 3 and 4 are diagrams illustrating a form of cost factor estimation method.
Figure 4:
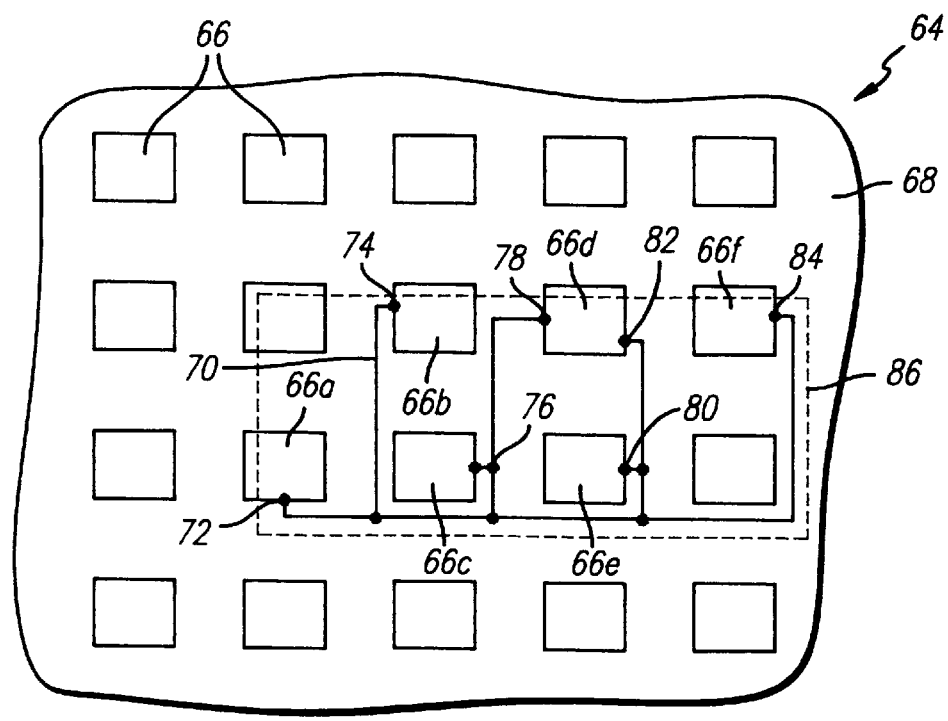

It is further within the scope of the invention to combine the congestion based cost function $f_c(P)$ with one or more other fitness or cost estimations, for example the total wire length estimation obtained using the half-perimeter method described with reference to FIGS. 3 and 4. Other cost estimations that can be combined with the cost function $f_c(P)$ include, but are not limited to, maximum path length, channel capacity overflow and row and/or column length.

The individual components of a composite cost function can also be weighted, for example $$CF = \alpha f_c(P) + \beta f_w(P) + \gamma f_1(P) + \xi f_0$$

where CF is the composite cost function, $f_c$ is the present congestion based cost function, $f_w(P)$ is the estimated total wire length, $f_1(P)$ is the estimated maximum path length, $f_0$ is a predetermined overflow factor, and α, β, γ and ξ are proportionality constants that constitute weighting factors.

Various modifications are possible to the present methods, for example, setting the congestion factor for a switch box equal to the number of bounding boxes that overlap the switch box only if a terminal of one of the associated nets overlaps or is within a predetermined distance of the switch box. This provides a more accurate estimation of congestion in placements including significant numbers of idle cells, since the idle cells will not have any interconnections. Assigning non-zero congestion factors to idle cells would produce an erroneously high indication of congestion.

Figure 28:
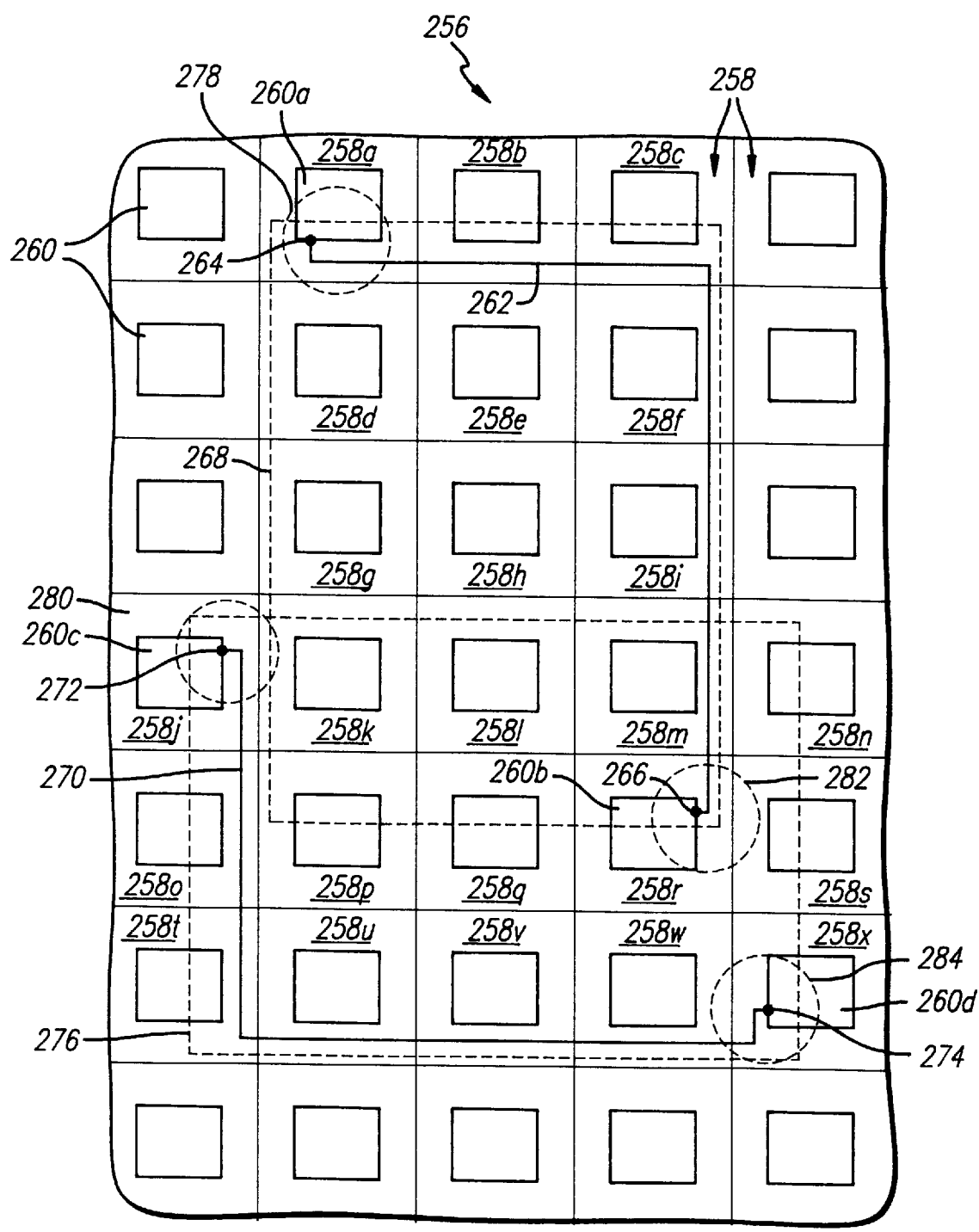

FIG. 28 illustrates the implementation of this modification to the basic method. A placement 256 includes switch boxes 258 that surround cells 260. A first net 262 interconnects terminals 264 and 266 of cells 260a and 260b respectively and is surrounded by a bounding box 268. Another net 270 interconnects terminals 272 and 274 of cells 260c and 260d respectively, and is enclosed by a bounding box 276.

The bounding box 268 overlaps switch boxes 258a to 258i, 258k to 258m and 258p to 258r. The bounding box 276 overlaps switch boxes 258j to 258x. Both bounding boxes 268 and 276 overlap switch boxes 258k to 258m and 258p to 258r.

In one modified form of the invention, a non-zero congestion factor is computed for a switch box only if a terminal of a net overlaps the switch box. In the example of FIG. 28, only the switch boxes 258a, 258j, 258r and 258x which are overlapped by the terminals 264, 272, 266 and 274 respectively will have non-zero congestion factors. Other congestion (criteria) factors may also be used and are contemplated.

Returning to the other embodiment, since the switch box 258a is overlapped by only the bounding box 268, its congestion factor is one. The switch box 258j is overlapped by only the bounding box 276, and its congestion factor is also one. The switch box 258r is overlapped by both bounding boxes 268 and 276, and its congestion factor is two. The switch box 258x is overlapped by only the bounding box 276, and its congestion factor is one. The congestion factors of all other switch boxes 258, even if they are overlapped by one or more bounding boxes, are zero.

It is further within the scope of the invention to modify the method such that a switch box can have a non-zero congestion factor only if it is overlapped by at least one bounding box and is within a predetermined distance of a terminal. As illustrated, circles 278, 280, 282 and 284 having a predetermined radius are defined around the terminals 264, 272, 266 and 274 respectively. The congestion factor of any switch box 258 that is overlapped by a circle will be computed in the same manner as a switch box 258 that is overlapped by a terminal.

In the illustrated example, the switch box 258d will have a congestion factor of one since it is overlapped by the bounding box 268 and the circle 278. The switch box 258k will have a congestion factor of one since it is overlapped circle 280. The switch box 258s will have a congestion factor of one since it is overlapped by the bounding box 276 and the circle 282, whereas the switch box 258w will have a congestion factor of one since it is overlapped by the bounding box 276 and the circle 284.

These modifications can also be weighted in different ways within the scope of the invention. For example, a switch box that is overlapped by at least one bounding box but is not overlapped by a terminal or circle can have a non-zero congestion factor that is weighted lower than if the switch box were overlapped by a terminal or circle. It is further possible to provide different weightings for switch boxes that are overlapped by terminals and circles respectively. The manner in which the weightings are applied is not limited within the scope of the invention.

Figure 29:
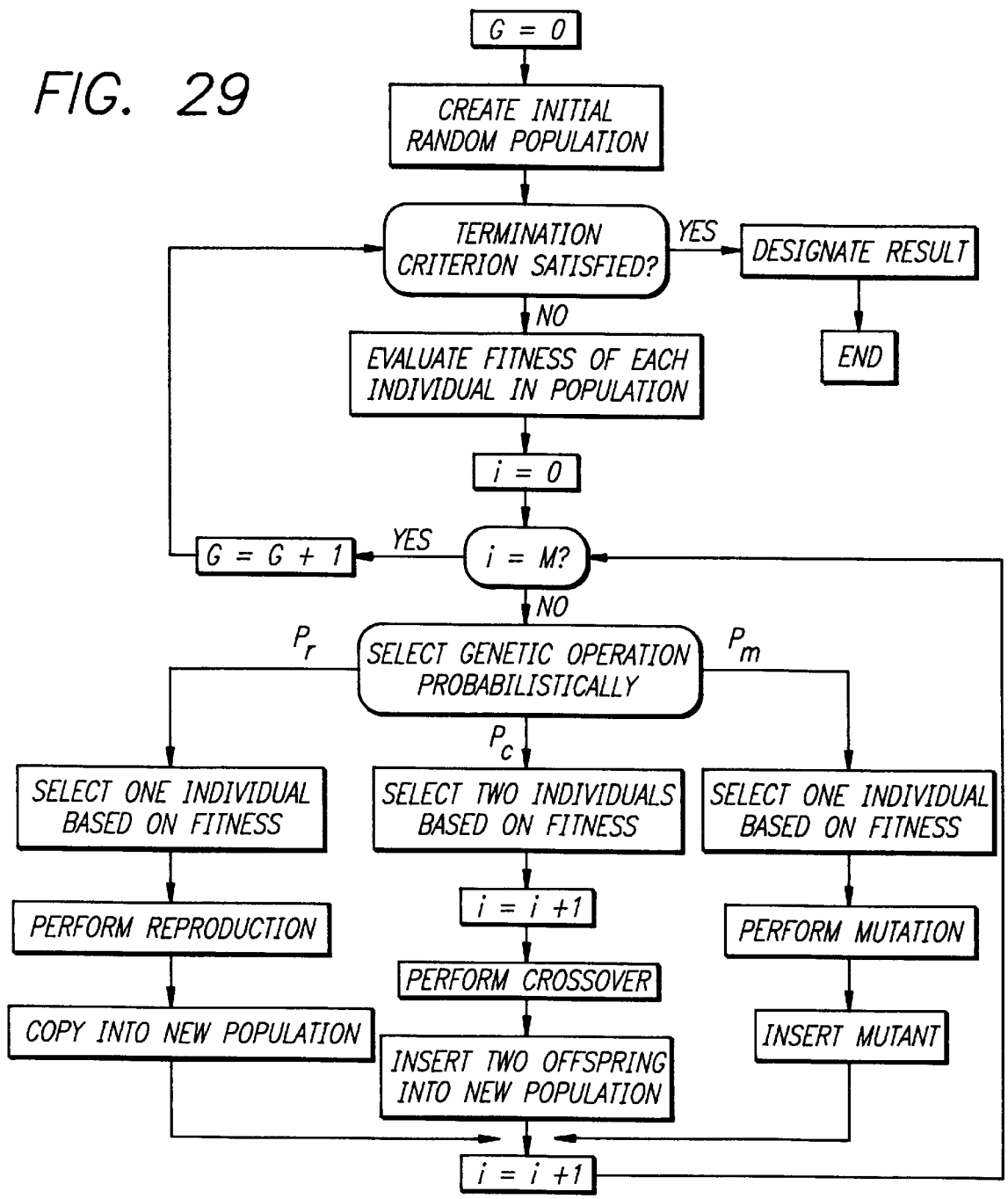
FIG. 29 is a flowchart illustrating the basic genetic algorithm.

6. Improved Genetic Algorithms for Physical Design Automation a. Basic Algorithms The basic genetic algorithm, which is advantageously modified in accordance with the present invention as will be described below for application to integrated circuit physical design, illustrated in the form of a flowchart in FIG. 29. The basic genetic algorithm includes the genetic operations of reproduction, crossover and mutation.

In the first step of the algorithm, the number of generations to be produced, designated as G, is initialized to zero. Then, an initial population of M representations is randomly created. This is necessary because the possible number of placements of N cells is N!, and for an integrated circuit chip including hundreds of thousands of cells N! will be such a huge number that the amount of data representing all of the possible placements could not easily or reasonably be processed using existing computer technology.

Next, the following substeps are iteratively performed on the population of placements until a predetermined termination criterion has been satisfied.

(a) Evaluate the fitness of each placement of the population.

(b) Create a new population of placements by applying the following three operations. The operations are applied to individual placements in the population chosen with a probability based on fitness.

a. Copy existing individual placements to the new population (genetic reproduction).

b. Create two new placements by genetically recombining randomly chosen schema from two existing placements (genetic crossover).

c. Create a new placement from an existing placement by randomly transposing cells in the placement (genetic mutation).

(c) The best individual placement that appeared in the last generation (i.e. the best-so-far individual) is designated as the result of the genetic algorithm.

The relative instances in which the three genetic operations will be performed are specified by a reproduction rate $P_R$, a crossover rate $P_C$ and a mutation rate $P_M$. For example, given an initial population of M=1,000 placements and a reproduction rate $P_R$ of 10%, 100 of the initial 1,000 placements will be copied into the new generation without alteration.

The crossover and/or mutation operations are performed to create the remaining 900 placements. Assuming a crossover rate $P_C$ of 60% and a mutation rate $P_M$ of 30%, 600 of the placements will be generated by selecting 300 pairs of parents, and each pair will be genetically mated to produce 600 children or offspring. 300 of the initial placements will be subjected to mutation. Thus, the new generation will have the same number of placements as the initial population; 100 of which were reproduced without alteration, 600 of which were created by crossover and 300 of which were subjected to mutation.

As described in a textbook entitled "GENETIC PROGRAMMING", by John Koza, MIT Press, Cambridge, Mass. 1993, pp. 94–101, placements are selected for genetic alteration on the basis of fitness such that placements with higher fitness have a higher probability of being selected. However, it is desirable for less fit placements to be included to prevent the loss of potentially desirable genetic material and premature convergence to local optima.

One common selection criteria is "fitness proportionate selection", in which the probability of a placement being selected is linearly proportional to its fitness. A variation of fitness proportionate selection is "rank selection", in which the selection is linearly proportional to the relative ranking of placements in the population.

A third selection criteria is "greedy overselection", in which the placements are ordered by fitness and divided into two or more groups based on fitness. A larger number of placements are selected from the fittest groups than from the less fit groups.

A "greedy mutation" algorithm is described on page 173 of the above referenced textbook to Sherwani. In this algorithm, a cell is selected at random, and the program searches the cells in the same net to find the cell that is farthest from the randomly selected cell. The farthest cell is then transposed to a location adjacent to the randomly selected cell, and the cell in that location is pushed outwardly until a vacancy is found.

These prior art selection of mutation methods are limited in effectiveness as they do not address the cost factors of the individual cells in the placements. The present inventors have discovered that the convergence rate of the genetic algorithm can be substantially increased using the unique methods of the invention as described below.

b. Statistical Selection

Figure 30:
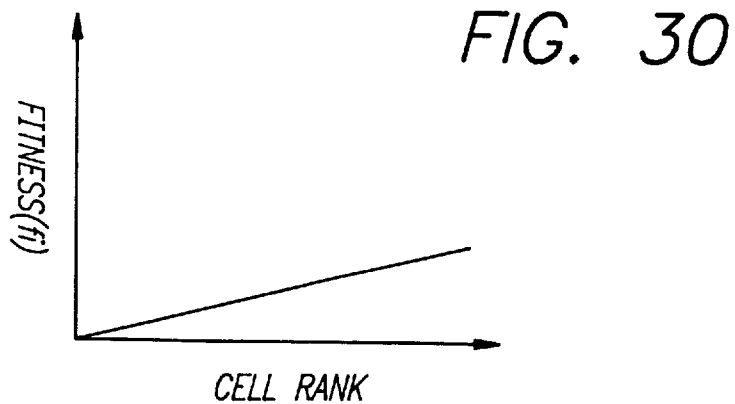
FIG. 30 is a graph illustrating the relative fitness of cells in an exemplary placement when ranked in order of fitness.

A statistical method of selecting placement for crossover in accordance with the invention is illustrated in FIGS. 30 to 36. FIG. 30 illustrates the first step of the method, in which the individual placements are sorted or ranked in terms of increasing fitness (decreasing cost). The individual placement fitness $f_{(i)}$ is generally proportional to the placement rank, where i is the placement rank in increasing order of fitness.

Figure 31:
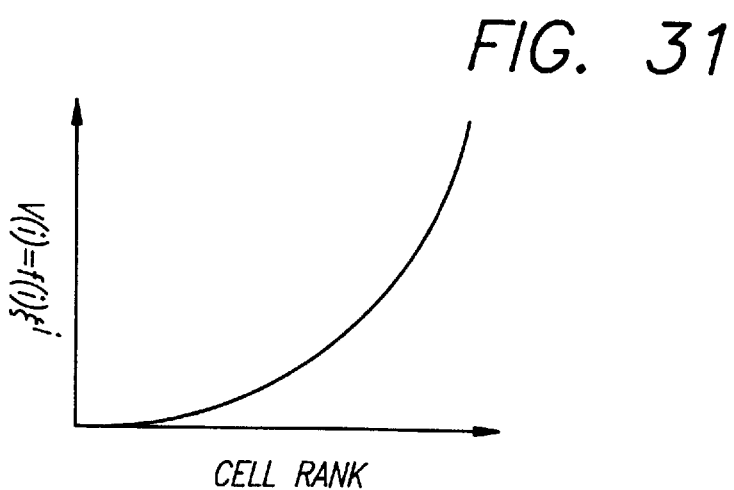
FIG. 31 is a graph illustrating the relative fitness of cells in the exemplary cell placement in accordance with a statistical selection method of the invention.

In the next step, the fitness $f_{(i)}$ of each placement is multiplied by a weighting factor $\xi^{(i)}$ that increases non-linearly with the placement rank i. Preferably, $\xi$ is a constant having the value $\xi=M/(M-1)$, where M is the number of placements. The result is a weighted fitness $V_{(i)}$ for each placement having the value $V_{(i)}=f_{(i)}\xi^i$, such that the weighted fitness $V_{(i)}$ increases non-linearly with placement rank i as illustrated in FIG. 31.

Figure 32:
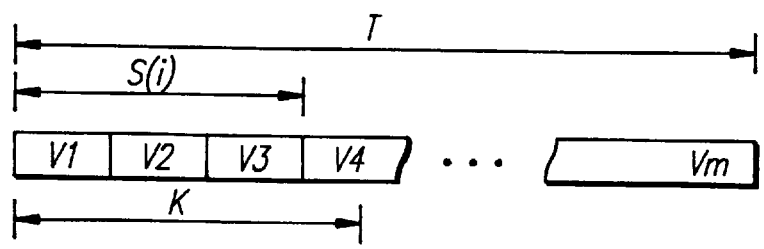
FIG. 32 is a diagram illustrating random cell selection utilizing the statistical selection method illustrated in FIG. 31.

FIG. 32 illustrates how a weighted fitness summation $S_{(i)}$ is computed for each placement as being equal to $S_{(i)}=\Sigma V_{(i)}$. In other words, the summation $S_{(i)}$ is equal to the algebraic sum of the weighted fitness of the respective placement and the weighted fitnesses of all placements having lower fitness.

A placement is selected by generating a random number K between zero and a maximum value T, where T is equal to the weighted fitness summation of the placement having the highest fitness. The random number K is generated by first generating a random number having a value between 0 and 1, and then multiplying K' by T such that K=K'T.

As illustrated in FIG. 32, K is greater than the weighted fitness summation V3 for the third worst placement and less than the weighted fitness summation V4 for the fourth worst placement. Thus, the placement having the summation V4 is selected for the crossover operation. It will be understood that essentially similar results can be obtained by selecting the placement having a weighted fitness summation that is closest to the random number K.

Where the method of FIGS. 30 to 32 is applied to genetic crossover, it is applied twice to select two placements for crossover. Although the actual selection is random, the probability of a placement being selected increases non-linearly with its fitness or rank. This is evident from FIG. 31, in which the weighted fitnesses $V_{(i)}$ and thereby the fitness summations $\Sigma V_{(i)}$ increase non-linearly, more specifically by $\xi^i$, whereas the random number K is generated linearly.

It will be understood that although the method of FIGS. 30 to 32 is especially suited for selecting two placements for genetic crossover, it can be used in any other environment in which it is required to select an entity from a ranked set such that the probability of selection increases non-linearly with rank. An exemplary alternative application is the selection of placements for genetic operations.

EXAMPLE

FIGS. 33 to 36 illustrate the results of a computer simulated uniform crossover operation utilizing the method described with reference to FIGS. 30 to 32. In uniform crossover, cell transpositions or swaps are made such that the cells in the same locations in two placements are transposed. The proportion of locations to be transposed versus the proportion of locations to be unchanged is determined by a ratio, which in the present case is 50%. The locations for transposition are selected randomly in accordance with the ratio.

Figure 33:
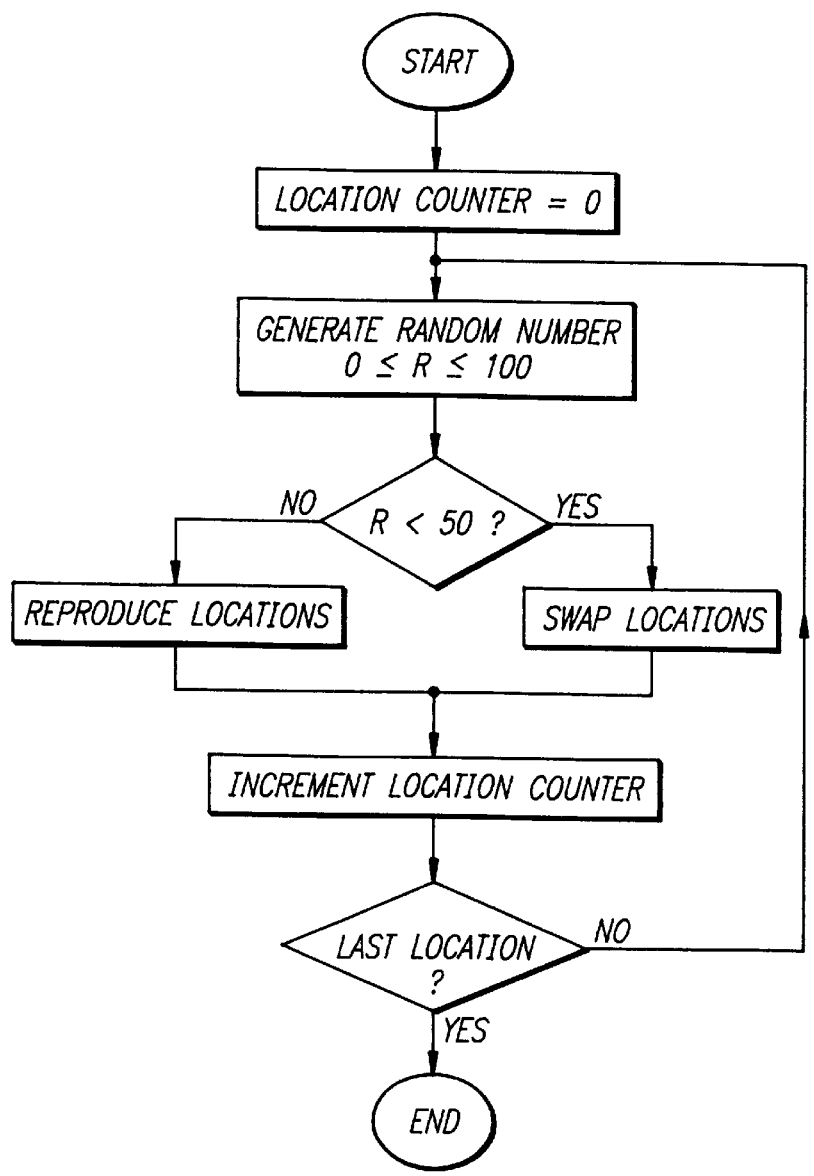
FIG. 33 is a flowchart illustrating a uniform crossover operation utilizing the statistical selection method of FIG. 31.

In the flowchart of FIG. 33, a location counter is initialized to zero, and a random number R having a value between 0 and 100 is generated. If the number R is less than 50, the cells in the locations in the parent placements corresponding to the number in the location counter (initially 0) are unchanged. If the number R is greater than or equal to 50, the cells in the specified location are transposed or swapped.

The swap is advantageously performed using the cell/location representation method described above with reference to FIG. 16. The location counter is then incremented and the operation loops back such that another random number is generated and a decision is made whether or not to perform transposition for the next cell location in the placements. The process ends when the last cell location has been subjected to reproduction (unaltered) or crossover.

FIGS. 34a and 34b in combination represent the results of the simulation. The parameters used for the simulation were cell/location swaplist representation, statistical selection (as described with reference to FIGS. 30 to 32), 0% mutation rate, 10% reproduction rate, 90% crossover rate (uniform crossover), 1,000 placement population size and 100 cells/placement arranged in a 10×10 cell grid.

Each generation is represented by the notation "step" in the printout, whereas "mcmcsnls" indicates that a genetic crossover operation has been performed for the generation in accordance with the flowchart of FIG. 33. The simulation was performed for 40 generations, with the cost factor for each generation being expressed as the difference between the computed cost and a predetermined optimal cost (distance from optimal solution).

Figure 36:
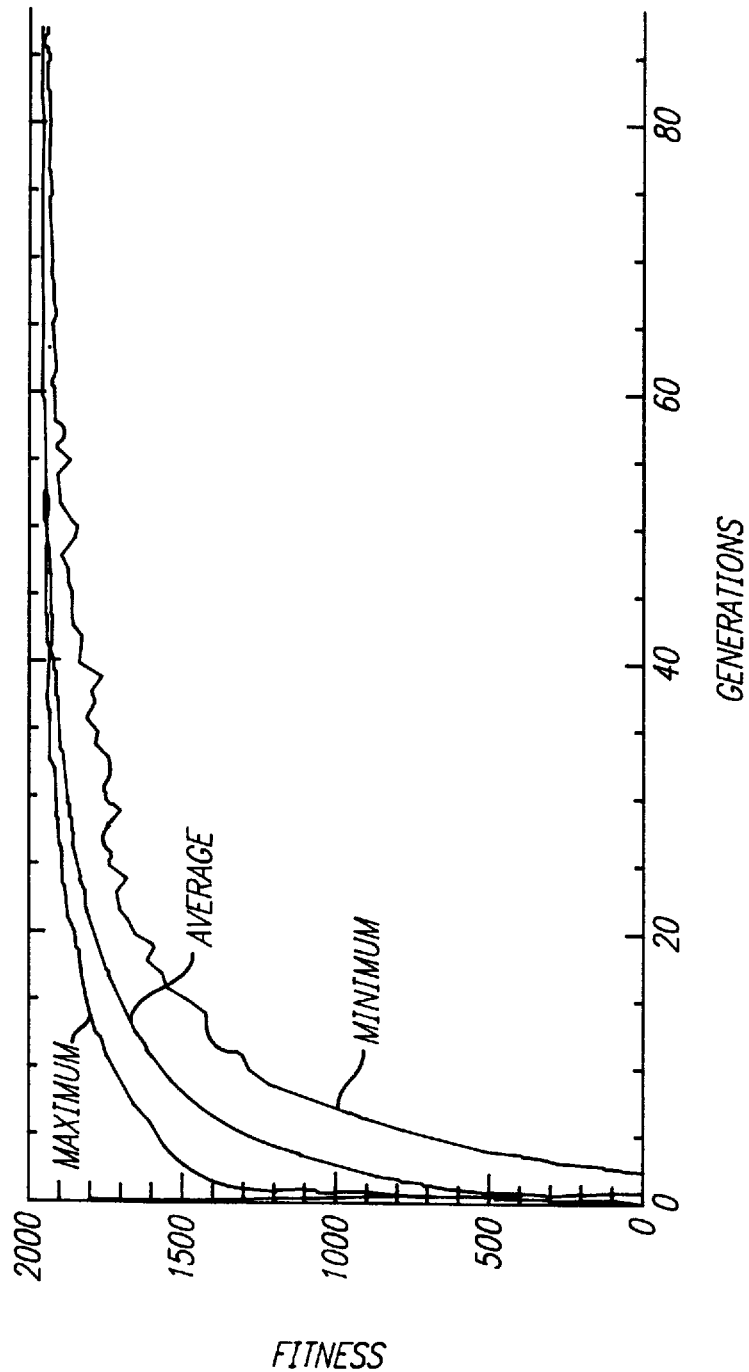
FIG. 36 is a graph illustrating the performance of the simulation of FIGS. 34a and 34b.

For each generation, the program computed the minimum cost (for the best placement in the generation), the average cost of all the placements in the generation, the maximum cost (for the best placement in the generation) and the standard variance of the costs. The solution converged to produce a placement with a cost factor of zero in the 40th generation. FIG. 35 illustrates the numerical identifiers of the cells in the final placement with the zero cost factor. FIG. 36 illustrates an example of the present method.

It will be understood that the present statistical selection method is not limited to uniform crossover. The principles of the invention are applicable to any type of crossover operation, such as one-point, two point and t-point crossover.

c. Greedy Crossover

FIGS. 37 to 43 illustrate "greedy" genetic alteration methods that yet further increase the rate of convergence in the application of genetic algorithms to integrated circuit chip placement and other applications.

Figure 37:
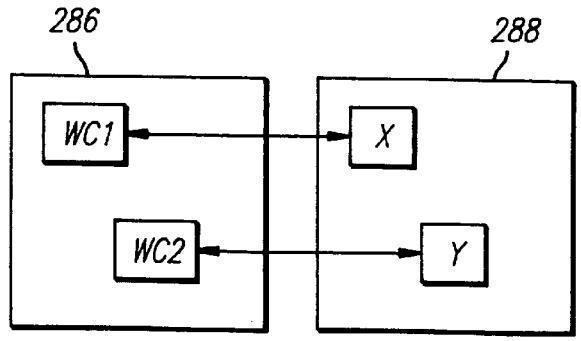
FIG. 37 is a diagram illustrating a greedy crossover operation in accordance with the present invention.

FIG. 37 illustrates a greedy crossover operation in which the worst cell WC1 in a placement 286 is selected as having the highest congestion. The cost for each cell is preferably computed using the congestion based method described above with reference to FIGS. 25 to 28. However, the invention is not so limited, and any other method of cost evaluation, such as the prior art half-perimeter approximation method described above with reference to FIGS. 3 and 4 can be used.

In the method of FIG. 37, the worst cell WC1 in the placement 286 is swapped with a cell X in a placement 288 which has the same location in the placement 288 as the cell WC1 has in the placement 286. The swap is preferably performed using the cell/location representation method. More specifically, the location/cell list for the placement 286 is searched to determine the location of the cell WC1, and the contents of that location are swapped for the contents (the cell X) of the corresponding location in the placement 288.

The method of FIG. 37 is not limited to swapping a single pair of cells. For example, a next worst cell WC2 in the placement 286 can be swapped for a cell Y in the corresponding location in the placement 288. A single crossover operation can include swapping any number of pairs of cells that can be selected using any suitable criterion. For example, the best cell in the placement 286, rather than the worst cell WC1, can be swapped to the placement 288. It is further within the scope of the invention to swap adjacent pairs, triplets or longer strings of cells, or blocks of cells.

d. Greedy Mutation

Figure 38:
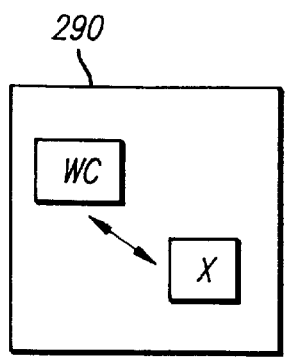
FIGS. 38 to 43 are diagrams illustrating greedy mutation operations of the invention.

FIG. 38 illustrates a greedy mutation operation according to the present invention. As with the greedy crossover operation of FIG. 37, the worst cell WC in a placement 290 is selected in accordance with the cost computation, and swapped with a cell X in a randomly selected location in the placement 290.

Figure 39:
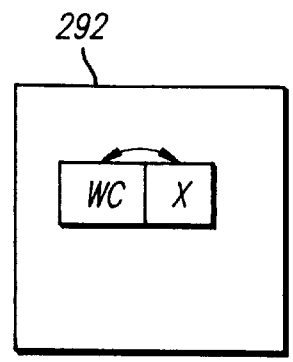

FIG. 39 illustrates an alternative method in which a worst cell WC in a placement 292 is swapped with an adjacent cell X. The geometric relationship of the cell X to the cell WC can be selected randomly, or in accordance with a predetermined criteria. For example, the cell X can be the worst cell among the cells adjacent to the cell WC.

Figure 40:
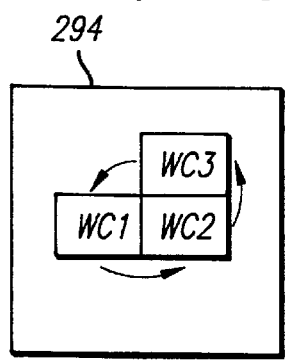

An extension of the method of FIG. 39 is illustrated in FIG. 40. In this case, the worst cell WC1 in a placement 294 is swapped to the location of a cell WC2 which has the lowest fitness among the cells adjacent to the cell WC1. The cell in the location initially occupied by WC2 is swapped to the location of a cell WC3 that has the lowest fitness of the cells, other than the cell WC1, that are adjacent to the initial location of the cell WC2. The cell WC3 is swapped into the initial location of the cell WC1. It will be understood that the operation of FIG. 40 results in a cyclical transposition of the cells WC1, WC2 and WC3.

Figure 41:
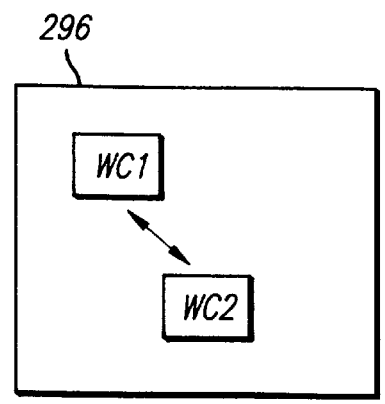
Figure 42:
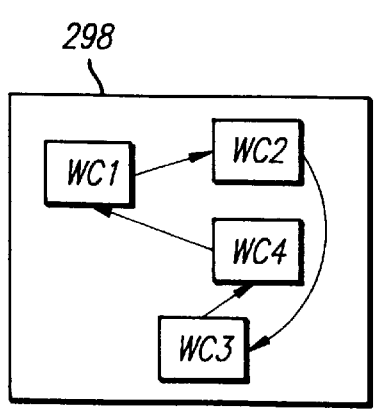

FIG. 41 illustrates another greedy mutation method according to the present invention, in which a worst cell WC1 of a placement 296 is swapped with the second worst cell WC2 in the placement 296. FIG. 42 illustrates a greedy mutation operation on a placement 298 which is an extension of the method of FIG. 41 in which cells WC1, WC2, WC3 and WC4 that are ranked in order of decreasing fitness are transposed cyclically.

Figure 43:
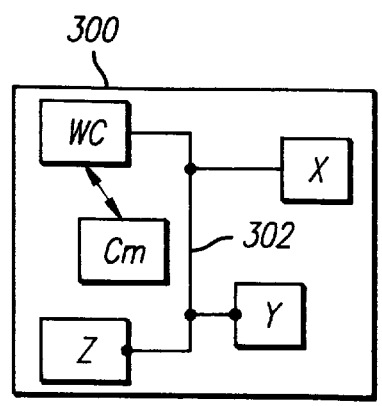

FIG. 43 illustrates yet another greedy mutation method of the invention, in which a placement 300 includes a worst cell WC, and additional cells X, Y and Z that are interconnected with the cell WC in a net 302. In this method, the center of mass of the cells in the net 302 is computed, and the worst cell WC is swapped with a cell CM that is located at the center of mass of the net 302.

In all of the methods of FIGS. 37 to 41, cells can be selected in accordance with an alternative cost criterion, such as highest fitness (lowest cost), in which the best cell in the placement is selected to be swapped.

7. Optimal Switching of Algorithms

The present method is capable of performing various placement optimization (fitness improvement) algorithms and/or cost (fitness) computation algorithms simultaneously, in combination, and/or switch between algorithms in an manner that is predetermined to optimize the processing efficiency. Such placement optimization or fitness improvement algorithms include, but are not limited to, simulated evolution, mutation, simulated annealing, constructive placement, force directed placement and variants thereof.

Figure 44:
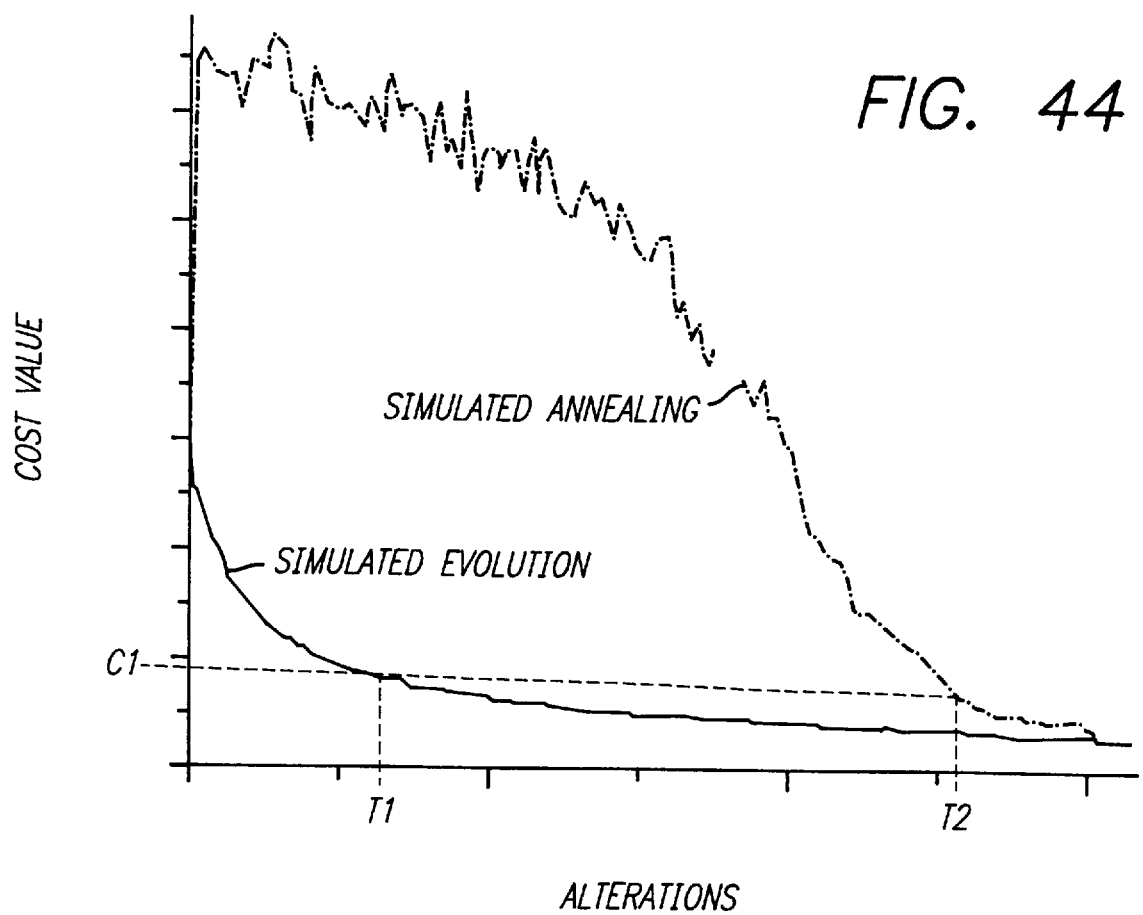
FIG. 44 is a graph illustrating the characteristics of two placement fitness optimization processes that can be optimally switched in accordance with the present invention.
Figure 45:
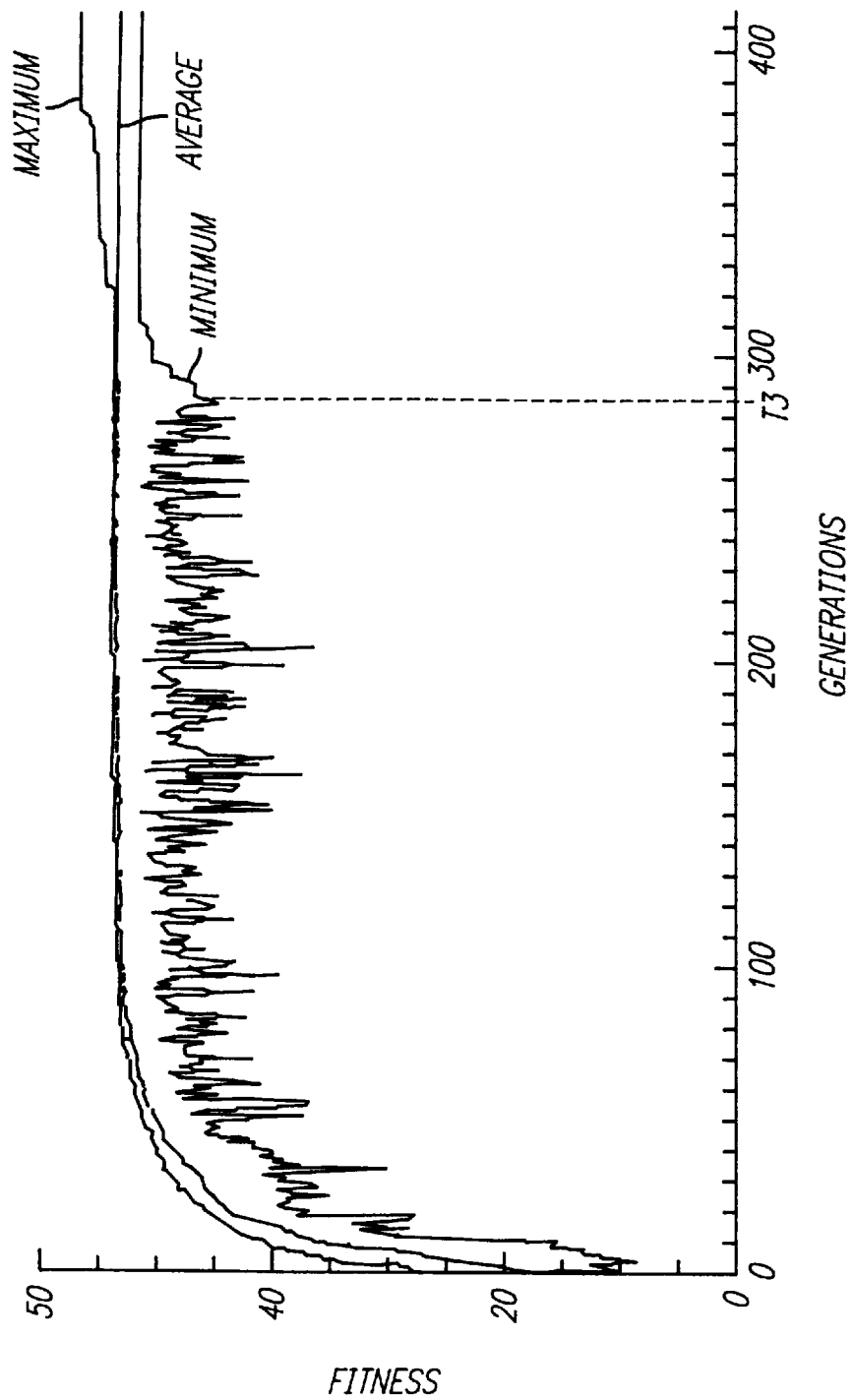
FIG. 45 is a graph illustrating optimal switching between the two optimization processes shown in FIG. 44.

An example of optimal switching between placement optimization or fitness improvement algorithms in accordance with the present invention is illustrated in FIGS. 44 and 45. FIG. 44 illustrates the typical characteristics of two algorithms that are available for use by the present physical design automation system 130 as illustrated in FIG. 8, more specifically simulated evolution, and a variant of simulated annealing known as "TimberWolf 3.2" as described in the above referenced article to Sechen.

The horizontal axis in FIG. 44 represents the number of alterations performed by the algorithms. In the case of simulated evolution, the alterations are genetic crossover operations, whereas in the case of simulated annealing the alterations are cell pair transpositions. The vertical axis represents the fitness value of the cell placement having the highest fitness in the population of cell placements.

The simulated evolution algorithm converges rather rapidly to a cost value C1 after a number T1 of alterations, and changes relatively slowly thereafter. The simulated annealing algorithm requires many more alterations to reach the cost value C1, as indicated at T2. However, the simulated annealing algorithm converges more rapidly than the simulated evolution algorithm to cost values below C1.

This information is utilized in accordance with the invention to optimize the cell placement process by using the simulated evolution algorithm to achieve rapid convergence during the initial phase of the operation, and then switching to the simulated annealing algorithm to increase the convergence rate during the final phase of the operation. In the illustrated example, the optimization criterion for maximizing the convergence rate is to switch from simulated evolution to simulated annealing when the cost value cell having the highest fitness in the population reaches the value C1.

A computer simulation utilizing the optimization criterion described with reference to FIG. 44 is illustrated in FIG. 45. Three curves are illustrated, representing the minimum, average and maximum fitnesses of the cells in the population. The horizontal axis represents the number of generations of genetic crossover, whereas the vertical axis represents fitness.

The process was switched from simulated evolution to simulated annealing after a number T3 of generations (genetic crossover operations). It will be seen that the minimum and maximum fitness values increase in a generally stepwise manner after the switchover at T3, with the maximum fitness value, which corresponds to the highest fitness cell placement, attaining a substantially higher value. In this example, not only is the convergence rate increased by the switchover, but a more fit cell placement is produced than could be attainable using simulated evolution alone.

The optimization criterion for switching between various fitness improvement algorithms can take a number of forms depending on a particular application. Examples of such criteria include, but are not limited to the following.

1. Switch when the cost value of the most fit placement reaches a predetermined minimum value (the fitness reaches a predetermined maximum value) as illustrated in FIG. 44.
2. Switch after a predetermined number of processing steps (genetic crossover operations, simulated annealing cell transpositions, etc.) have been performed.
3. Switch when a predetermined number of processing steps has been performed without producing a change in the cost value of the most fit placement.
4. Switch when a predetermined number of processing steps has been performed without producing a change larger than a predetermined value in the cost value of the most fit placement.

Although a preferred example of the invention in which a switch was made at an optimal point in the processing operation from simulated evolution to simulated annealing has been described and illustrated, the invention is not so limited. Numerous other algorithms are available that can be optimally switched in accordance with the invention, including simulated evolution, mutation, simulated annealing, constructive placement, force directed placement and variants thereof.

8. Optimal Switching of Cost Functions

Fitness (cost) computation algorithms that can be utilized by the invention include, but are not limited to, the congestion based cost function as described above with reference to FIGS. 25 to 28, the "half-perimeter" wire length computation as described with reference to FIGS. 3 and 4, maximum pathlength, and combinations thereof including the present composite cost function $CF = \alpha f_c(P) + \beta f_w(P) + \gamma f_1(P) + \xi f_0$.

In the latter case, the composite cost function can be used exclusively, and switching performed by changing the values of the numerical constants $\alpha, \beta, \gamma$ and $\xi$ in a manner that is predetermined in accordance with the particular application. However, such switching is not limited to the present composite cost function, and can be applied to switching between any cost functions having the same form and at least one variable coefficient, such as between cost functions F1 and F2 as expressed by $$F1 = A_1 f1(p) + B_1 f2(p)$$

and $$F2 = A_2 f1(p) + B_2 f2(p)$$

where $f1(p)$ is a first predetermined function of a placement, $f2(p)$ is a second predetermined function of a placement and $A_1, A_2, B_1$ and $B_2$ are predetermined constants.

FIGS. 46 to 49 illustrate a preferred example of the invention in which two fitness (cost) functions are optimally switched from one to the other in accordance with an optimization criterion to maximize convergence of the cell placements toward an optimal configuration.

Figure 46:
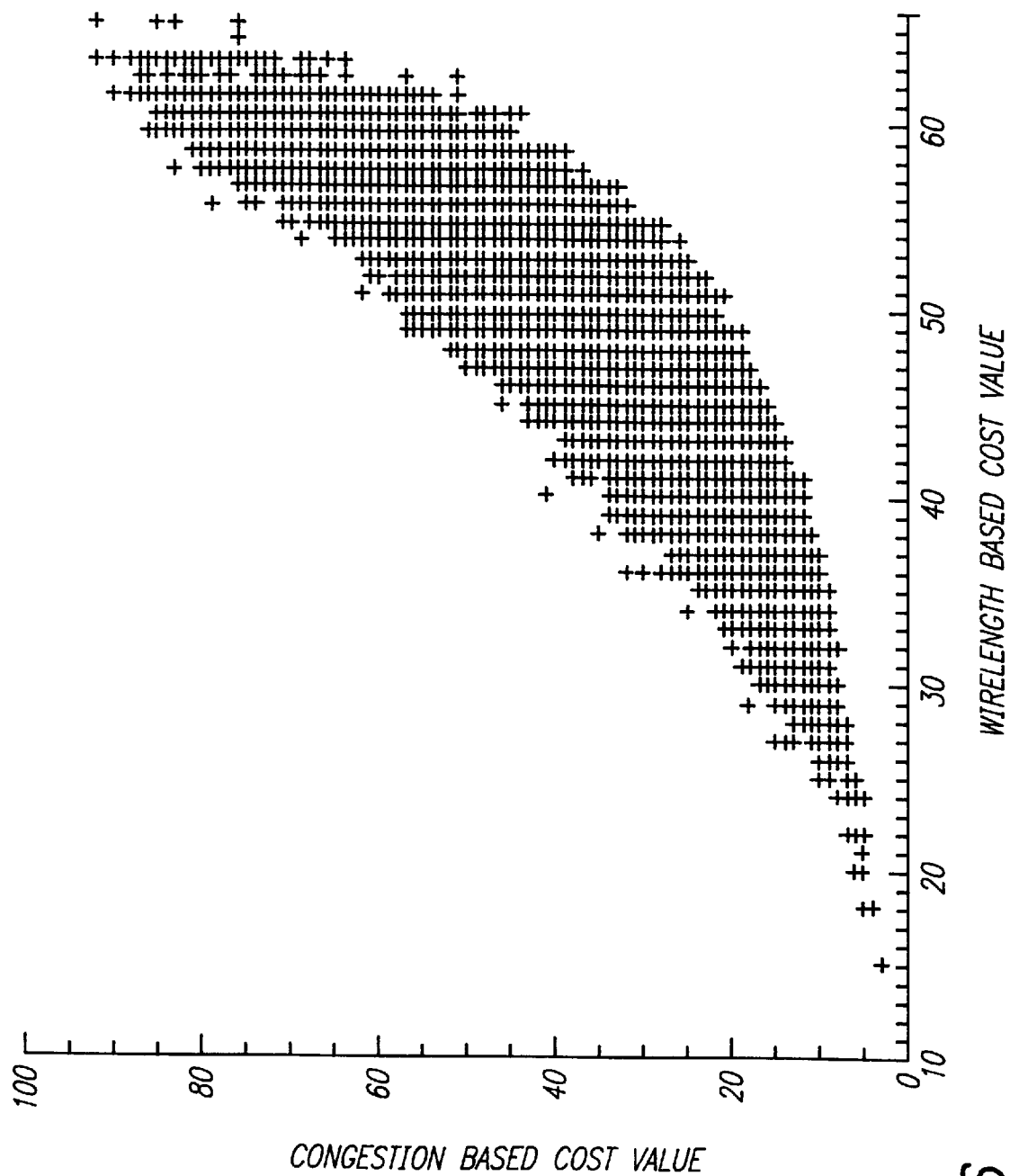
FIG. 46 is a graph illustrating the relationship between the numbers of cell placements and their corresponding congestion and wirelength based cost function for an exemplary population of cell placements.

FIG. 46 illustrates a simplified example for a 3×3 array of cells, in which the horizontal axis represents cost values based on the prior art "half-perimeter" wire length computation as described with reference to FIGS. 3 and 4 and the vertical axis represents cost values based on congestion as described with reference to FIGS. 25 to 28. Each cross "+" represents a placement having a cost with a corresponding numerical value on the respective axis.

Figure 47:
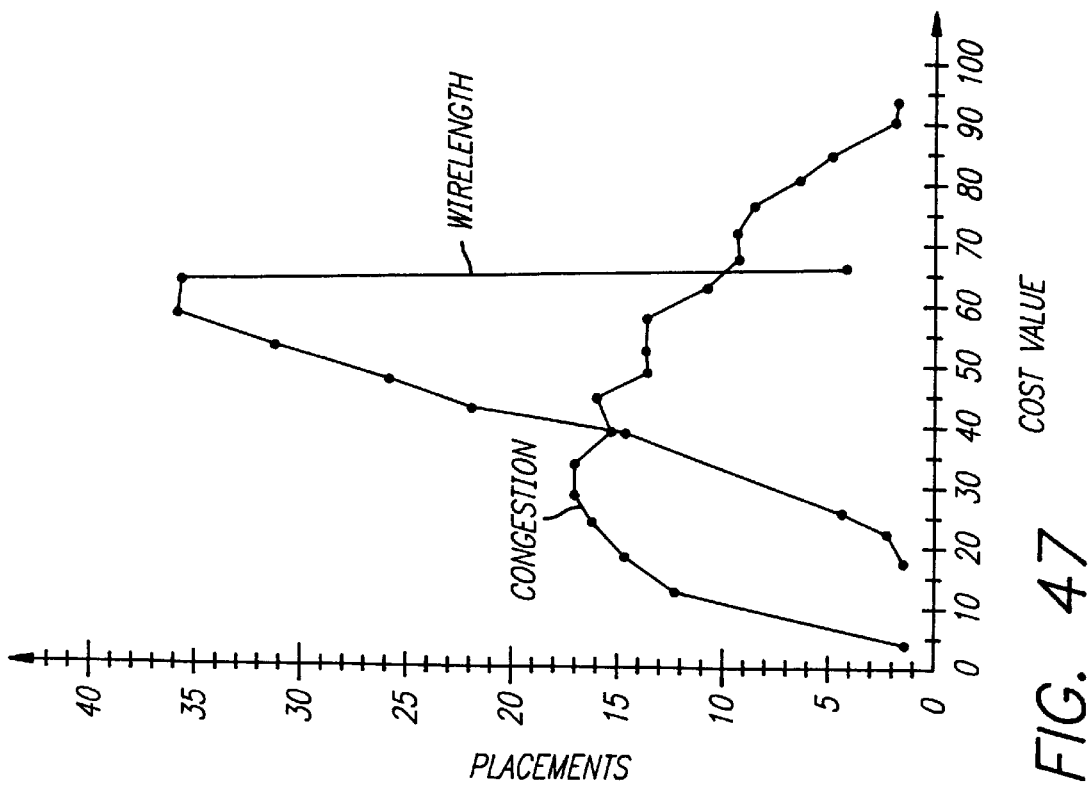
FIG. 47 is a graph illustrating the relationship of FIG. 46 in the form of two separate curves.

FIG. 47 is a smoothed version of the information illustrated in FIG. 46, in which the numbers of placements are plotted individually versus cost values for the congestion and wirelength based cost functions respectively. It will be seen for both cost functions that the numbers of placements are low for extremely high and low cost values, and are maximum for intermediate cost values.

Optimal switching between different cost function computation methods prevents the optimization processing (simulated evolution or annealing, etc.) from becoming trapped at local optima, and also increases the rate of convergence toward a most fit or optimal placement. As best seen in FIG. 47, the cost values are plotted as decreasing (toward a more fit placement) from right to left. The congestion based cost function increases gradually to a maximum number of placements at a cost value of approximately 25, and then decreases. The wirelength based function peaks sharply at a much higher number of placements at a cost value of approximately 55.

This known behavior of different types of cost functions enables optimal switching therebetween based on predetermined criteria. Based on the information in FIGS. 46 and 47, the congestion based cost function computation is preferably used during the initial portion of the optimization processing, since the initial cost functions are relatively high and the number of placements are low.

The gradual increase in the number of placements enables greater differentiation between similar placements, thereby increasing the effectiveness of the optimization processing and the rate of convergence toward an optimal solution. The progressive change in the cost value resists trapping of the optimization processing at a local optima.

The two cost value curves intersect at a cost value of approximately 35. At this point, the congestion based cost value is continuing to increase, whereas the wirelength based cost value is decreasing sharply. In the illustrated example, the cost value computation is preferably switched from congestion to wirelength based when the average cost value for the placements in the population reaches approximately 35. This prevents the processing from being trapped at a local optima, and causes rapid convergence to placements with low cost value in a minimum period of time or processing steps.

Based on the known relative characteristics of different cost functions as exemplified in FIGS. 46 and 47, various optimization criteria can be utilized as switching points in actual processing environments. Examples of such criteria include the following.

1. Switch when the cost value of the most fit placement reaches a predetermined minimum value (the fitness reaches a predetermined maximum value). An exemplary cost value for the example of FIG. 47 would be approximately 30 to 40.
2. Switch after a predetermined number of processing steps (genetic crossover operations, simulated annealing cell transpositions, etc.) have been performed.
3. Switch when a predetermined number of processing steps has been performed without producing a change in the cost value of the most fit placement.
4. Switch when a predetermined number of processing steps has been performed without producing a change larger than a predetermined value in the cost value of the most fit placement.

Figure 48:
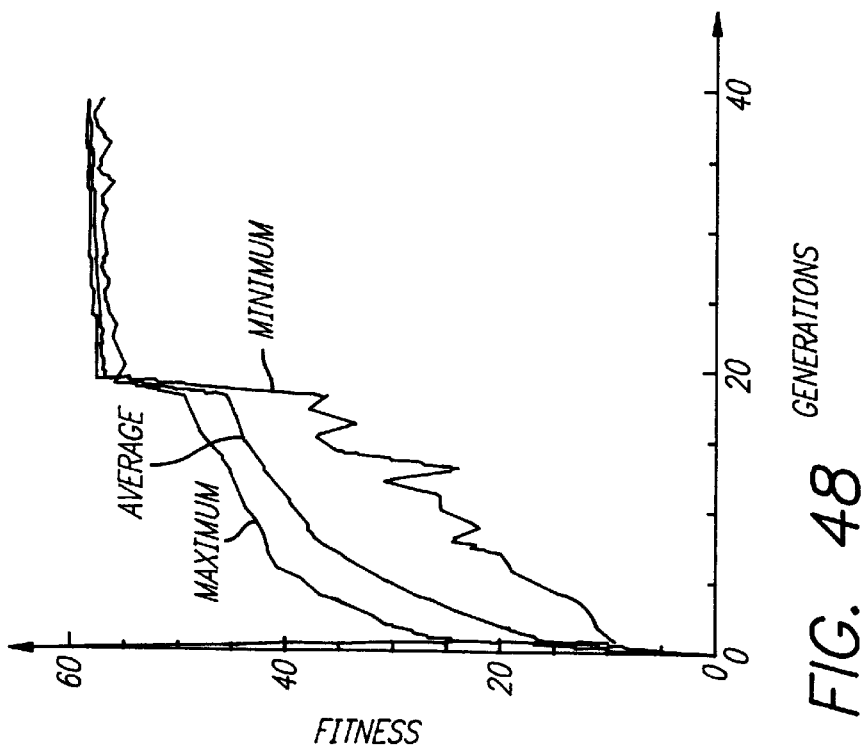
FIG. 48 is a graph illustrating optimal switching from a congestion based cost function to a wirelength based cost function in accordance with the present invention.

FIG. 48 illustrates a computer simulation of optimal switching of cost value computation utilizing the relationship between congestion and wirelength based cost functions as illustrated in FIGS. 46 and 47. The example assumes a 10×10 array of cells, and a known optimal placement. The horizontal axis represents the number of steps of optimization processing, in this case generations of simulated evolution (genetic algorithm), whereas the vertical axis represents fitness. Three curves are illustrated, representing fitness values for the placements in the population having minimum, average and maximum fitness respectively.

The example of FIG. 48 is also tabulated numerically in FIGS. 49a to 49c. It will be seen that the maximum fitness increases rapidly for approximately the first 8 generations, and then tapers off to a more gradual slope. The cost value computation was initially performed using a congestion based cost function, and switched to the wirelength based cost function after the 18th generation. The fitnesses increase in almost a vertical step to approximately 55 to 57, and maintain these values during subsequent processing.

The tabular listing of FIGS. 49a to 49c represents the fitnesses in terms of cost values rather than fitnesses. The minimum, average and maximum cost are computed using the congestion based cost function for generations below 18 and the wirelength based cost function for subsequent generations. Other variables which are of interest and are not self-explanatory include:

avg_distance—average distance or difference between placements, expressed as average number of cells in different cell locations over the population of placements.

cheat—difference between average placement and predetermined optimal placement, expressed as average number of cells over the population of placements that are in different locations from those in the optimal placement.

ranko—cost value computed using the present composite cost function.

yugo—cost value computed using the congestion based cost function as modified to require that a terminal of a net of one of the bounding boxes overlap or be within a predetermined distance of a switch box in order for the congestion factor to be computed as the sum of the overlapping bounding boxes.

wire—cost value computed using the wirelength cost function.

9. Simultaneous Placement and Routing (SPAR)

The SPAR methodology is an attempt to place very large designs using a more accurate cost function in a short time by the use of multiple processors. Present placement programs use crude cost functions usually based on an estimate of wire length. In spite of the use of these crude cost functions the run times are often measured in days.

The SPAR methodology divides the problem into subtasks and shares them among a number of processors. This increase in processing power allows the use of a more complex cost function while still significantly reducing the elapsed time.

Operation

The SPAR methodology alternates between a congestion calculation and a placement improvement mode. In both modes one process assigns tasks and collects data. This "host" process requires very little computation and is able to support many "worker" processes. In congestion calculation mode the assignments consist of lists of nets; in placement improvement mode the assignments consist of lists of cells.

Congestion Calculation

In congestion calculation a routing is determined for each net independently. It is assumed that the terminals of a cell exist at two nodes in the two routing channels on each side of the cell. First a minimum spanning tree connecting the nodes of the net is generated. The edges of this minimum spanning tree which cross cell columns are then used to generate column feedthroughs. Each edge crossing a column generates two feedthroughs, one at the Y coordinate of each node of the edge.

The global edges of the minimum spanning tree have now served their purpose and are then discarded. Channel edges are generated in those channels which contain cell terminal nodes. An edge starts at the top terminal or feedthrough of the channel and connects to the next terminal or feedthrough. This continues until the bottom terminal or feedthrough in the channel.

The entire set of channel edges is sorted in decreasing order of cost (length weighted by previous congestion data). The set of channel edges and feedthroughs is then reduced by removing those edges beginning with highest cost edges which can be removed and still have all terminal connected.

The chip is divided into global grids (channel segments ten wiring grids long) and the congestion cost for each global grid incremented by one for each net which is routed into or through it. Because this data is computed independently for each net, it can be reported to and summed by the host to obtain a congestion map of the placement. On the other hand, because the edge costs are based on the previous congestion run, as the placement approaches a stable state the routing also approaches a true global routing.

Placement Improvement

After the host has received congestion data for all nets for the current placement, it evaluates the cost contribution of the placement of each cell. The cells having the highest cost contributions are then selected for placement improvement. The tasks of improving the placement of these cells are then assigned to 'worker' processes.

The cost function is then evaluated for the cell in each location within a window around its current location. The use of a window limits calculation and a cell that need to move beyond the limits of the window will move to the edge of the window and then be selected for improvement again in a later pass. Since placement improvement is done on a cell by cell basis all relevant cost function calculation must refer to a single cell.

Since the routing mode is relatively expensive, it may be desirable to do several passes of placement improvement between routing mode passes. After each placement improvement pass the accumulated error in the congestion calculation could be estimated. If this error exceeds some limit, a new congestion calculation routing pass should be executed.

Cost Function

The cost function used in SPAR preferably consists of the following terms:

1) wire length
2) cell column variance
3) cell overlap
4) routing congestion

The routing congestion term is the key to a quality layout and is the most difficult to obtain.

Wire Length

The wire length component of the cost function assigned to a cell in placement improvement is determined as follows. The bounding box for the terminals of the net excluding the current cell is determined. The manhattan distance that the current cell lies outside this bounding box is the wire length charged to the cell. A possibility is to modify this number by the ratio of the size of the current net bounding box to the size of the lower bound on that box. The size of the lower bound on the box would be computed by the sum of the areas of the cells on the net plus their associated channel area.

Column Length Variance

When a cell is being evaluated for a location in placement improvement, the amount that the addition of the cell to that column will make the column longer then the column average must be charged to the cell. It may be desirable to increase this cost nonlinearly as the amount that the channel exceeds the average increases.

Cell Overlap

If the location of a cell in placement improvement causes the outline of the cell to overlap the outline of another cell, the amount of that overlap is charged to the cell.

Congestion

The congestion cost of a net passing through each global grid of the channel is determined in the routing phase. Therefore the net congestion cost could be calculated by summing the cost of the global grids through which the net passes. This calculation is complicated by the global congestion and the net routing not being available at the same time in the same processor. Another problem is how to assign this net congestion cost to individual cells. One approach is to divide the net cost equally between the cells on the net.

Interactions and complications

Since multiple processors are modifying the placement simultaneously, interactions between cell placements cause potential problems. The first interaction is the relationship between cells in calculating the column length and cell overlap. If a single cell attempts to move it will likely not find a suitable open slot and the resulting channel length and overlap costs will prevent its movement.

A solution is to process the cells in a placement improvement task as a batch. If the space occupied by the one thousand plus cells in a batch is freed before the search for new locations begins, the cells can effectively swap position with no problem. For this reason it is desirable to assign cells from the same region of the chip to the same task group; although, if this is done, care should be taken to insure that the regions vary from pass to pass.

Another interaction is that of two (or more) cells on the same net but in different placement improvement groups moving toward each other and in the process passing each other. This is a concern; however, in most cases the result will still be a reduction in the net bounding box. Furthermore, if cells in the same region are grouped into the same task group as suggested in the previous paragraph, the cost calculation will no longer be independent. The new location of the first cell improved will be used in the calculation of the new location of the second cell.

Figure 50:
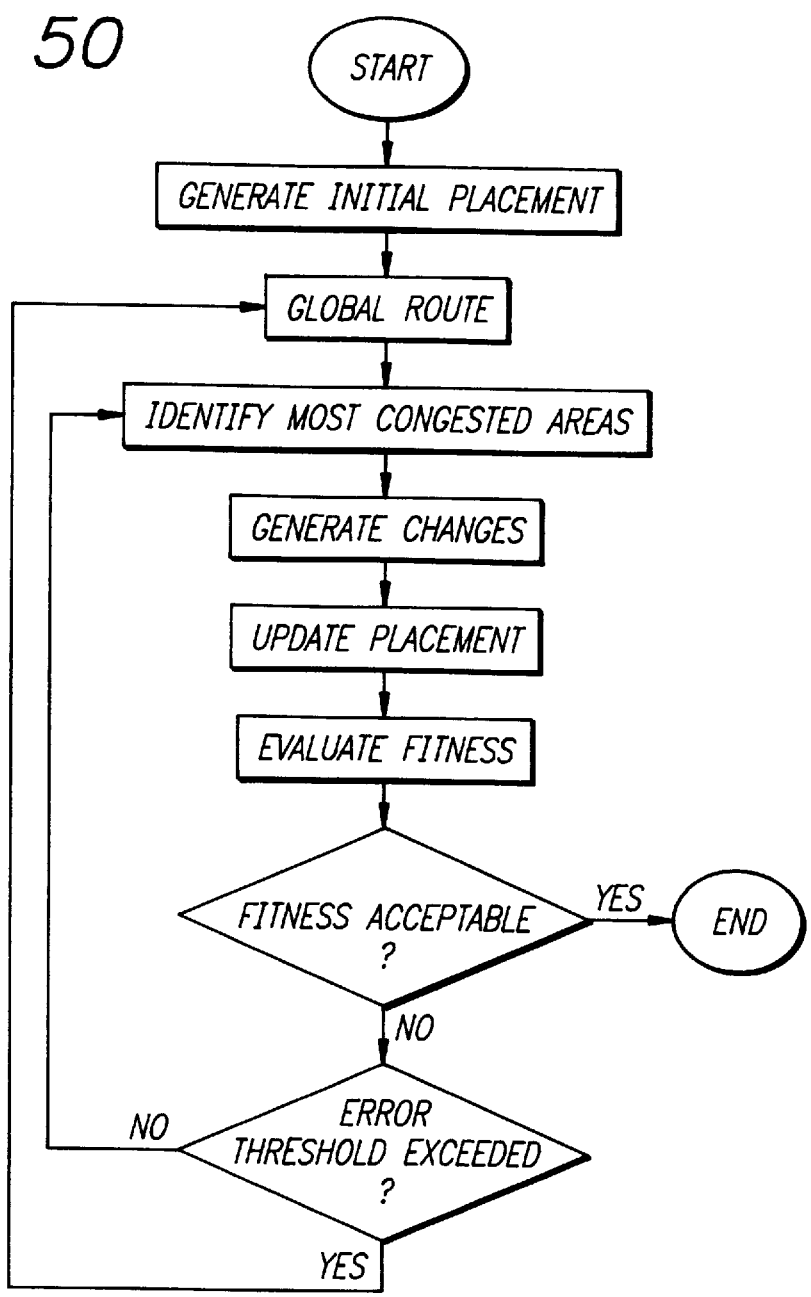
FIG. 50 is a flowchart illustrating a method of simultaneous placement and routing of the present invention.

The process decomposition and recomposition methodology is generally illustrated in the flowchart of FIG. 50.

The first step of the method is to generate an initial placement using a floorplanning, partitioning or other placement algorithm. The initial placement can be generated using a hierarchial structure specified by the designer, or such a structure can be discovered using a partitioner. In any case, cells that are connected to each other are grouped together, and the groups are roughly distributed on the chip area in accordance with their functional, connective or other associative relationships.

After the initial placement has been generated, a global routing is performed, preferably using an algorithm that be decomposed into tasks which can be performed simultaneously in parallel. It is further within the scope of the invention to perform initial placement and routing by dividing the cell into contiguous non-overlapping areas, and using parallel processors to perform placement and/or routing in the areas individually. A global placement and/or routing can then be recomposed from the results of the local operations. The initial placement and routing can also be performed simultaneously on nets or other groupings of nets.

The global routing provides a detailed mapping of the cell interconnects for the placement, and enables accurate computation of cell interconnect congestion. A fitness or cost value is computed for each cell in the placement.

The fitness (cost) computation algorithms that can be utilized by the invention include, but are not limited to, the congestion based cost function as described above with reference to FIGS. 25 to 28, the "half-perimeter" wire length computation as described with reference to FIGS. 3 and 4, maximum pathlength, and combinations thereof including the present composite cost function $CF = \alpha f_c(P) + f_w(P) + \gamma f_1(P) + \xi f_0$.

The individual cost values are utilized to identify the most congested areas of the placement. Numerous standard statistical methods can be utilized to provide smoothed values of localized congestion, such as taking averages of cost values over individual areas of the placement.

Figure 51:
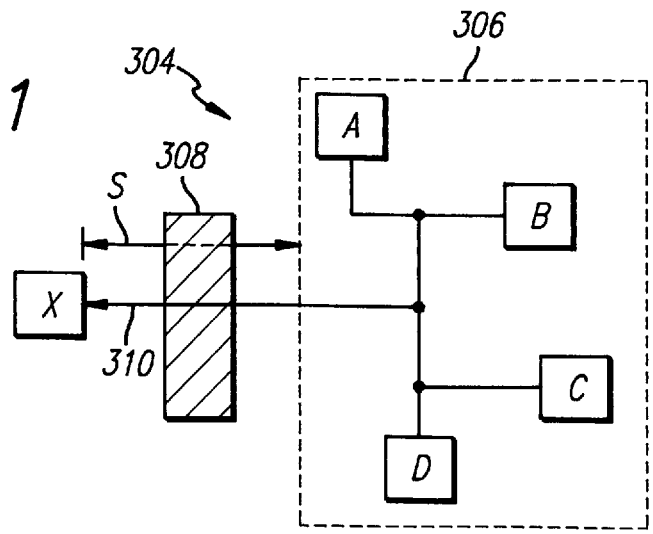
FIG. 51 is a diagram illustrating a method of identifying cells having high interconnect congestion.

In addition, the cost values for individual cells can be modified in accordance with the computed local congestion as illustrated in FIG. 51 to sharpen the contrast between congested and uncongested areas. A cell X is connected to a net 304 that includes additional cells A, B, C and D that are surrounded by a perimeter as indicated in broken line at 306. An area 308 of high congestion is located between the cell X and the cells within the perimeter 306 such that a wire 310 connecting the cell X to the other cells A, B, C and D in the net 304 passes through the congested area 308.

The cost value for the cell X can be modified in several ways in accordance with the invention to reflect its relationship to the congested area 308. For example, the cost value can be increased by a predetermined function of a length S of the wire 310 between the cell X and the perimeter 306. Alternatively, the cost value can be increased by a predetermined value for each congested area that the wire 310 passes through, or by an amount proportional to the size of each congested area.

A congestion reduction algorithm is then applied to the congested areas simultaneously using parallel processors. The algorithm selects cells to be moved based on their individual cost values and proximity to congested areas, and can be considered as comprising "suggestion generators" for suggesting improvements to the placement. For example, the cell in each net that has the highest congestion based cost value can be selected for relocation.

A major objective in improving the placement is to reroute the wiring that passes through congested areas so that it does not pass through these areas. This can be accomplished in accordance with the invention by relocating cells in a number of ways.

Figure 52:
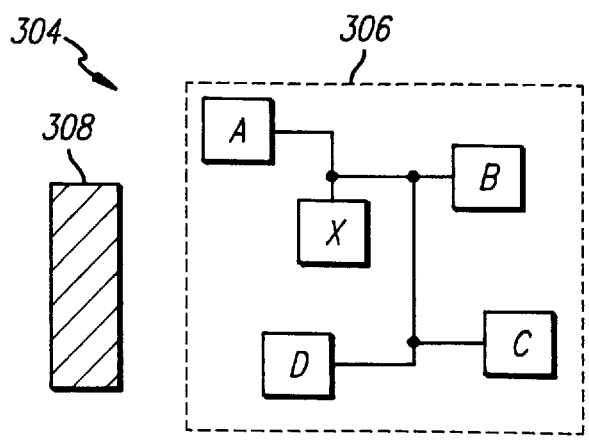
FIG. 52 is a diagram illustrating a method of relocating a cell having high interconnect congestion such that the congestion is reduced.

For example, as illustrated in FIG. 52, the cell X that was initially located outside the perimeter 306 can be relocated inside the perimeter 306. A preferable method of selecting the new location for the cell X is to compute it as being the centroid (center of gravity, mass, area, etc.) of the area enclosed by the perimeter 306 as described above with reference to FIG. 43.

Figure 53:
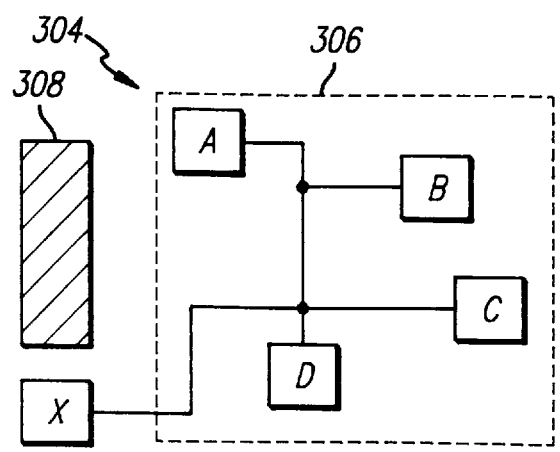
FIG. 53 is a diagram illustrating another method of relocating a cell to reduce interconnect congestion.

Alternatively, as illustrated in FIG. 53, the cell X can be tentatively relocated to a plurality of locations in proximity to its initial location, and the net 304 rerouted for each of the new proposed locations. A suitable location is one in which none of the wiring of the net passes through the congested area 308 or any other congested areas. The new location can be inside or outside the perimeter 306.

It is further within the scope of the invention to perform the congestion reduction operations using alternative algorithms, such as simulated evolution or annealing, or variants thereof.

The computation can be terminated when one such location is identified, or can be optimized by computing the routing for the net 304 that avoids all congested areas and further has minimum total wirelength or other cost parameter. The net routings are preferably performed using a Steiner tree or other suitable algorithm. The present parallel processing methodology enables the rerouting and evaluation for a plurality or all of the proposed new cell locations to be performed simultaneously.

The placement is updated by relocating the selected cells to their new locations. It will be noted that although the cells for relocation can be selected globally as having the highest cost values in the entire placement, it is further within the scope of the invention to divide the cell into contiguous non-overlapping areas, and apply the congestion reduction algorithm to a plurality or all of the areas simultaneously using parallel processors.

The overall fitness of the placement is then evaluated to determine if a predetermined fitness criterion has been attained. If so, this particular phase of the placement optimization is completed.

Preferably, the method illustrated in FIG. 50 is performed on a plurality of initial placements simultaneously in accordance with process decomposition methodology of the invention. The altered placements are then evaluated on the basis of fitness. The most fit placement can be selected and all other placements discarded, with the single selected placement being retained to produce the finished integrated chip design. Alternatively, several of the most fit placements can be subjected to further placement optimization processing operations such as genetic crossover.

If the fitness of the placement has not attained a predetermined value after performing the congestion reduction operations, the steps of identifying the most congested areas and improving the placement as described above are repeated. This procedure can be repeated any number of times until the fitness has been improved to a sufficient extent.

As discussed above, global routing is very time consuming, and it is desirable to perform it only when absolutely necessary. This is made possible in accordance with the method of the present invention, while still improving the fitness of a placement in a progressive manner.

Each cell that is relocated without performing global rerouting creates an error in the initial global routing that was processed to obtain the placement congestion information. A corresponding error is therefore created in the congestion mapping. A certain amount of error can be tolerated, as long as the error is not compounded to such an extent that the accuracy of the congestion mapping is unacceptably degraded and the congestion reduction operations do not produce effective results, and/or the system begins to exhibit oscillatory behavior.

The error can be acceptably managed by estimating the effect of the error on the congestion mapping, and performing a new global routing when the error is determined to have exceeded a predetermined level. This enables a number of iterations of congestion reduction and evaluation to be performed before a global rerouting is necessary, thereby substantially reducing the time required for performing the processing.

The cumulative effect of the error will differ in accordance with each particular application, and is preferably evaluated and estimated empirically. In a case in which the chip is divided into contiguous areas that are subjected to simultaneous congestion reduction processing, a separate error estimate can be computed for each area, and a global rerouting performed when any of the estimates exceeds a predetermined value.

10. Moving Windows

As discussed above, the time required to perform a fitness calculation increases with the size of the cell placement, and the number of fitness calculations required per generation increases with the size of the population. The number of generations required to reach a solution increases with the size of the population.

Thus, the computation time increases rapidly with problem size. Taking the memory requirements and computation time together, the computational requirements increase very rapidly with problem size.

This problem is overcome in accordance with the present invention by decomposing various aspects of the physical design problem into tasks that can be performed simultaneously using parallel processors in the manner described above with reference to FIGS. 9 to 12. A particularly advantageous application of the present method is to divide a placement into a plurality of areas or "windows" that constitute subsets of cells of the complete placement, and process these areas simultaneously using parallel processors. For example, different areas of the placement can be optimized simultaneously using simulated evolution or annealing, etc.

Optimal placement of the cells within each window depends on having the "correct" set of cells assigned to each window. In addition, some of the cells will have connections to cells outside its own window that will affect the placement of these cells within the window.

While a constructive placement or other algorithm can be used to provide a good partitioning of cells into windows and a good initial placement, it will not be perfect. Mechanisms must be provided to iterate toward the solution while exchanging cells and updated cell placement information between the windows.

Figure 54:
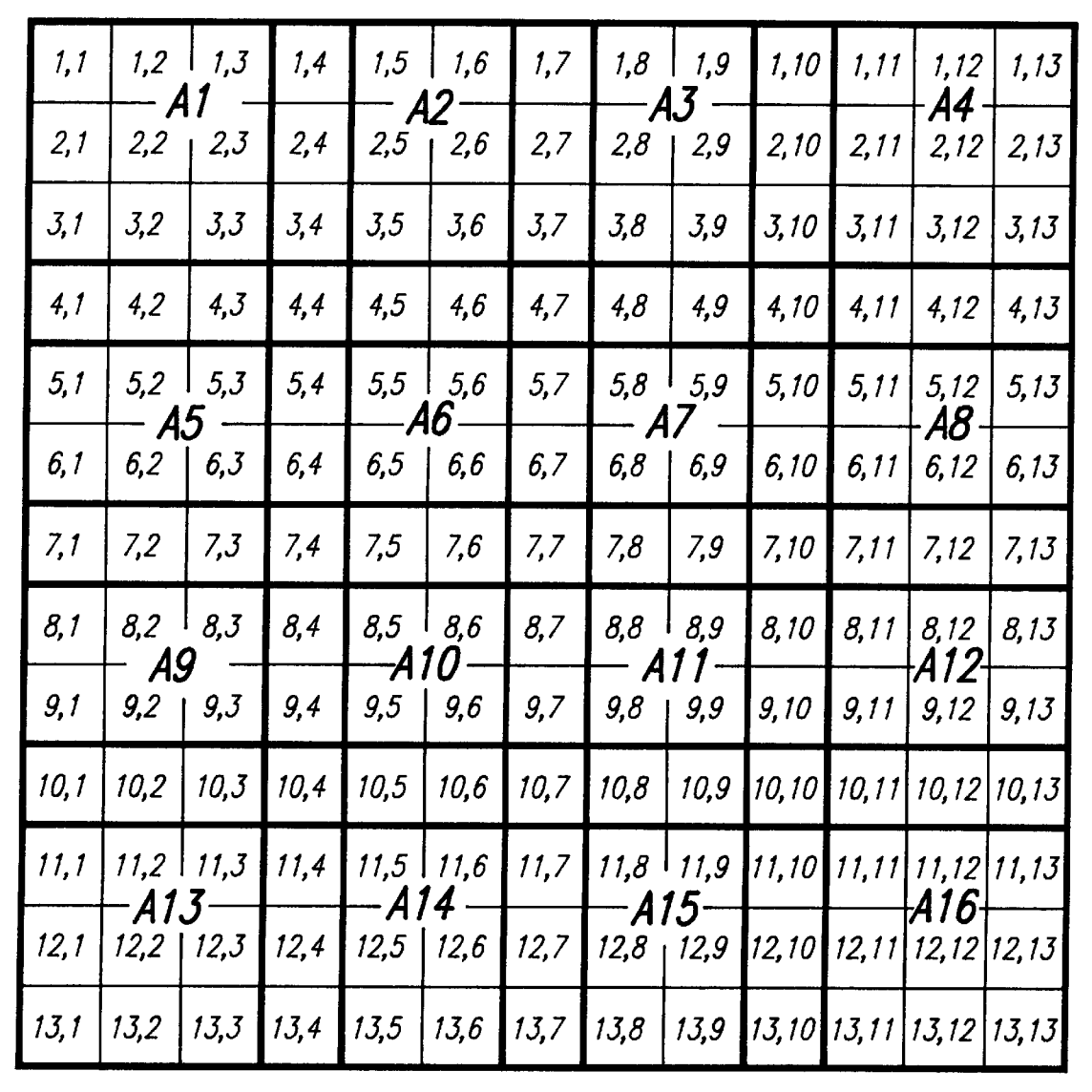

A first method of accomplishing this goal is illustrated in FIGS. 54 to 56. An exemplary placement is shown that consists of a matrix of 169 cell locations arranged in a 13×13 matrix. A method of practicing the invention using a single processor and a single window is illustrated in FIG. 54, whereas a multiple window and multiprocessor version of the method is illustrated in FIGS. 55 and 56.

As illustrated in FIG. 54, a window A is defined as being constituted by an area equal to a 4×4 matrix of cell locations of the placement. Although the numbers of rows and columns of the placement and the window are illustrated as being equal, the invention is not limited, and it is only necessary that the window be smaller than the placement.

The window A is successively moved to locations on the placement as indicated at A1 . . . A16, and a fitness improvement operation such as simulated evolution, mutation, simulated annealing, etc. is performed on the cells delineated by the window at each location. For example, in the location A1, a subset of cells of the placement includes the cells 1,1 . . . 4,4. The locations to which the window A is moved are selected such that each cell of the placement is delineated by the window A and the improvement operation is performed on each cell at least once.

In addition, the window locations are selected so that there will be overlap between the subsets of cells delineated by the window A in adjacent locations. The length of an edge of the placement is designated as $N=13$, whereas the length of an edge of the window A is designated as $M=4$, where $M<N$.

The window A is moved from the initial location A1 rightwardly by three cell locations ($M-1$), or one location less than the edge length M of the window. From the location A4, the window A is moved downwardly by $M-1=3$ cell locations, and leftwardly to the left edge of the placement. The window A is then moved rightwardly in increments of $M-1 = 3$ as before. This pattern is repeated until the window A has been moved to the location A16.

The pattern described and illustrated with reference to FIG. 54 is a rectilinear raster type scan pattern. However, the invention is not so limited, and the window A can be moved in any desired manner as long as each cell is subjected to the fitness improvement operation at least once and there is overlap between adjacent window locations and the subsets of cells delineated thereby respectively.

In the illustrated example, there is an overlap of one row or column of cell locations between each adjacent window location A1 to A16. For example, in the window location A2, the subset of cells that is delineated consists of 1,4 . . . 4,7. The window locations A1 and A2 overlap in the fourth column of the placement, such that the cell locations 1,4, 2,4, 3,4 and 4,4 are common to or overlapped in the window locations A1 and A2.

The overlap is greater for the window locations in the central portions of the placement. Taking, for example, the window location A6, all but the four cells 5,5, 5,6, 6,5 and 6,6 in the central portion of the window location A6 overlap the adjacent window locations in the opposite respective directions by one row or column position.

During the optimization fitness processing of the subset of cells delineated by the window A in each respective location, cells which are misplaced or "do not belong" in that window location will move to the outside edges of the window A. As the window A is incrementally stepped or "marches" across the placement, the misplaced cells will be in the overlapping rows and columns and will move across the placement to their optimal locations. After successive iterations, the location of each cell approaches its optimum and the cells to which it is connected in the net can then be placed in their optimum locations.

The single window and processor variation of the invention illustrated in FIG. 54 can be advantageously employed in applications in which only one processor is available, and it does not have sufficient capacity to process an entire cell placement. However, the method is preferably implemented using a plurality of processors, each operating on a subset of cells in a respective window.

As illustrated in FIG. 55, four windows A, B, C and D are moved to initial locations designated as A1, B1, C1 and D1, and the respective subsets of cells delineated by the windows A, B, C and D in these locations are simultaneously processed for optimization of the cell placement using any of the algorithms or methods described above.

The windows A, B, C and D are then moved to rightwardly by three cell locations to window locations A2, B2, C2 and D2 as illustrated in FIG. 56, and the subsets of cells delineated by the windows A, B, C and D in these positions are processed. Although not specifically shown, the windows A, B, C and D are then moved downwardly by three cell locations, to the left by three cell locations, and then upwardly by three cell locations to cover the entire placement.

Since M=13, N=3, and each window movement is M−1= 3, the subsets of cells delineated by the windows A, B, C and D overlap in the manner described above with reference to FIG. 54. However, the use of multiple windows (as many as hundreds or thousands of windows and respective processors can be employed in a practical application) include an increase in processing speed and a reduction of processor capacity in proportion to the number of windows.

Although the windows A, B, C and D in the examples of FIGS. 55 and 56 are moved across the placement in a predetermined raster pattern, it is further within the scope of the invention to move one or more non-overlapping windows to locations that are selected in accordance with a predetermined criterion.

In a preferred form of the invention, the interconnect congestion of a cell placement is measured using the congestion based cost function method described above, by performing a global routing or by other means. The areas of highest congestion are identified, and windows are moved over the congested areas. The congested areas are then processed preferentially.

This provides localized optimization of problem areas or "hot spots" of a placement on a priority basis, and can substantially accelerate convergence to the optimal placement. The two methods are not mutually exclusive, and can be preferably used alternately. For example, the raster method described with reference to FIGS. 55 and 56 can be performed first, and then the congested areas can be identified and windows moved over them for subsequent preferential optimization processing.

Figure 57:
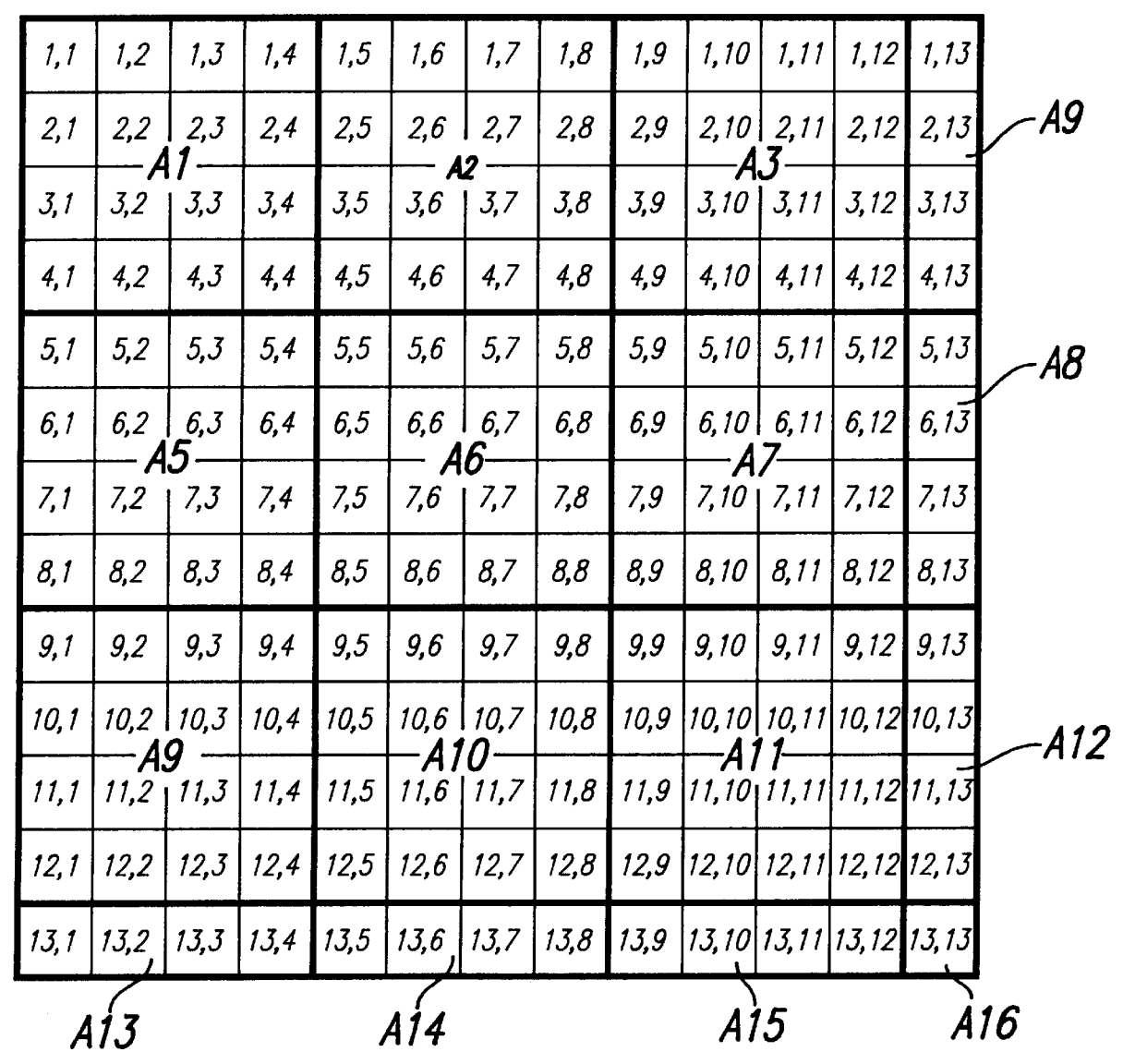
Figure 58:
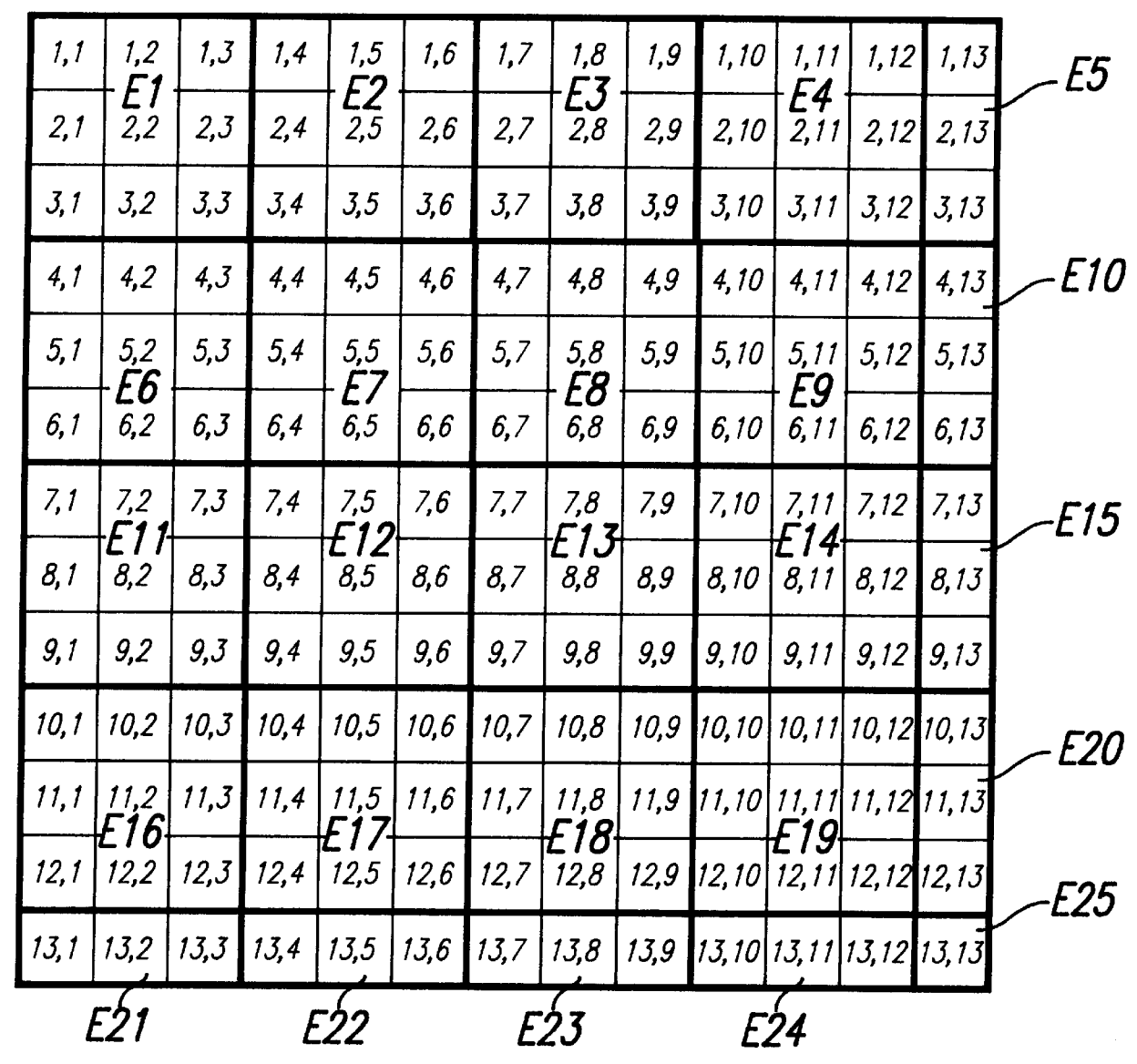

A second method of cell placement improvement using moving windows in accordance with the present invention is illustrated in FIGS. 57 to 59. In this case, the placement is first processed using contiguous window locations A1 to A16 as illustrated in FIG. 57. This can be performed using a single moving window, or using two or more windows and respective processors. Since there is no overlap between adjacent window locations, the entire processing can be accomplished simultaneously using 16 processors.

The edge length M=4 of the window in FIG. 57 is not an integral fraction of the edge length N=13 of the placement. For this reason, the window locations A4, A8 and A12 to A16 on the right and lower edges of the placement consists of less than 16 cell locations. However, the invention is not so limited, and it is within the scope of the invention to have each window location consist of 16 cell locations. For example, although not specifically illustrated, the window location A4 could consist of the 16 cell locations 1,10 . . . 4,13, rather than the four cell locations 1,13, 2,13, 3,13 and 4,13 as shown.

The size of the window used in the example of FIG. 57 is M=4, as in the example of FIGS. 55 to 56. In the second step of the method of FIGS. 57 to 59, the placement is again processed using a window having a different size. As shown in FIG. 58, a window having edge length of L=3 (an area of 9 cell locations) is employed for processing the placement.

The window locations, designated as E1 to E25 in FIG. 58, are contiguous, with the window locations at the left and lower portions of the placement consisting of less than 9 cell locations. However, a different arrangement in which all window locations consist of 9 cell locations can be provided as described above with reference to FIG. 57.

The exchange of cells between windows and movement of cells to their optimal locations is accomplished by overlap between the different sized windows as illustrated in FIG. 59. In the illustrated example as illustrated in FIG. 59, the window location E2 overlaps the window location A1 for cell locations 1,4, 2,4 and 3,4. The window location E6 overlaps the window location A1 for cell locations 4,1, 4,2 and 4,3.

For the window locations in the central portions of the placement, each window location of the M=4 window of FIG. 57 will be overlapped by window locations of the L=3 window of FIG. 58 as described above with reference to FIG. 54.

The values of M, L and N can be varied over a wide range in accordance with the present invention. As a general rule, L should not be an integral fraction of M, as this would not enable overlap between the two sets of windows. However, even this limitation can be overcome by offsetting the two sets of window locations such that their edges do not coincide.

Figure 60:
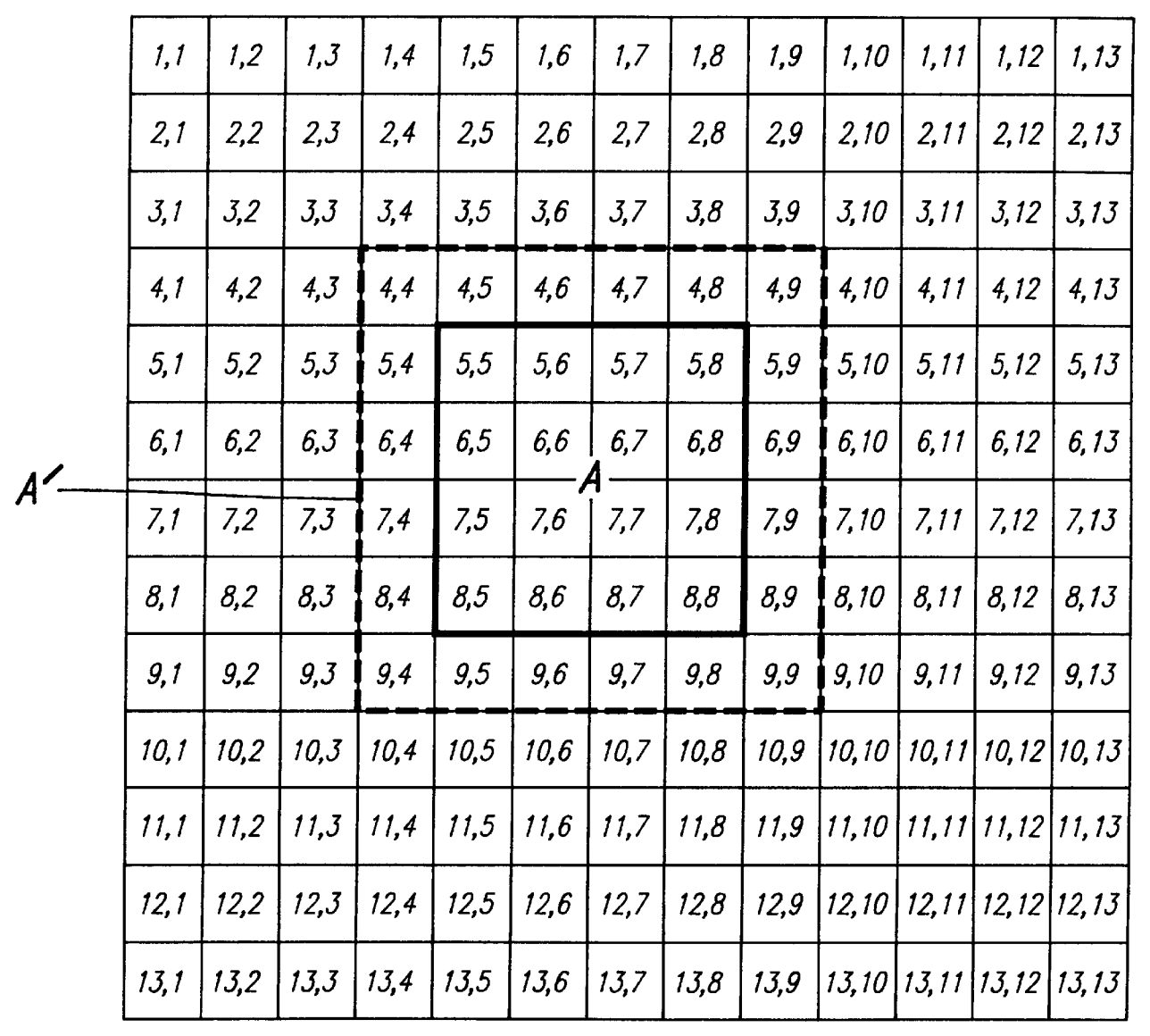

A third method of cell placement optimization or improvement processing is illustrated in FIGS. 60 and 61. Although only a single moving window is shown for simplicity of illustration, the invention is not so limited, and the method can be and is preferably practiced using a plurality of windows for simultaneously processing respective subsets of cells of the placement that are delineated thereby.

As illustrated in FIG. 60, a window A is moved in a raster pattern or in accordance with a prioritization based on interconnect congestion or the like to different non-overlapping locations on the placement. The size of the window A is M=4, such that the area of the window A is 16 cell locations as in the examples above. Optimization or improvement processing is performed on the subset of cells delineated by the window A, in the illustrated example on the cells in locations 5,5 . . . 8,8.

Another window A' is defined that circumscribes and moves integrally with the window A. The window A' has an edge length of P=M+2 cell locations, and an area of 6×6=36 cell locations.

In accordance with the invention, a border area A–A' is defined outside the periphery of the window A and inside the periphery of the window A' that consists of 20 cell locations 4,4, 4,5, 4,6, 4,7, 4,8, 4,9, 5,4, 6,4, 7,4, 8,4, 5,9, 6,9, 7,9, 8,9, 9,4, 9,5, 9,6, 9,7, 9,8 and 9,9. The optimization or improvement computing or processing means is adapted to process the cells delineated by the window A within the area of the window A'. In other words, the optimization is performed using a larger area than the subset of cells delineated by the window A originally occupied. The processing window can be considered as being "expanded".

During processing, the cells having the worst placement in the window A are moved into the border area A–A'. These cells can be considered as misplaced or "garbage" cells, and have optimal locations somewhere in the placement outside the windows A and A'.

These cells are put on a misplaced cell list or "garbage list" as illustrated in FIG. 61. Equating, for example, cell designations and cell locations, the garbage list for the arrangement illustrated in FIG. 60 consists of the cells 4,4, 4,5, 4,6, 4,7, 4,8, 4,9, 5,4, 6,4, 7,4, 8,4, 5,9, 6,9, 7,9, 8,9, 9,4, 9,5, 9,6, 9,7, 9,8 and 9,9.

After a subset of cells delineated by a window is processed, or alternatively after the entire placement is processed, an attempt is made to relocate the cells in the garbage list to acceptable new locations in the placement.

A preferred method of selecting a new location for a cell on the garbage list is to compute the location of the centroid of the net to which the cell is connected. For the purposes of the invention, the term "centroid" is defined as a general term that can alternatively specify center of mass, center of gravity, center of force, etc. An example of computing the center of gravity of a net was described above with reference to FIG. 43.

If the calculated new location does not already have a cell in it, the garbage cell is moved to the new location and included in subsequent optimization processing. If the calculated location is not vacant, the placement attempt fails, and the garbage cell remains on the garbage list and is not included in subsequent optimization processing.

A modified method of attempting to relocate a cell from the garbage list to the placement is to determine if a window delineating the calculated cell location has any vacant cell locations, and if so, moving the garbage cell into the most suitable vacant cell location. If cells remain on the garbage list after the entire placement has been processed, an alternative method for placing these cells can be employed, such as using a Steiner tree or detailed routing algorithm and feeding back the results to the placement process.

Whether or not an attempt to move a cell from the garbage list to a new location in the placement is successful, the calculated new location of the cell is used in calculating new locations for other cells on the garbage list. The location data can be updated after each attempt at cell relocation, after each subset of cells in a respective window is processed, after the entire placement is processed, or at any other suitable interval.

11. Chaotic Placement

FIG. 62 illustrates another method of cell placement optimization in accordance with the present invention. Although the method can be practiced serially using a single processor, it is preferably performed using a plurality of parallel processors in accordance with the process decomposition described above with reference to FIGS. 6 to 8 and the fail-safe headware methodology described with reference to FIGS. 9 to 12.

As illustrated in FIG. 62, a net 312 that constitutes a subset of a placement of cells includes a cell X in a current or initial location 314, and cells A to F that are interconnected with the cell X in the net 312. It will be noted that a netlist for the placement includes all of the nets and the cells that are interconnected thereby respectively. With the cell X in the initial location 314, the cell interconnect congestion and fitness of the placement are assumed to be less than optimal.

The fitness of the placement is improved in accordance with the present method by relocating at least some of the cells to more suitable locations. This is done for each cell that is to be relocated by computing a location 316 of a centroid CG of the other cells in the net 312 and any other nets to which the cell X is connected. For the purposes of the invention, the term "centroid" is defined as a general term that can alternatively specify center of gravity, mass, force, area, etc.

It is within the scope of the invention to move the cell X directly to the centroid location 316. However, the effectiveness of the method is enhanced by introducing a variable parameter lambda $\lambda$, and multiplying the distance S between the initial location 314 and the centroid location 316 by $\lambda$.

The cell X is then moved from the initial position 314 toward the centroid location 316 by a distance $\lambda$S, such that the distance of movement is proportional to the distance S. If $\lambda=1$, the cell X will be moved exactly to the centroid location 316. If $\lambda$ is less than unity, the cell X will be moved to a location 318 between the initial location 314 and the centroid location 316 as indicated at CG1. If $\lambda$ is greater than unity, the cell X will be moved beyond the centroid location 316 to a location 320 as indicated at CG2.

The value of $\lambda$ is selected such that the cell relocation operations will cause the placement to converge toward an optimal configuration with maximum effectiveness. The factor $\lambda$ is characterized as a "chaos" factor because as its value is increased, the placement optimization progressively diverges. A certain amount of chaos is necessary to prevent entrapment of the process at local fitness optima. However, if the chaos factor $\lambda$ is too high, the process will diverge into a chaotic state in which the results become non-optimally random.

For orthogonal cell placement arrangements, it has been determined experimentally that an optimal solution can be achieved for values of $\lambda$ between 0 and 1.5, more preferably between 0.5 and 1.5.

The present method of placement optimization can also be viewed using the theory of Cellular Automata (CA). The placement is represented as a 2D lattice, with each cell modelled by a finite-state automaton (FSA). The inputs to the FSA are the locations of neighboring cells and the locations of the cells to which the cell is connected through the netlist.

Each FSA consists of a cell state (current location), an input alphabet (positions of neighboring cells), and a transition function $\lambda$S by which the move to the next location is computed. The CA model is executed for a series of iterations.

The dynamic behavior depends on the transition functions for the FSA and the parameter λ, which determines how far a cell will move during each iteration. For small values of λ, the system changes slowly and in some circumstances can become stuck, or "frozen" in a particular state. For moderate values of λ, the system will converge toward a low energy state. For large values of λ, the motion of the cells is chaotic and the system tends toward ever higher energy states.

FIG. 63 illustrates how the centroid, in this case the center of gravity or "gravity point", is computed as the first step in determining the location to which a cell is to be moved. The center of gravity computation is illustrated for two cells, A and B, that are at locations 322 and 324 respectively.

The location 322 of the cell A is represented in an orthogonal system of x and y coordinates as x1,y1, whereas the location 324 of the cell B is represented as x2,y2. The x component of a location 326 of the center of gravity CG of the cells A and B is computed as the average of the x components of the locations 322 and 324, more specifically as (x1+x2)/2. The y component of the center of gravity CG is computed as the average of the y components of the locations 322 and 324, more specifically as (y1+y2)/2.

Although the computation for only two cells is illustrated in FIG. 63, it will be understood that the operation can be generalized for a net comprising any number of cells.

The centroids and values of λS are generally computed as continuous analog values in accordance with the invention. These analog values can be used per se, or can alternatively be rounded off to integer values corresponding to increments of the spacing between adjacent cell locations such that each new computed location corresponds exactly to a cell location of the placement. In the latter case, the optimization will tend to freeze at local fitness optima for values of λ less than unity, but will converge faster than in an application in which the analog values are used for values of λ greater than unity.

The basic method described above does not result in a placement in which each location is occupied by a single cell. Some locations can contain more than one cell, whereas other locations can be vacant. This is because the method does not take into account the fact that a newly computed location may already be occupied by one or more cells.

For this reason, another operation is performed to distribute the cells into the respective locations such that each location is occupied by one cell.

Assuming an orthogonal x,y coordinate system, the cells are first sorted in ascending order of their x coordinates. The sorted cells are then equally divided into a number of groups, with the number of groups being equal to the number of columns (extending in the y direction) of cell locations, with each group being assigned to a respective column.

The cells in each group are then sorted in ascending order of their y coordinates, and distributed in this order into the cell locations of the columns respectively. In this manner, the cells are distributed into locations that are substantially closest to the locations that the cells occupied upon completion of the basic chaotic placement method.

The steps of the present method can be practiced in various ways within the scope of the invention. For example, the method can be performed using a single processor, such that one cell is relocated during each incremental operation. Preferably, however, a plurality of cells are relocated simultaneously using parallel processors.

The new location for each cell can be made available immediately for computing the centroid of the net to which the cell is connected for the purpose of relocating the other cells in the net. Alternatively, the initial locations can be used for relocating all of the cells in a net, for relocating an alternative grouping of cells, or for relocating all of the cells in the placement.

Although the latter version of the method is not entirely accurate as it can utilize cell locations that no longer exist, it is considerably faster than the former version since the number of computations is significantly reduced.

These two alternatives are not mutually exclusive, and can be used in combination. For example, a subset of the cells of the placement can be relocated without using their new locations in the centroid calculations. Then, the locations can be updated and another subset of cells relocated using the new locations.

Each iteration of the method can involve relocating a single cell, a plurality of cells or all of the cells in the placement. Criteria by which individual cells or groups of cells can be selected for serial or parallel relocation include:

1. The cells constituting each net can be relocated as a group.
2. The placement can be partitioned into units consisting of rows, columns or blocks of cells.
3. Cells can be selected at random without replacement (each cell is randomly selected only once).
4. Cells can be selected at random with replacement (each cell can be selected once, more than once or not at all).
5. Cells can selected in an order that is random, but is the same for each iteration.

The number of iterations by which the method is performed can also be selected in accordance with a number of criteria, including:

1. The method can be performed a predetermined number of times (iterations).
2. The fitness of the placement can be computed after each iteration, preferably using the congestion based cost function methodology described above. The method is repeated until the fitness reaches a predetermined value.
3. The method can be repeated until the iteration just completed has not changed the fitness by more than a predetermined value (the operation has frozen in a particular state).

The present chaotic placement method can be enhanced by modifying the basic algorithm to include the effects of cells in locations proximate to the initial location of a cell that is to be relocated, or to include the effects of all other cells in the placement.

This spreads out clumps of cells so that the density of cells is more uniform throughout the placement. The attraction between cells in the nets is balanced against repulsion caused by a high local cell density, providing an optimized tradeoff of wirelength, feasibility and congestion.

Figure 64:
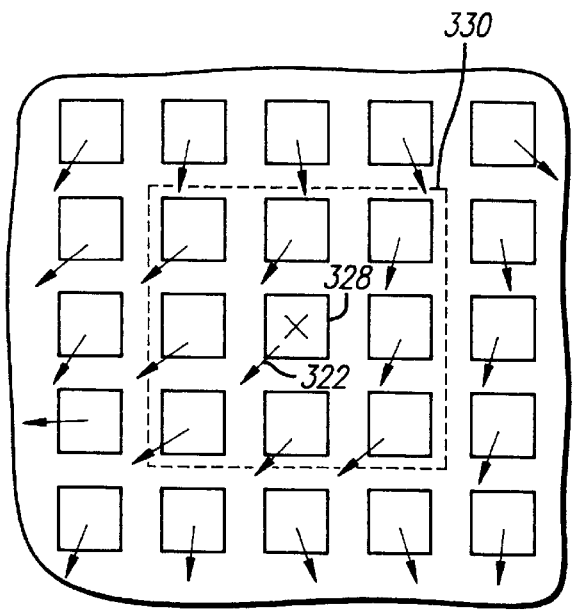
FIG. 64 is a diagram illustrating how the method of FIG. 62 can be modified to include the effects of a density gradient.

A first methodology for accomplishing this goal is illustrated in FIG. 64, assuming that a cell X is initially placed at a location 328. A cell density gradient is then computed for the cells in a predetermined pattern 330 proximate to the location 328, such as enclosed in a dashed line. The density gradient represents the local density of cells in the placement.

The density gradient for each cell location includes a magnitude, and a direction of decreasing density as indicated by a vector 332. Similar vectors are illustrated for the other cell locations in FIG. 64.

The magnitude of the density gradient at each cell location can be easily computed as being equal to the number of cells at the respective location. The decreasing density direction is computed using any of a number of known weighted or unweighted averaging functions, taking into account the cells in the pattern and their distance from the location 328.

Using the modified method of FIG. 64, each cell is moved toward its calculated centroid by the distance λS, and also by an offset corresponding to the computed density gradient. These two movements can be calculated and applied individually, or can be produced as a composite function resulting from the centroid computation and the density gradient computation. In either case, the movement corresponding to the density gradient is made in the decreasing density direction, and by a distance proportional or otherwise suitably related to the magnitude of the density.

Figure 65:
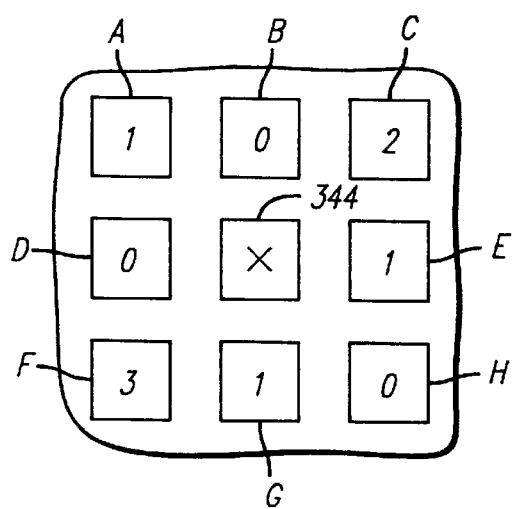
FIG. 65 is a diagram illustrating how the method of FIG. 62 can be modified to include the effects of forces resulting from other cells in the placement.
Figure 66:
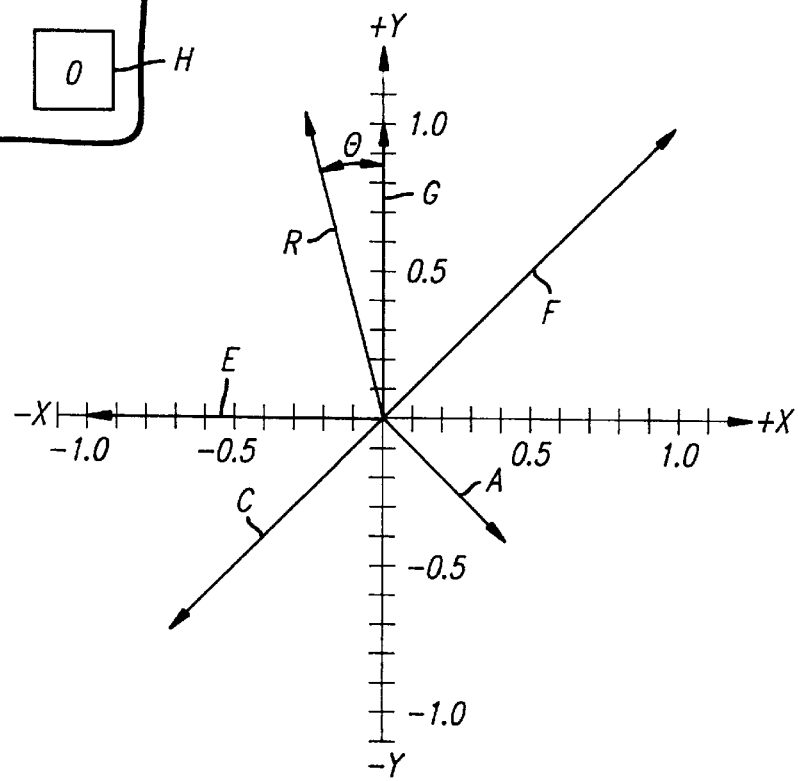
FIG. 66 is a vector diagram illustrating the method of FIG. 62.
Figure 67:
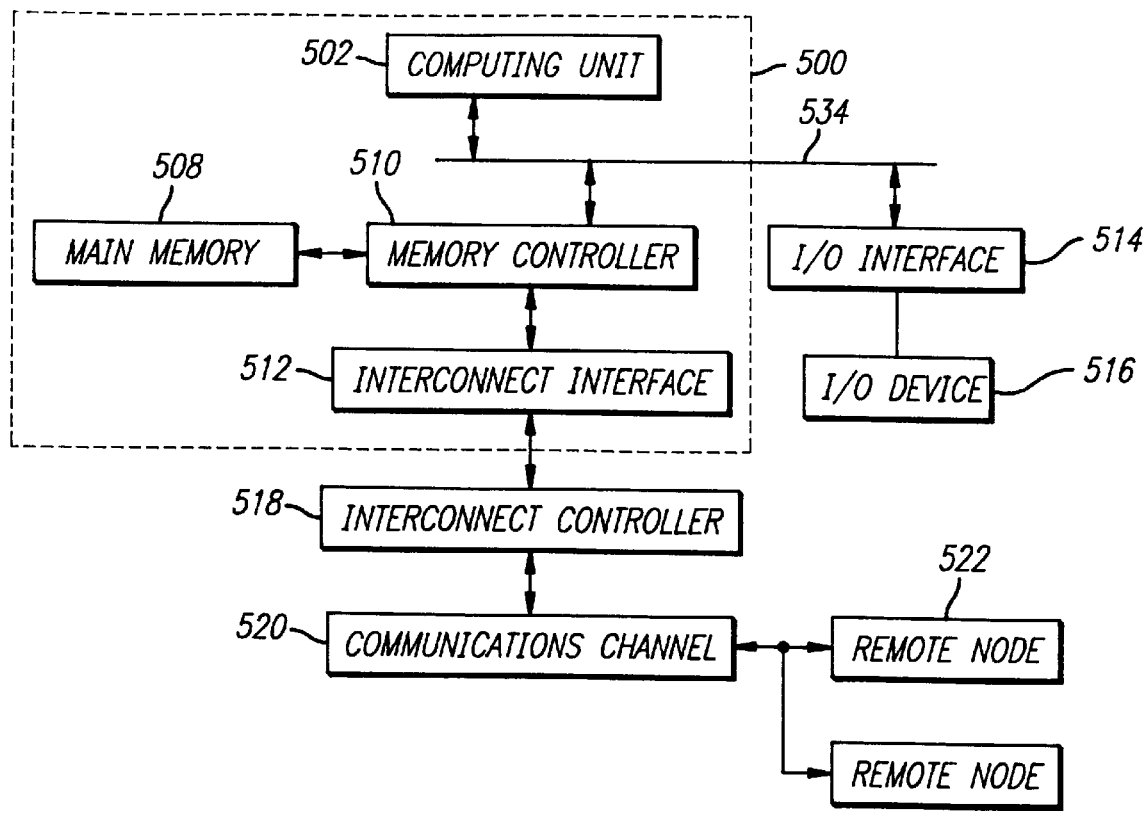
FIG. 67 is a block diagram illustrating a single chip integrated circuit Distributed Shared Memory (DSM) node of the present invention.

The centroid computation can also be offset by a function based on a simulated net force that is exerted on each cell by proximate cells, or by all of the other cells in the placement as illustrated in FIGS. 65 and 66. The net force is preferably a simulated electrostatic force based on the assumption that each cell is a charged particle having a unit electrostatic charge, although the invention is not so limited, and any suitable function can be utilized to offset the centroid computation based on the distribution of cells in the placement.

FIG. 65 illustrates an exemplary subset of nine cell locations, including a central cell location 334 and eight cell locations A to H that surround the location 334. The simulated net repulsive force exerted on a cell in the location 334 by the cells in the locations A to H is based on the inverse square law of electrostatics, such that the repulsive force F between two charged particles of the same electrostatic polarity is given as $F=(Q1 \times Q2)/R^2$, where Q1 and Q2 are the electrostatic charges of the particles and R is the distance therebetween.

The location 334 may be occupied by more than one cell. However, the method is preferably applied to each cell in the location 334 individually. Therefore, the net force is a function only of the cells in the locations A to H. The cells in the location 334 are considered as repelling each other.

In the illustrated example, the locations A to H contain numbers of cells as follows: A=1; B=0; C=2; D=0; E=1; F=3; G=1; H=0. The vacant locations B, D and H do not have any effect on the cell or cells in the location 334. Alternatively, an empty location may exert an attractive force toward a cell.

It will be assumed that each cell has a unit charge (Q1=Q2=1), and that the distance between orthogonally adjacent cells is unity (R=1). The force between two cells in orthogonally adjacent locations is therefore F=1/1=1.

The distance between two cells in diagonally adjacent locations is $1 \times 2^{1/2}$. The force between two cells in diagonally adjacent locations is therefore $1/(2^{1/2})^2 = 1/2$. The magnitude of each of the x and y components of this force is $1/(2 \times 2^{1/2}) \approx 1/2.83 \approx 0.35$.

FIG. 66 is a vector diagram illustrating the forces acting on a cell X in the location 334, in which the vectors are designated by the reference characters A to H corresponding to the respective cell locations.

The location A contains one cell. The force exerted on the cell X in the location 334 by this cell has an x component with a magnitude of 0.35 that acts rightwardly, and a y component with a magnitude of 0.35 that acts downwardly as illustrated.

The location C contains two cells, so that the force is twice that of the single cell in the location A. The force of the two cells in the location C has an x component with a magnitude of 0.7 that acts leftwardly, and a y component with a magnitude of 0.7 that acts downwardly.

The location E contains one cell, and is orthogonally adjacent to (rightward of) the location 334. The force exerted by this cell has a magnitude of 1.0 and acts leftwardly.

The location F contains three cells, so that the force is three times that of the single cell in the location A. The force of the three cells in the location F has an x component with a magnitude of 1.05 that acts rightwardly, and a y component with a magnitude of 1.05 that acts upwardly. The location G contains one cell, and exerts a force with a magnitude of 1.0 in the upward direction.

The resultant of these forces, or the net force exerted on the cell X in the location 334, is designated as a vector R, and has a magnitude of 1.09, and is displaced by an angle θ=16.7° counterclockwise from the positive y axis.

The movement of the cell X from the location 334 is a combination of the movement computed using the centroid calculation, and a movement based on the net force vector R. The latter movement is made in the direction of the net force vector R, and by a distance that is proportional to the magnitude of the vector R or computed in accordance with another suitable function of the magnitude of the vector R.

Although the simplified example of FIGS. 65 and 66 includes only eight cell locations that surround a single cell location, the invention preferably in actual practice computes a net force based on a larger number of cell locations, or all of the cell locations in the placement, using the same principle, or just cells in the neighborhood to reduce computational complexity.

The invention is further not limited to the particular functional computation that was described with reference to FIGS. 65 and 66. For example, the x and y force components can be computed as being inversely proportional to the distance between two locations, rather than inversely proportional to the square of the distance. It is further within the scope of the invention to calculate the offsets as functions of simulated attractive, rather than repulsive forces.

Another function that can be utilized to calculate the x and y force components is given as:

$$Fx = \sum_{i=1}^{n} \frac{dx}{[\max|dx_i| \vee \max|dy_i|]^3} \text{ and}$$

$$Fy = \sum_{i=1}^{n} \frac{dy}{[\max|dx_i| \vee \max|dy_i|]^3}$$

where Fx and Fy are the x and y net force components; n is the number of cell locations that affect a cell to be relocated; dx and dy are the x and y distances between the location of the cell to be relocated and a cell for which the force is being computed; and $dx_i$ and $dy_i$ are the x and y components of the distances between the location of the cell to be relocated and the cells in the locations that affect the cell to be relocated. In the denominator of the equations, the number that is cubed is the maximum value of $dx_i$ or $dy_i$, whichever is larger.

12. Distributed Shared Memory Implementations a. Single Chip Processor Node

FIGS. 67 to 70 illustrate a single integrated circuit chip DSM processor node 500 of the present invention. A plurality of the nodes 500 can be interconnected to implement the functionality of the DSM architecture 136 illustrated in FIG. 9, or the entire architecture 136 can be implemented in a single node 500.

Figure 68:
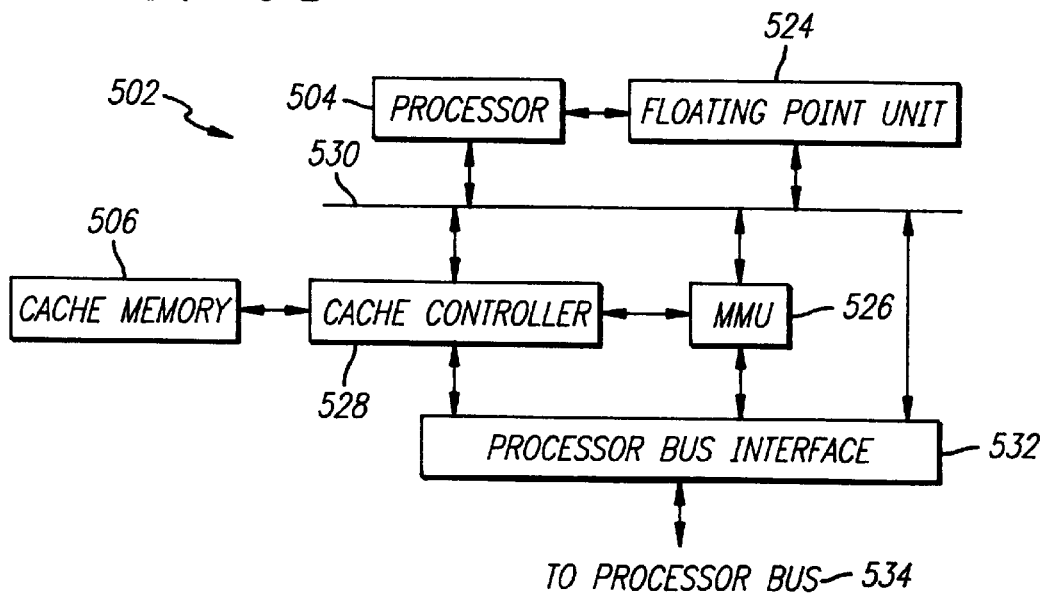
FIG. 68 is a block diagram illustrating a computing unit of the present DSM node.

The node 500 comprises a computing unit 502 that includes, as shown in FIG. 68, a processor 504 and a cache memory 506. The node 500 further includes a main memory 508, a memory controller 510 and an interconnect interface 512.

Further illustrated are an input-output (I/O) interface 514 for connecting the node 500 to an I/O device or peripheral 516 such as a keyboard, monitor, disk drive, video camera, A/D or D/A converter, framebuffer, printer, etc. An interconnect controller 518 connects the node 500 to a remote node 522 via a communications channel 520. The units 514 and 518 are preferably integrated onto the same chip as the node 500, but can be separate therefrom within the scope of the invention.

The processor 504 is selected to have a relatively simple functionality, such as Reduced Instruction Set Computer (RISC), and is therefore inexpensive to fabricate and occupies a small area on the chip. The invention is not so limited, however, and the processor 504 can be implemented by any suitable type of general purpose CPU, or a special purpose processor such as graphics, disk controller, Direct Memory Access (DMA) controller, etc. It is yet further within the scope of the invention to replace the processor 504 with a simple logic element such as a shift register.

Although having simple functionality, the processor 504 can still implement a full general purpose modern RISC architecture with 32-bit, 64-bit, or greater addressing and virtual memory capability, which allows the node 500 to be used in the construction of very large machines for solving very large problems.

The cache memory 506 is implemented in Static Random Access Memory (SRAM) to provide the required access speed, whereas the main memory 508 is implemented in low cost Dynamic Random Access Memory (DRAM). The memory controller 510 interconnects and maintains memory coherency between the processor 504, cache memory 506, and the memory in the remote node 522. It will be noted that although only a single computing unit 502 is illustrated in the drawing, the scope of the invention includes providing multiple computing units in the node 500 that share the main memory 508.

The number of remote nodes 522 is similarly unrestricted. The nodes 522 can be similar to the node 500, or can be of different types as long as they are capable of communicating with the node 500 using the communications channel protocol. The channel 520 can be serial and/or parallel, and include transceivers for electrical and/or optical interconnections.

The memory controller 510 controls access to the cache memory 506 and the main memory 508. The interconnect interface 512 converts memory access instructions (read and write commands) from the processor 504 for accessing data stored in a memory (not shown) in the remote node 522 into memory access references or messages that are transmitted by the interconnect controller 518 to the remote node 522 over the communications channel 520 in the form of data packets.

In response, the remote node 522 performs the requested operation and sends a suitable message back to the node 500. For a read instruction, the message includes the requested data. For a write instruction, the message includes a block identifier and/or memory address for the data which was stored.

The interconnect interface 512 performs the reverse operations in response to memory access messages received from the remote node 522. In response to a read message, the memory controller 510 retrieves the requested data from the cache memory 506 or the main memory 508, and the interface 512 sends a message including the data to the remote node 522. In response to a write message, the memory controller 510 stores the included data in the cache memory 506 or the main memory 508, and sends a message to the remote node including a block identifier and/or memory address for the data that was stored.

It will be noted that the present invention is not limited to the particular illustrated configuration. For example, the node 500 can include only a single cache coherent memory, or more than two cache coherent memories. As yet another alternative, the interconnect interface 512 can be modified to provide communication in only one direction, such as in a ring network arrangement (not shown).

As discussed above, a conventional multi-chip DSM architecture is too large to be implemented on a single integrated circuit chip. For example, as will be described in detail below, a typical multi-chip DSM architecture requires approximately 1,692 mm$^2$ of chip area, which is much larger than the 256 mm$^2$ area of a conventional 16 mm×16 mm chip.

An important principle of the invention is that, with a DSM node 500 implemented on a single integrated circuit chip as presently disclosed, the capacity of the cache memory 506 can be reduced sufficiently to enable the cache memory 506 and other elements of the DSM node 500 to fit on the chip without reducing the processing speed of the node 500.

Although reducing the capacity of the cache memory 506 increases the cache miss rate, the reduced latency provided by integrating the processor 504 and main memory 508 on a single chip reduces the cache miss resolution time or cost to an extent that compensates for the increased cache miss rate.

In addition, the RISC processor 504 is substantially smaller than a more complicated processor that would be required to provide the same processing speed in a multi-chip DSM implementation, thereby enabling the processor 504 to fit on the chip with the other elements.

The smaller and less expensive processor 504 also increases the number of processors (only one processor 504 is shown) that can be connected to a main memory 508 of predetermined capacity. This increases the number of processors that can simultaneously operate on a problem defined by the main memory space and thereby increases the computational efficiency, and also reduces the amount of main memory that is required for each processor. The ability of the present DSM node 500 to be implemented on a single integrated circuit chip is also enhanced.

More specifically, tens to hundreds of megabytes of main memory are currently used per processor. This ratio balances the cost of processor and memory and is also required to supply enough memory bandwidth for the processor. The high bandwidth available from the present on-chip main memory 508 and the reduced cost of the processor 504 both support a reduction in the amount of main memory per processor. This reduction in the amount of main memory makes it feasible to include the main memory 508 on the same chip as the processor 504.

Using the principles of this invention, as the semiconductor technology continues to advance, multiple DSM nodes 500 can be integrated on a single chip. Because of the increasing signal propagation delay issues with advanced semiconductor technology, the "small and simple" approach to processor, cache, and main memory design will continue to have advantages over the conventional approach.

The unique manner in which the present invention overcomes the problems of the prior art and enables the DSM node 500 to be implemented on a single integrated circuit chip will become more apparent from the following example.

EXAMPLE

An integrated circuit fabrication process is assumed as having the following characteristics.

| Type | CMOS |
| --- | --- |
| Feature size | 0.5 micron |
| Logic density | 2,500 gates/mm$^2$ |
| SRAM density | 2 KB/mm$^2$ |
| DRAM density | 32 KB/mm$^2$ |
| Chip area | 256 mm$^2$ |

The characteristics and chip areas for the present single-chip node 500 and a conventional multi-chip node having comparable performance are given below.

| | ITEM | MULTI-CHIP | SINGLE-CHIP |
| --- | --- | --- | --- |
| 1. | Processor | | |
| | Logic | 250 K gates | 80 K gates |
| | Cache memory | 1 MB | 32 KB |
| | Main memory | 32 MB | 4 MB |
| | Clock speed | 200 MHz | 300 MHz |
| | Clocks/instruction | 0.8 | 1.2 |
| | Cache miss cost | 400 ns | 60 ns |
| | Cache miss rate | 1.5% | 4.3% |
| | Processing speed | 85 MIPS | 144 MIPS |
| 2. | DSM logic | 200 K gates | 200 K gates |
| 3. | Total logic | 450 K gates | 280 K gates |
| 4. | Chip Area | | |
| | Logic | 180 mm$^2$ | 112 mm$^2$ |
| | Cache memory | 512 mm$^2$ | 16 mm$^2$ |
| | Main memory | 1,000 mm$^2$ | 125 mm$^2$ |
| | Total | 1,692 mm$^2$ | 253 mm$^2$ |

It will be understood from the above that the present invention enables the capacity or size of the cache memory 506 to be reduced from 1 megabyte for a conventional multi-chip DSM implementation to 32 kilobytes for the present node 500. This reduces the chip area of the cache memory 506 from 512 mm$^2$ for the multi-chip configuration to 16 mm$^2$ for the present node 500. Although the cache miss rate is increased from 1.5% to 4.3%, the cache miss cost is reduced from 400 ns to 60 ns, thereby more than compensating for the increased cache miss rate.

The capacity of the main memory 508 can be reduced from 32 megabytes to 4 megabytes, thereby reducing the size of the main memory 508 from 1,000 mm$^2$ to 125 mm$^2$. Even assuming that the same DSM logic is used, the total logic requirement is reduced from 450K gates to 280K gates, reducing the logic area of the chip from 180 mm$^2$ to 112 mm$^2$.

As a result of the invention, the total chip area is reduced from 1,692 mm$^2$ for a conventional DSM multi-chip architecture to 253 mm$^2$ for the present node 500, enabling the node 500 to be integrated onto the 256 mm$^2$ area of a standard 16 mm×16 mm chip.

In addition to the substantial size and cost reduction and advantageous single-chip implementation of the present node 500, the processing speed thereof is increased by 69% from 85 MIPS to 144 MIPS over the prior art arrangement.

Referring again to FIG. 68, the computing unit 502 further comprises a floating point unit 524 that functions integrally with the processor 504 for performing non-integer arithmetic operations.

The processor 504 operates using virtual addresses. A memory management unit (MMU) 526 maps these virtual addresses to the local physical addresses of the node 500. A cache controller 528 maintains cache coherence between the cache memory 506 and any other cache memories that are connected to the processor 504 via a virtual address bus 530 using a conventional snooping or other scheme.

A processor bus interface 532 connects the computing unit 502 to the memory controller 510 and I/O interface 514 via a processor bus 534. The interface 532 passes data between the virtual address bus 530, cache controller 528, MMU 526 and processor bus 534 using local physical addresses. The invention can also be implemented with a processor bus using virtual addresses or combined virtual and physical addresses.

Figure 69:
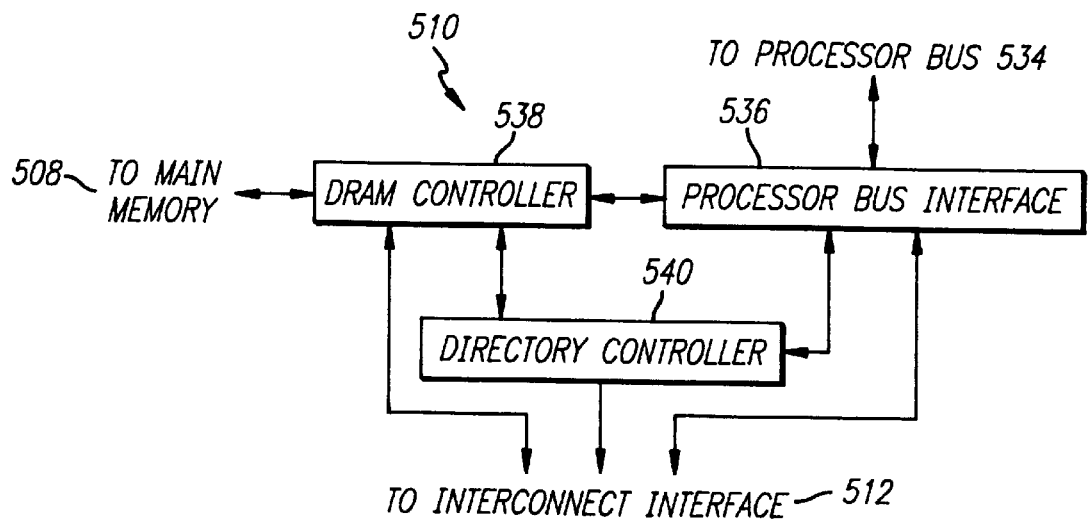
FIG. 69 is a block diagram illustrating a memory controller of the DSM node.

As illustrated in FIG. 69, the memory controller 510 comprises a processor bus interface 536 for connection to the processor bus 534 and a DRAM controller 538 for controlling access to the main memory 508. The controller 510 further includes a directory controller 540 that stores and modifies a directory in the main memory 508. It will be noted, however, that the invention is not so limited, and that the directory can be stored in a dedicated memory (not shown) in the controller 540.

The directory is typically two dimensional, including a first dimension that represents the memory elements (cache and main memory) of all memories in the node 500 and remote nodes connected thereto, and a second dimension that represents data created by the system as divided into blocks of fixed size.

An entry is made in the directory for each memory element that stores a particular block of data, and the status of the data (uncached, shared, dirty, etc.). If data in the node 500 is modified, the directory controller 540 sends messages to all other memory elements in the system that contain copies of the modified data, causing the obsolete copies to be updated or invalidated.

Figure 70:
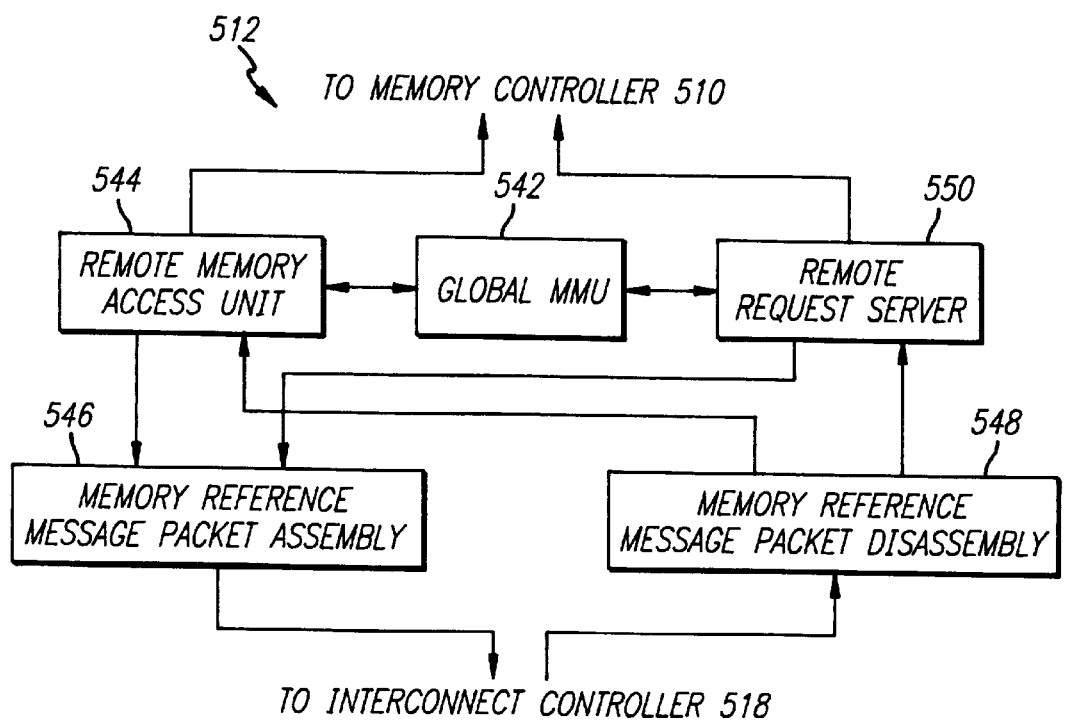
FIG. 70 is a block diagram illustrating an interconnect interface of the DSM node.

As illustrated in FIG. 70, the interconnect interface 512 includes a global memory management unit (GMMU) 542 for converting the local physical addresses that are used internally by the node 500 into global physical addresses that are used by the interconnect controller 518 for transmitting data over the communications channel 520. The GMMU 542 also provides access control to regions of memory, and sets attributes for each region in accordance with a memory model.

A remote memory access unit 544 converts memory access instructions for accessing remote memory into memory access references or messages, and a memory reference message packet assembly 546 assembles the messages into packets for transmission over the channel 520 as described above.

A memory reference message packet disassembly 548 similarly disassembles memory access references or messages that are received over the channel 520, whereas a remote request server 550 converts the memory access messages into memory access instructions.

The interconnect controller 518 is preferably implemented by a communications protocol interface unit and router such as described in a technical disclosure entitled "The S3.mp Interconnect System and TIC chip", by A. Nowatzyk, Proceedings of IEEE Computer Society HOT Interconnect Symposium, Stanford University, 1993.

b. Single Chip Communications Node

Figure 71:
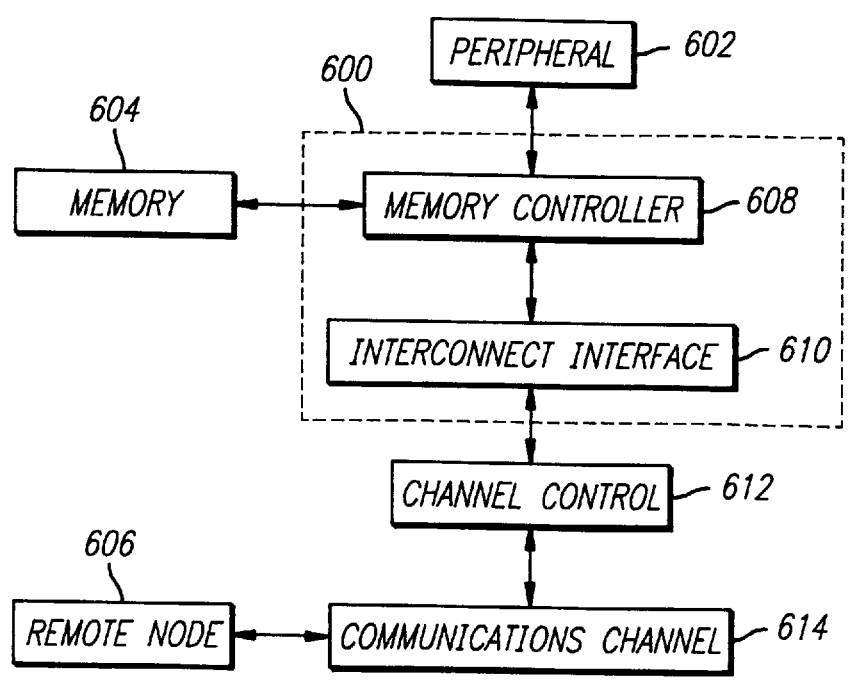
FIG. 71 is a block diagram illustrating a single chip integrated circuit communications node of the present invention.

FIG. 71 illustrates a single integrated circuit communications node 600 for connecting an I/O device or peripheral 602 and associated local memory 604 to one or more remote nodes 606. The peripheral 602 can be a CRT monitor, video camera or any other suitable device. An especially desirable application for the node 600 is for simultaneous video teleconferencing in which two or more video camera/monitor units are interconnected by a network.

Although prior art networks such as Ethernet, Token Ring, DECNet and RS-232 are capable of providing this function, they are relatively slow and not scalable. In addition, they require an expensive network interface adaptor for each device that is connected to the network.

The present node 600 is scalable, can be fabricated very inexpensively on a single integrated circuit chip, and is faster in operation than conventional networks. This is because all transmissions consist of memory access references or messages in packet or cell form, and all memories connected to the system are maintained coherent.

The node 600 consists of a memory controller 608 and an interconnect interface 610 that are constructed and operate in the manner described above with reference to the elements 510 and 512 of the DSM node 500 respectively. The node 600 is therefore a subcombination of the node 500. The node 600 does not necessarily include a processor, although a processor can be added, because the node 600 is typically controlled remotely by a processor in a full DSM note 500. Alternatively, by a process (not shown) in the peripheral 602. The local memory 604 can be provided on a separate chip, or more preferably, integrated onto the same chip as the node 600.

The interconnect interface 610 is shown as being connected through a unidirectional or bidirectional channel control 612 and a communications channel 614 to the remote node 606. The control 612 differs from the interconnect controller 518 of the DSM node 500 in that it provides protocol interface only, without routing. This enables point to point communications between two nodes. However, the interconnect controller 518 can be substituted for the channel control 612 if connection and routing to a plurality of nodes is desired.

In summary, the present invention provides a process optimization method that is capable of solving extremely large problems including massive numbers of interrelated variables, and a parallel processing architectural structure for implementing the method. Various modifications will become possible for those skilled in the art after receiving the teachings of the present disclosure without departing from the scope thereof.

We claim:

1. A method of optimizing a cell placement for an integrated circuit chip, comprising the steps of:
   (a) routing said placement, wherein said placement includes congested areas and non-congested areas;
   (b) Identifying said congested areas generated by said routing;
   (c) selectively applying a congestion reduction algorithm only within said congested areas to alter said placement in said congested areas, wherein said congestion reduction algorithm comprises:
      (c1) assessing individual cell cost values within said areas of increased congestion; and
      (c2) relocating at least one cell having a highest cost value;
   (d) computing a fitness of said placement; and
   (e) if said fitness is below a predetermined value, repeating steps (b) to (d).

2. A method as in claim 1, in which step (e) further comprises repeating step (a).

3. A method as in claim 1, in which:
   said placement comprises a plurality of nets of cells; and
   step (a) comprises routing said nets in parallel.

4. A method as in claim 1, in which step (a) comprises the substeps of:
   (f) dividing said placement into a plurality of predetermined areas; and
   (g) routing said predetermined areas in parallel.

5. A method as in claim 1, in which step (c) comprises applying said congestion reduction algorithm to said areas of increased congestion in parallel.

6. A method as in claim 1, in which step (c) comprises moving selected cells out of said areas of increased congestion.

7. A method as in claim 1, in which step (c) comprises relocating selected cells such that routing thereof does not pass through said areas of increased congestion.

8. A method as in claim 7, in which step (c) comprises the substeps of:
   (f) relocating said selected cells in a predetermined manner;
   (g) rerouting nets of cells that include said selected cells; and
   (h) repeating steps (f) and (g) if said rerouting passes through said areas of increased congestion.

9. A method as in claim 8, comprising performing steps (f), (g) and (h) on said selected cells and said nets respectively in parallel.

10. A method as in claim 8, in which step (g) comprises applying a Steiner tree algorithm for rerouting said nets.

11. A method as in claim 7, in which step (c) comprises selecting said cells for relocation as having high values of interconnect congestion.

12. A method as in claim 7, in which step (c) comprises selecting said cells for relocation if routing thereof passes through said areas of increased congestion.

13. A method as in claim 7, in which step (c) comprises selecting said cells for relocation if said cells are outside perimeters that surround other cells in nets to which said selected cells are connected respectively.

14. A method as in claim 13, in which step (c) comprises relocating said selected cells inside said perimeters respectively.

15. A method as in claim 14, in which step (c) comprises relocating said selected cells to centroids of said perimeters respectively.

16. A method as in claim 1, in which:
   step (c) comprises relocating selected cells without rerouting said placement; and
   the method further comprises the steps of:
      (f) calculating an amount of error in said routing created by step (c); and
      (g) repeating step (a) if said amount of error exceeds a predetermined value.

17. A method as in claim 16, in which steps (f) and (g) are performed after step (c).

18. A method as in claim 1, in which step (c) comprises the substeps of:
   (f) dividing said placement into a plurality of predetermined areas; and
   (g) applying said congestion reduction algorithm to said predetermined areas in parallel.

19. A method as in claim 18, in which step (g) comprises the substeps of:
   (h) relocating selected cells without rerouting said placement;

(i) calculating amounts of error in said routing created by step (h) in each of said predetermined areas respectively; and (j) repeating step (a) if said amount of error in any of said predetermined areas exceeds a predetermined value.

20. A method as in claim 1, further comprising the step, performed prior to step (a), of:

(f) decomposing said placement into a hierarchial order of groups of cells; and step (a) comprises routing said groups of cells in parallel.

21. A physical design automation system for optimizing a cell placement for an integrated circuit chip, comprising:

a router for routing said placement, wherein said placement includes congested and non-congested areas;

a computer for performing operations of:
identifying said congested areas generated by said router;
selectively applying a congestion reduction algorithm only within said congested areas to alter said placement in said congested areas, wherein said congestion reduction algorithm comprises:
assessing individual cell cost values within said areas of increased congestion; and
relocating at least one cell having a highest cost value; and
computing a fitness of said placement; and a controller for controlling the computer to repeat performing said operations until said fitness attains a predetermined value.

22. A system as in claim 21, in which the controller further controls the router to reroute said placement if said fitness is below said predetermined value.

23. A system as in claim 21, in which the router comprises a global router for globally routing said placement.

24. A system as in claim 21, in which:

said placement comprises a plurality of nets of cells; and the router comprises a plurality of parallel processors for routing said nets in parallel.

25. A system as in claim 21, in which the router divides said placement into a plurality of predetermined areas, and comprises a plurality of parallel processors for routing said predetermined areas in parallel.

26. A system as in claim 21, in which the computer comprises a plurality of parallel processors for applying said congestion reduction algorithm to alter said placement in said areas of increased congestion in parallel.

27. A system as in claim 21, in which:

said congestion reduction algorithm comprises relocating selected cells such that routing thereof does not pass through said areas of increased congestion; and the computer comprises a plurality of parallel processors for relocating said selected cells in parallel.

28. A method for optimizing cell placement over a global area on an integrated circuit chip, comprising the steps of:

fixing an initial cell placement within said global area;

routing wiring between cells placed by said fixing step;

determining wiring congestion for isolated areas within said global area;

identifying congested isolated areas having greater wiring congestion than other non-congested isolated areas;

selectively applying a congestion reduction algorithm only within said congested isolated areas, wherein said congestion reduction algorithm comprises:
accessing individual cell cost values within said areas of increased congestion; and
relocating at least one cell having a highest cost value;

computing a fitness of said cell placement; and repeating said determining, identifying, selectively applying, and computing steps until said fitness improves to within a predetermined range.

29. A method as in claim 28, in which said repeating step further comprises said routing step.

30. A method as in claim 28, in which said routing step comprises the substeps of dividing said placement into a plurality of predetermined areas and routing said predetermined areas in parallel.

31. A method as in claim 28, in which said selectively applying step comprises relocating selected cells such that routing thereof does not pass through said congested isolated areas.

32. A method as in claim 31, in which said selectively applying step comprises the substeps of:

relocating said selected cells in a predetermined manner;

rerouting nets of cells that include said selected cells; and repeating said relocating and rerouting steps if said rerouting passes through said congested isolated areas.

* * * * *